United States Patent
Little et al.

(10) Patent No.: US 9,490,549 B2
(45) Date of Patent: Nov. 8, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Yuan Zhang, Rowland-Heights, CA (US); Chun-Chieh Yang, New Taipei (TW); Tzu-Yao Hwang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/161,306

(22) Filed: May 23, 2016

(65) Prior Publication Data
US 2016/0268700 A1  Sep. 15, 2016

Related U.S. Application Data

(63) Continuation of application No. 14/698,876, filed on Apr. 29, 2015, now Pat. No. 9,356,400, which is a continuation-in-part of application No. 14/667,632, filed on Mar. 24, 2015, and a continuation-in-part of (Continued)

(51) Int. Cl.
*H01R 24/00* (2011.01)
*H01R 4/02* (2006.01)
(Continued)

(52) U.S. Cl.
CPC .............. *H01R 4/023* (2013.01); *H01R 24/30* (2013.01); *H01R 24/60* (2013.01)

(58) Field of Classification Search
CPC .................. H01R 23/7073; H01R 23/7005
USPC ................. 439/660, 626, 374, 377, 79, 733
See application file for complete search history.

(56) References Cited

U.S. PATENT DOCUMENTS

| 5,073,130 A | 12/1991 | Nakamura |
| 6,755,689 B2 | 6/2004 | Zhang et al. |

(Continued)

FOREIGN PATENT DOCUMENTS

| CM | CN201868687 U | 6/2011 |
| CN | 201029143 Y | 8/2008 |

(Continued)

OTHER PUBLICATIONS

Universal Serial Bus Type-C Cable and Connector Specification, Revision 1.0, Aug. 11, 2014, pp. 107, 110-113.

(Continued)

*Primary Examiner* — Phuongchi T Nguyen
(74) *Attorney, Agent, or Firm* — Wei Te Chung; Ming Chieh Chang

(57) ABSTRACT

A plug for provision of power includes a housing forming a receiving cavity with two opposite sites in a vertical direction which is compatible with a standard plug connector with twelve contacts on each site and a first and second rows of contacts on the sides while in diagonally symmetrical manner. Each contact includes a contacting section, and a connecting section for directly connecting to a corresponding wire. Each row of contacts is categorized with a pair of power contacts, a pair of grounding contacts and a specific contact without any high speed differential pair. Two pair of power contacts of both two rows are electrically connected together either via direct mechanical connection via vertical extensions or via indirect electrical connection via the latch which has a pair of side arms extending into the receiving cavity at two opposite transverse ends.

10 Claims, 63 Drawing Sheets

Related U.S. Application Data application No. 14/558,732, filed on Dec. 3, 2014, and a continuation-in-part of application No. 14/542,550, filed on Nov. 15, 2014, now Pat. No. 9,350,126, and a continuation-in-part of application No. 14/497,205, filed on Sep. 25, 2014, and a continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853, and a continuation-in-part of application No. 14/517,941, filed on Oct. 20, 2014.

(60) Provisional application No. 62/021,066, filed on Jul. 4, 2014, provisional application No. 62/002,934, filed on May 26, 2014, provisional application No. 62/026,046, filed on Jul. 18, 2014, provisional application No. 62/035,472, filed on Aug. 10, 2014, provisional application No. 61/977,115, filed on Apr. 9, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 24/60* (2011.01)
*H01R 24/30* (2011.01)

(56) References Cited

U.S. PATENT DOCUMENTS

| | | | |
|---|---|---|---|
| 7,758,379 B2 | 7/2010 | Chen | |
| 8,087,944 B2 | 1/2012 | Kumamoto et al. | |
| 8,517,773 B2* | 8/2013 | Lee | H01R 12/722 439/660 |
| 8,968,031 B2* | 3/2015 | Simmel | H01R 13/659 439/108 |
| 9,318,853 B2* | 4/2016 | Little | H01R 13/6658 |
| 2009/0156027 A1 | 6/2009 | Chen | |
| 2010/0267261 A1 | 10/2010 | Lin | |
| 2013/0095702 A1* | 4/2013 | Golko | H01R 13/6273 439/676 |
| 2014/0024257 A1 | 1/2014 | Castillo et al. | |
| 2015/0056839 A1 | 2/2015 | Zhang | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

USB Type-C Specification 0.9c05—May 18, 2014.
Universal Serial Bus Type-C Cable and Connector Specification Revision 0.7 Working Draft Jan. xx, 2014.
Universal Serial Bus Type-C Cable and Connector Specification Revision 1.0 Aug. 11, 2014.

* cited by examiner

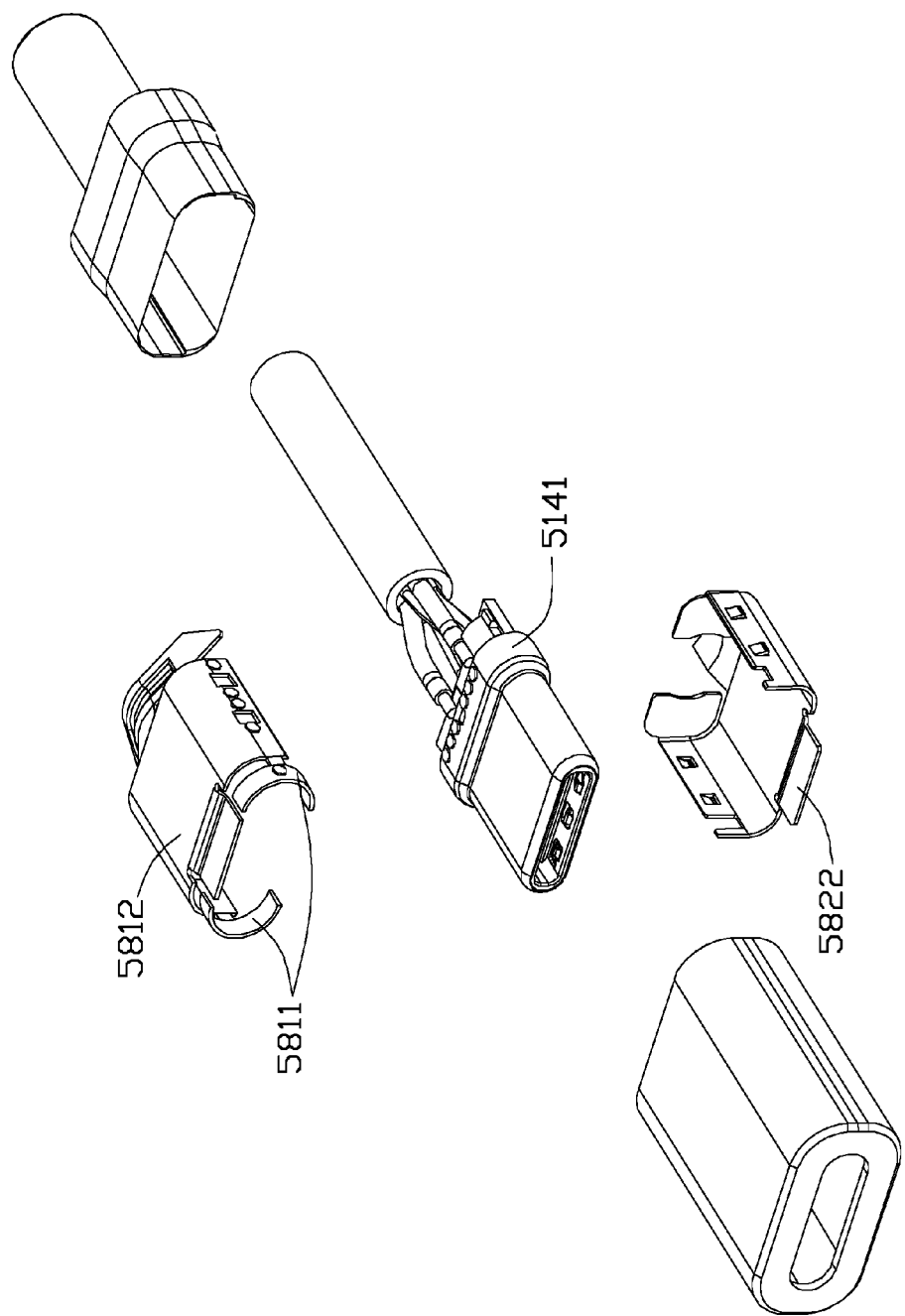

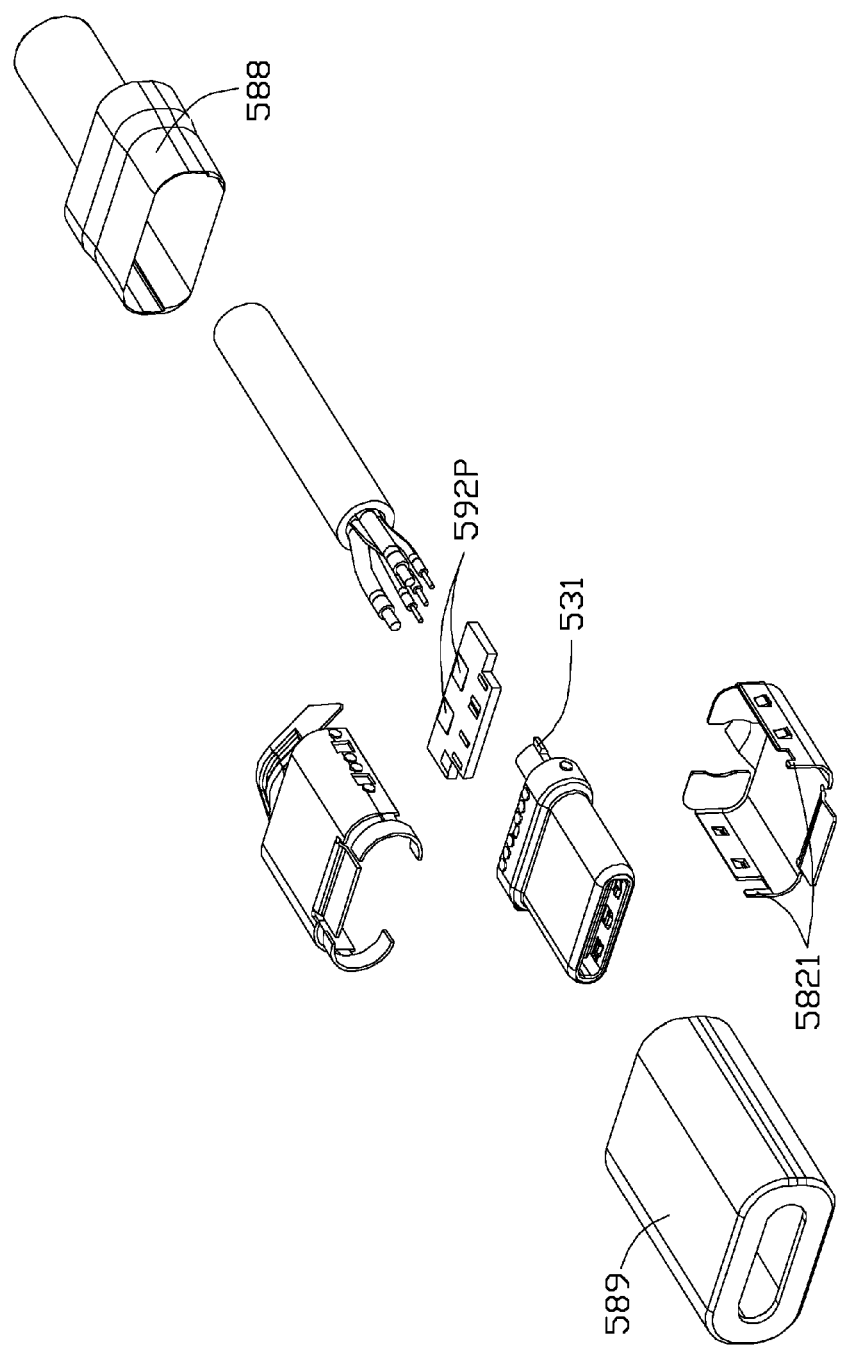

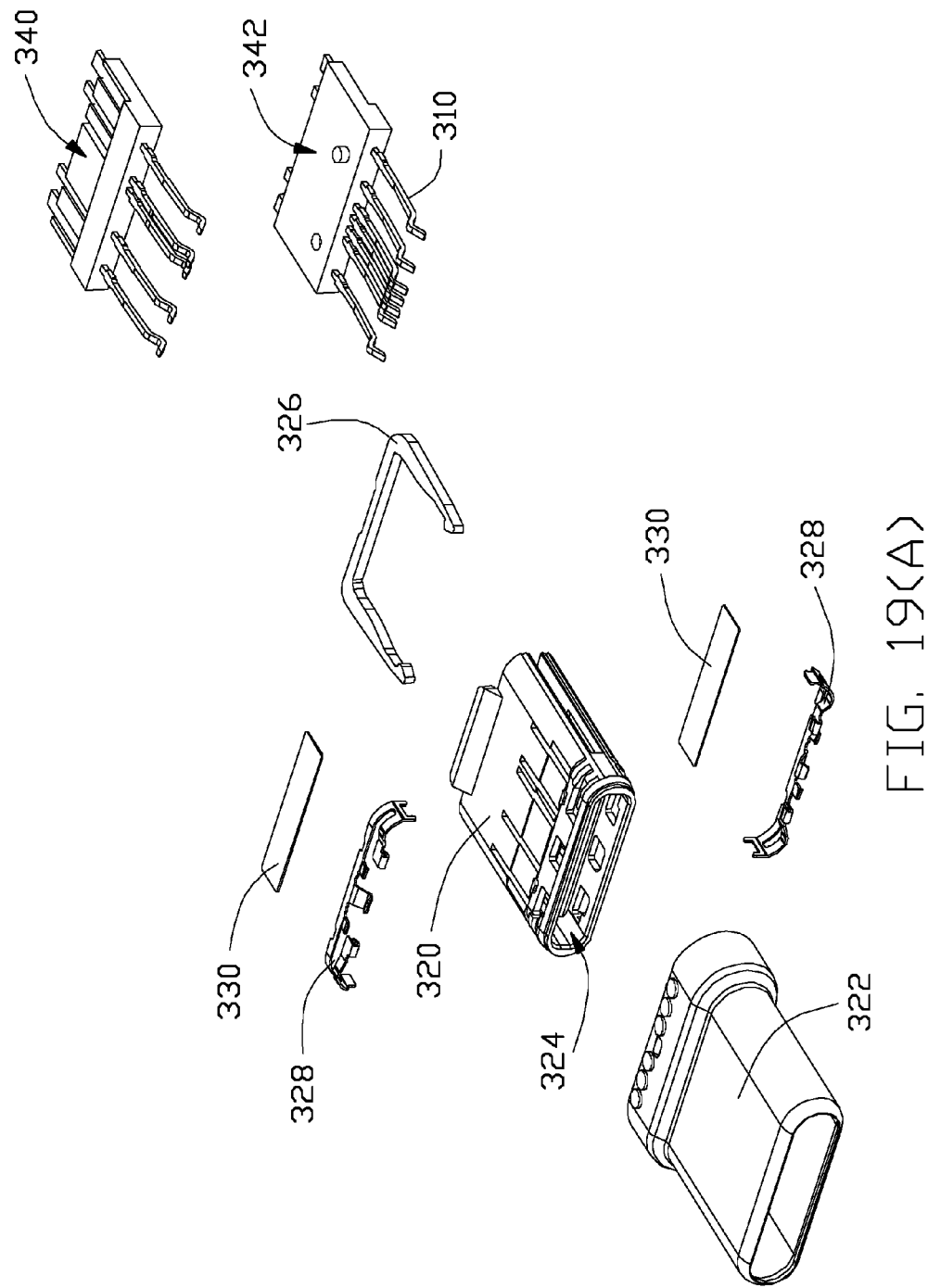

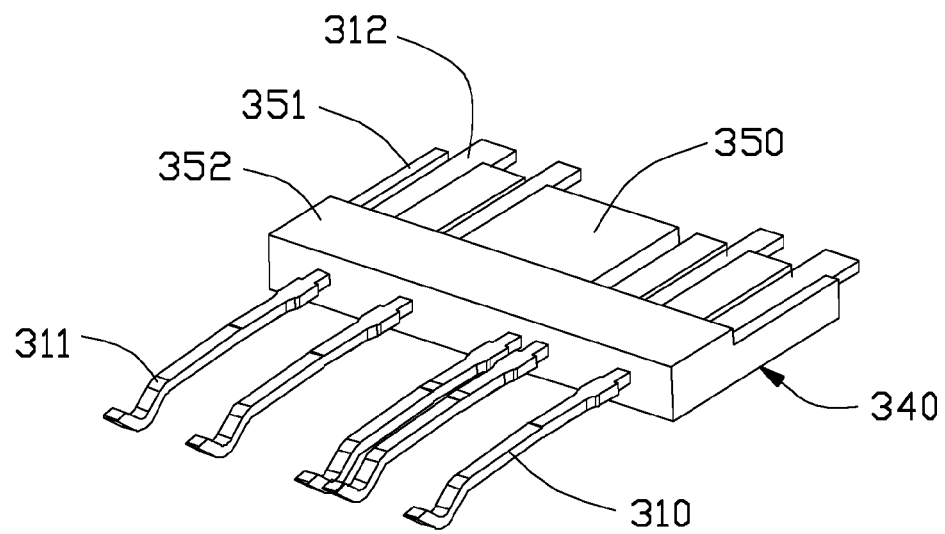
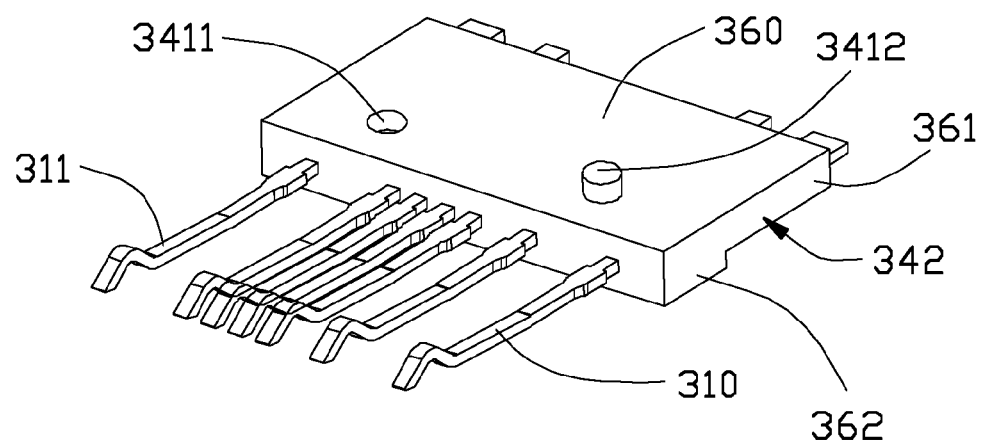
FIG. 20(A)

FLIPPABLE ELECTRICAL CONNECTOR

CROSS REFERENCE TO CROSS REFERENCE TO RELATED APPLICATIONS

This application is a continuation of application Ser. No. 14/698,876 filed on Apr. 29, 2015, which is a continuation-in-part of the co-pending application Ser. No. 14/667,632 filed Mar. 24, 2015 and Ser. No. 14/558,732 filed Dec. 3, 2014 and further claims the benefit of, and priority to, U.S. Provisional Patent Application No. 62/002,934, filed May 26, 2014, No. 62/021,066, filed Jul. 4, 2014, No. 62/026,046 filed Jul. 18, 2014, and No. 62/035,472 filed Aug. 10, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degradation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a plug connector for provision of power, comprises an insulative housing forming a receiving cavity with two opposite sites in a vertical direction which is compatible with a standard plug connector with twelve contacts on each site and a first and second rows of contacts disposed on the opposite sides while in diagonally symmetrical manner. Each of the contacts includes a front contacting section, and a rear connecting section for directly connecting to a corresponding wire or via a circuit pad of a paddle card to the corresponding wire. Each row of contacts is categorized with a pair of power contacts and a pair of grounding contacts and a CC (Configuration Channel) contacts without any high speed differential pair.

Other objects, advantages and novel features of the invention will become more apparent from the following detailed description when taken in conjunction with the accompanying drawings.

BRIEF DESCRIPTION OF THE DRAWINGS

FIG. 16(A) is a further front exploded perspective view of the plug connector of FIG. 15.

FIG. 17(A) is a further front exploded perspective view of the plug connector of FIG. 16(A).

FIG. 19(A) is a front assembled perspective view of a terminal module assembly of the receptacle connector of a fourth embodiment.

FIG. 20(A) is a front exploded perspective view of the terminal module of the receptacle connector of FIG. 19(A).

FIG. 26 is a perspective view of the laptop computer with a detachable display using the plug connector of FIG. 23(A) on the base and a corresponding receptacle connector on the.

DETAILED DESCRIPTION OF THE PREFERRED EMBODIMENT

Reference will now be made in detail to the preferred embodiment of the present invention.

Figure 1:
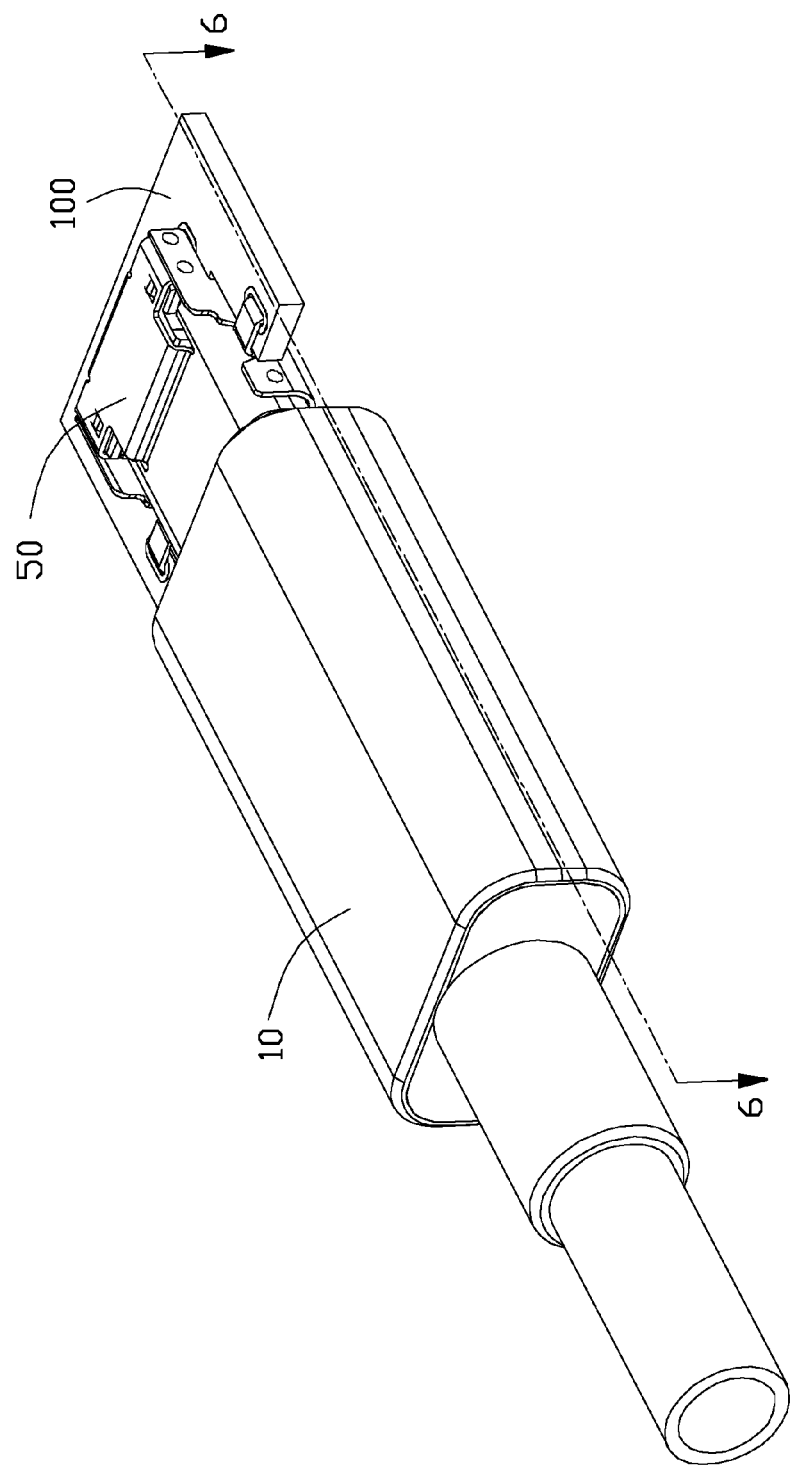
FIG. 1 is an assembled perspective view of a plug connector and a mated receptacle connector on the printed circuit board, of a first embodiment of the instant invention.
Figure 2:
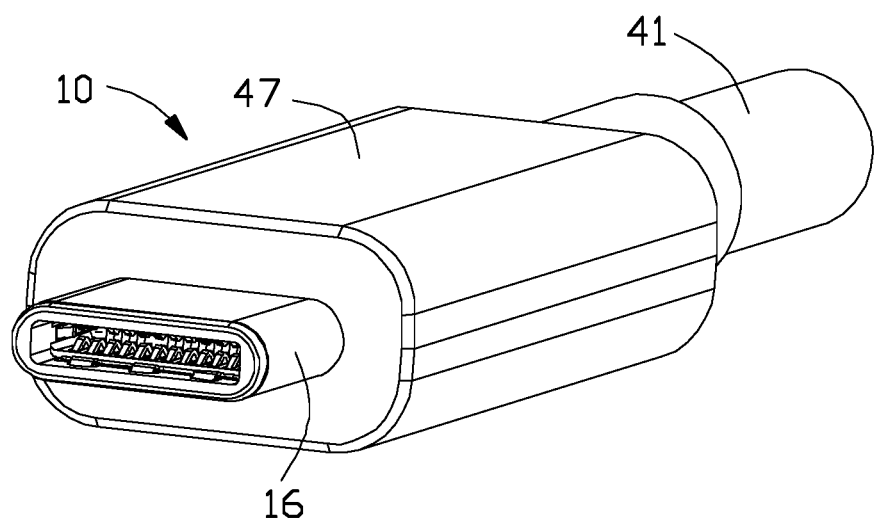
FIG. 2 is a front assembled perspective view of the plug connector of FIG. 1.
Figure 3A:
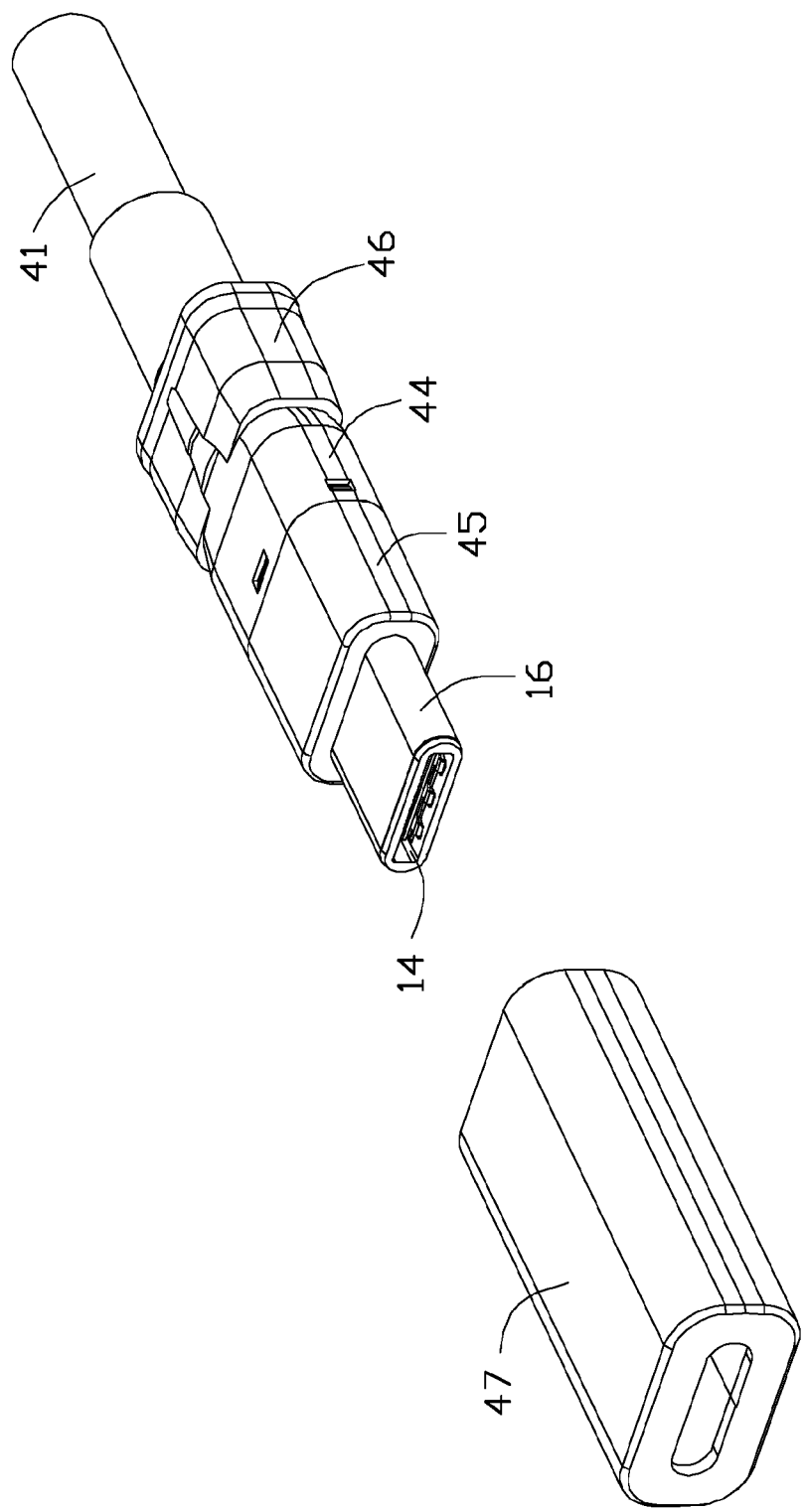
FIG. 3(A) is a front partially exploded perspective view of the plug connector of FIG. 2 wherein the cover is removed away from the remainder.
Figure 3B:
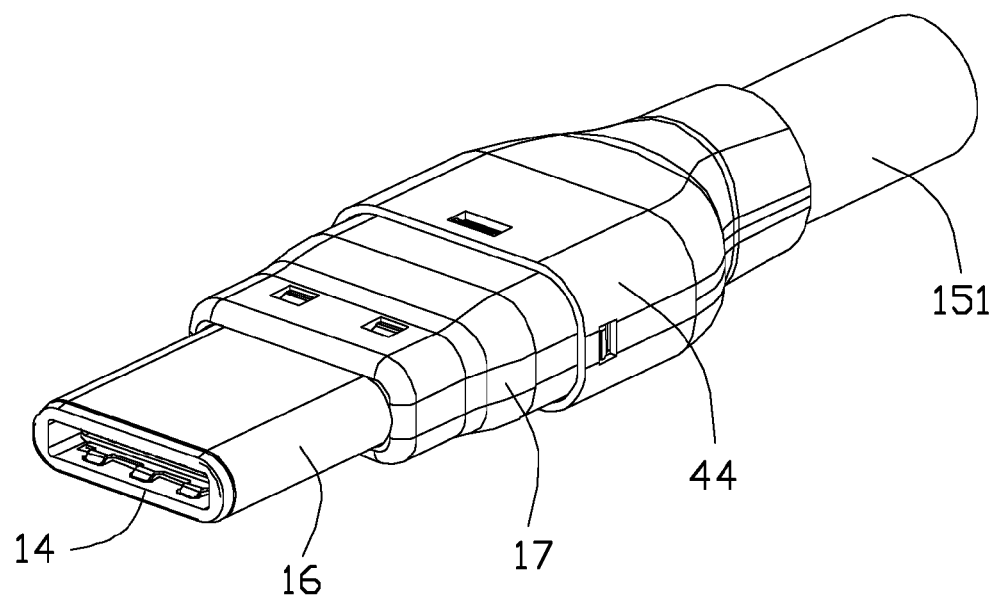
FIG. 3(B) is a front partially exploded perspective view of the plug connector of FIG. 3(A) wherein the front and rear over-moldings have been further removed.
Figure 4:
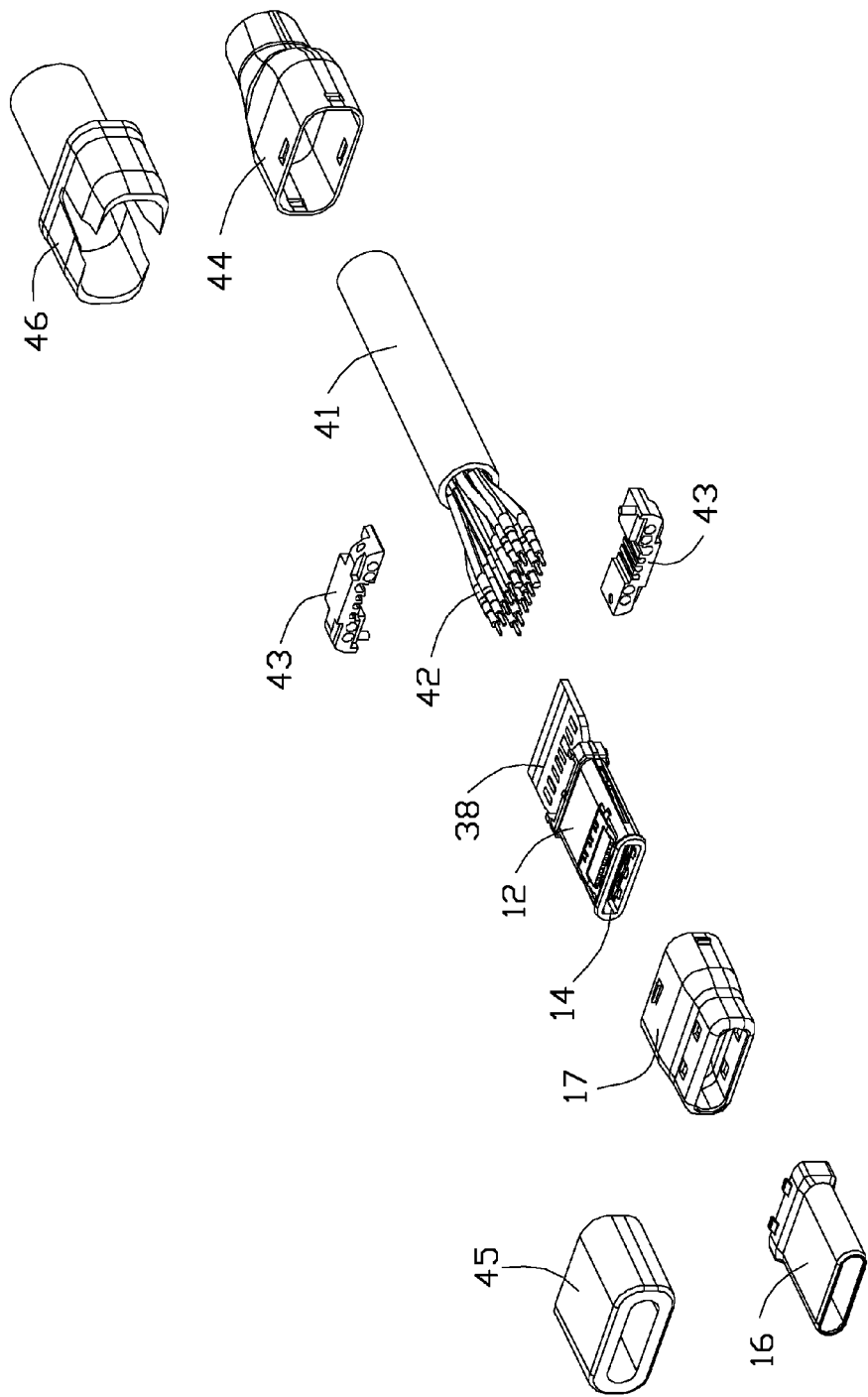
FIG. 4 is a front partially exploded perspective view of the plug connector of FIG. 2 without the cover thereof.
Figure 5:
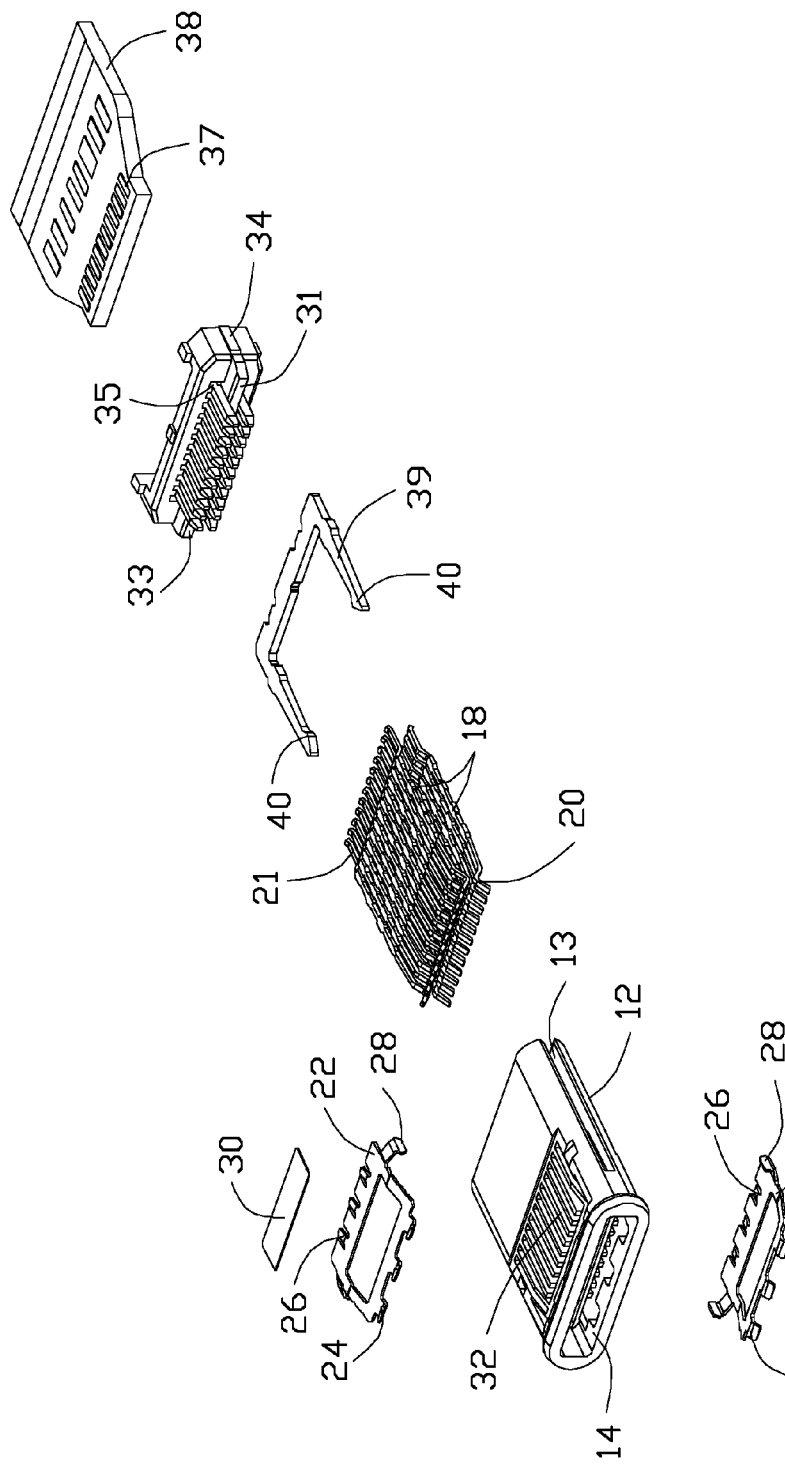
FIG. 5 is a front partially exploded perspective view of the plug connector of FIG. 4 by removal of additional parts therefrom.
Figure 6:
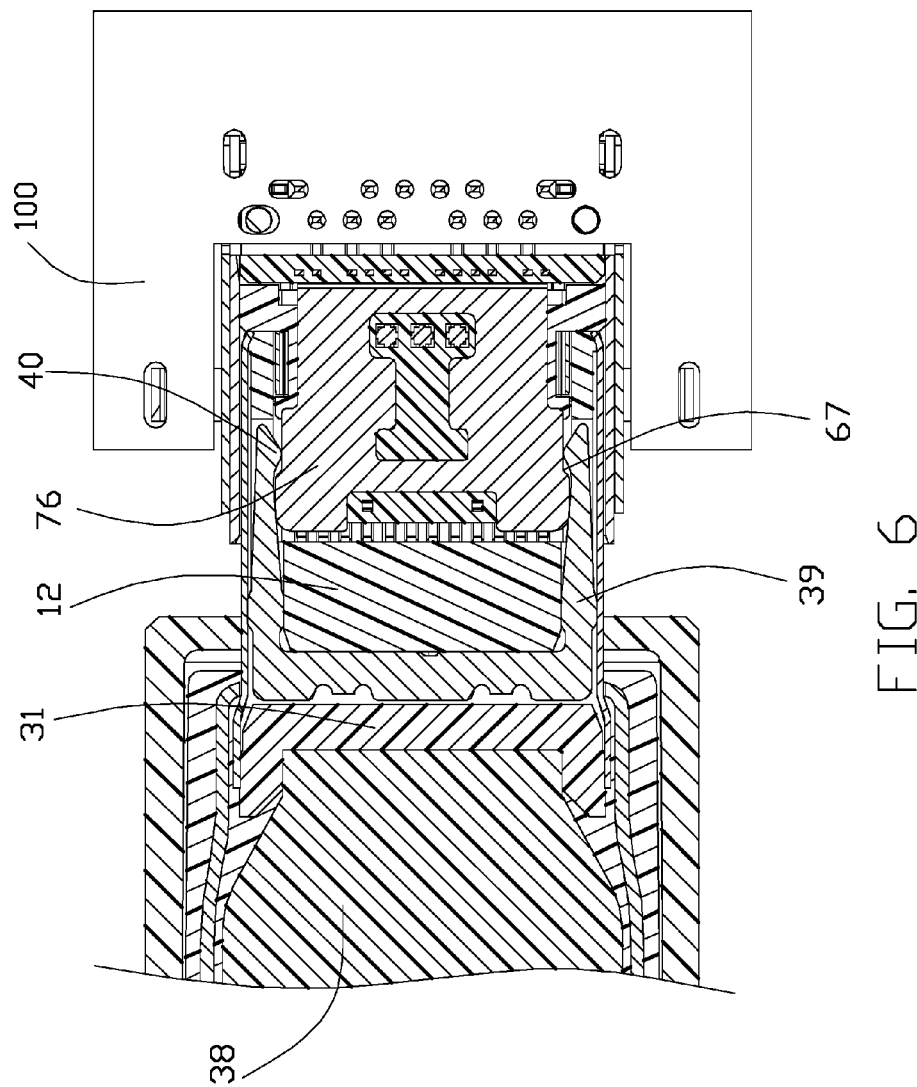
FIG. 6 is a cross-sectional view of the mated plug connector and receptacle connector taken along lines 6-6 in FIG. 1.
Figure 7A:
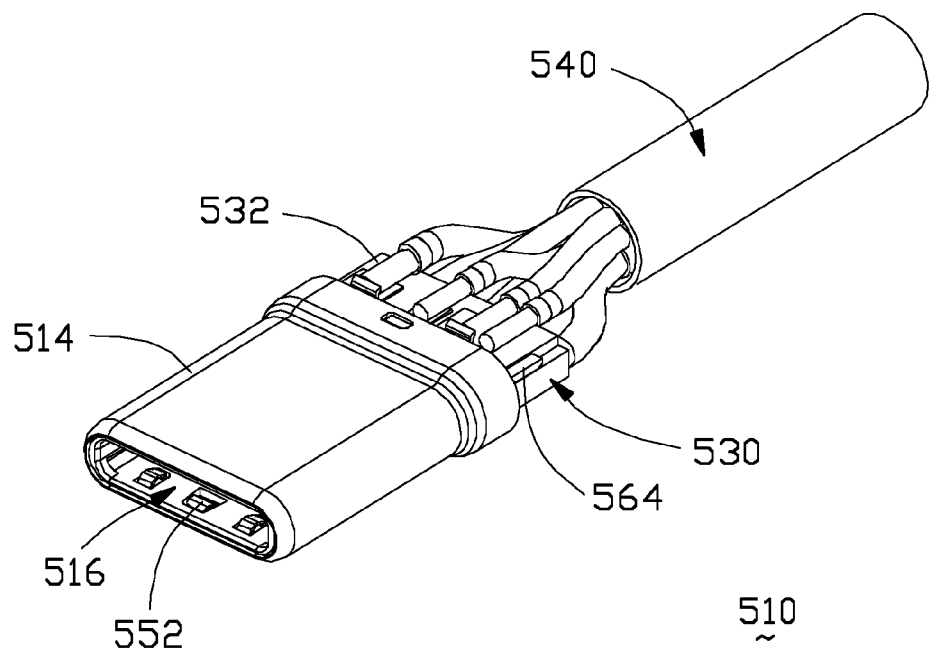
FIG. 7(A) is a front assembled perspective view of a partially assembled plug connector according to a second embodiment of the invention.
Figure 7B:
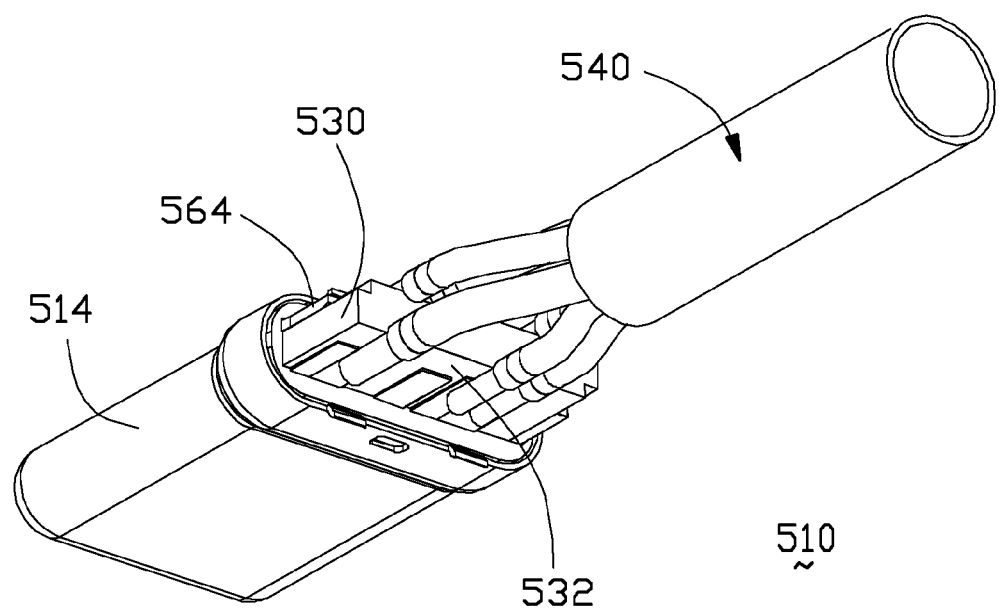
FIG. 7(B) is a rear assembled perspective view of the plug connector of FIG. 7(A).
Figure 8A:
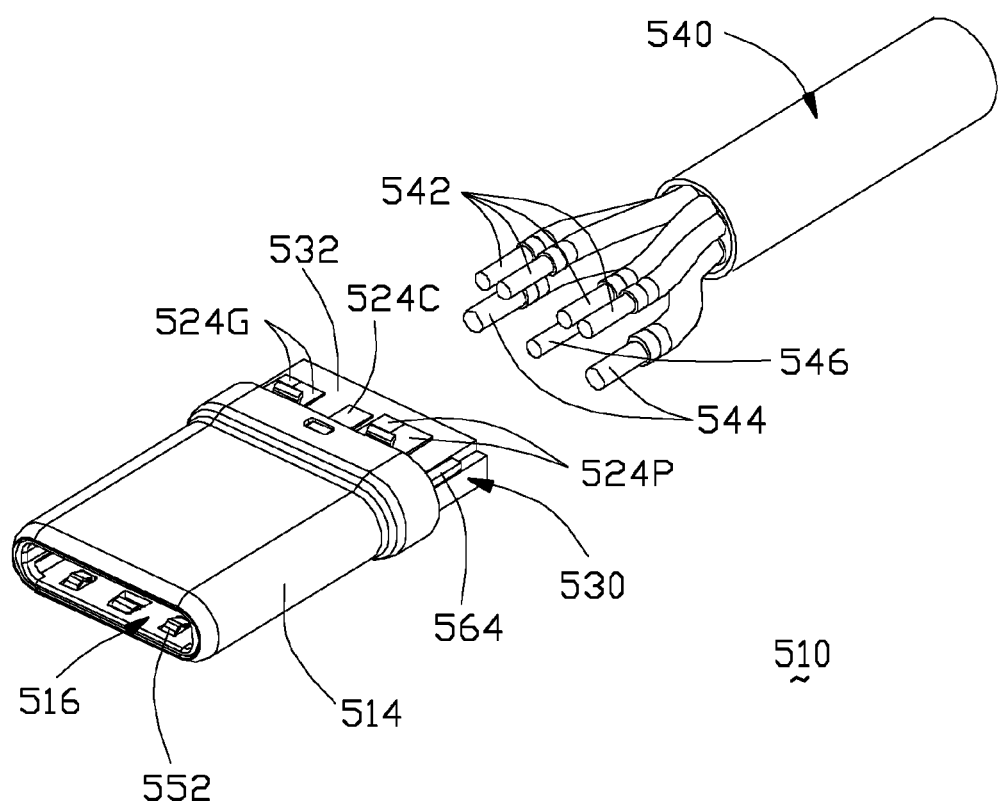
FIG. 8(A) is a front partially exploded perspective view of the plug connector of FIG. 7(A).
Figure 8B:
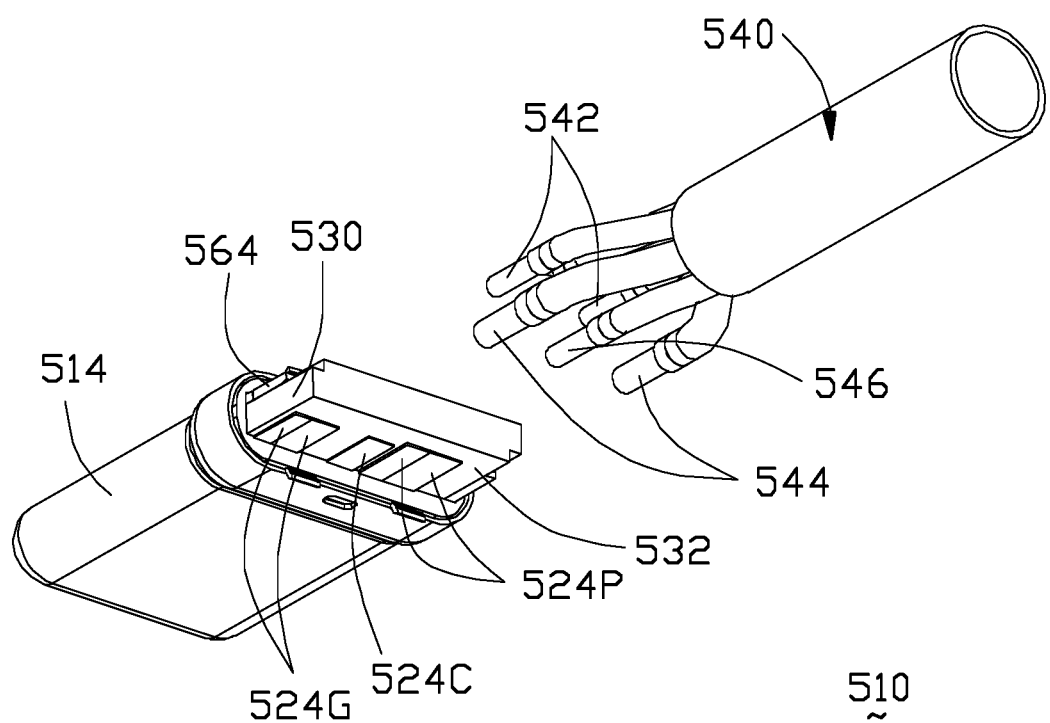
FIG. 8(B) is a rear partially exploded perspective view of the plug connector of FIG. 7(B).
Figure 9A:
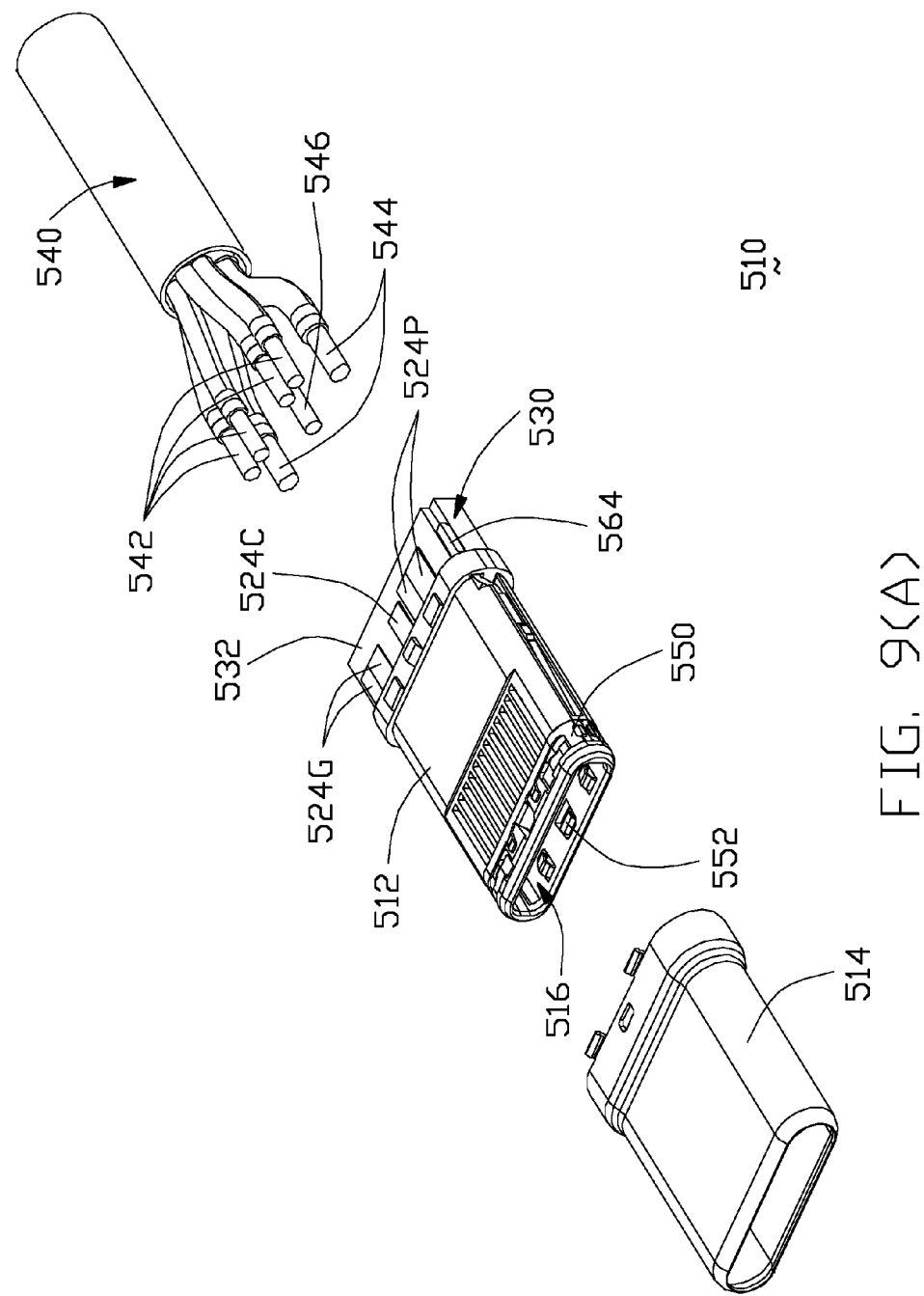
FIG. 9(A) is a front partially exploded perspective view of the plug connector of FIG. 8(A).
Figure 9B:
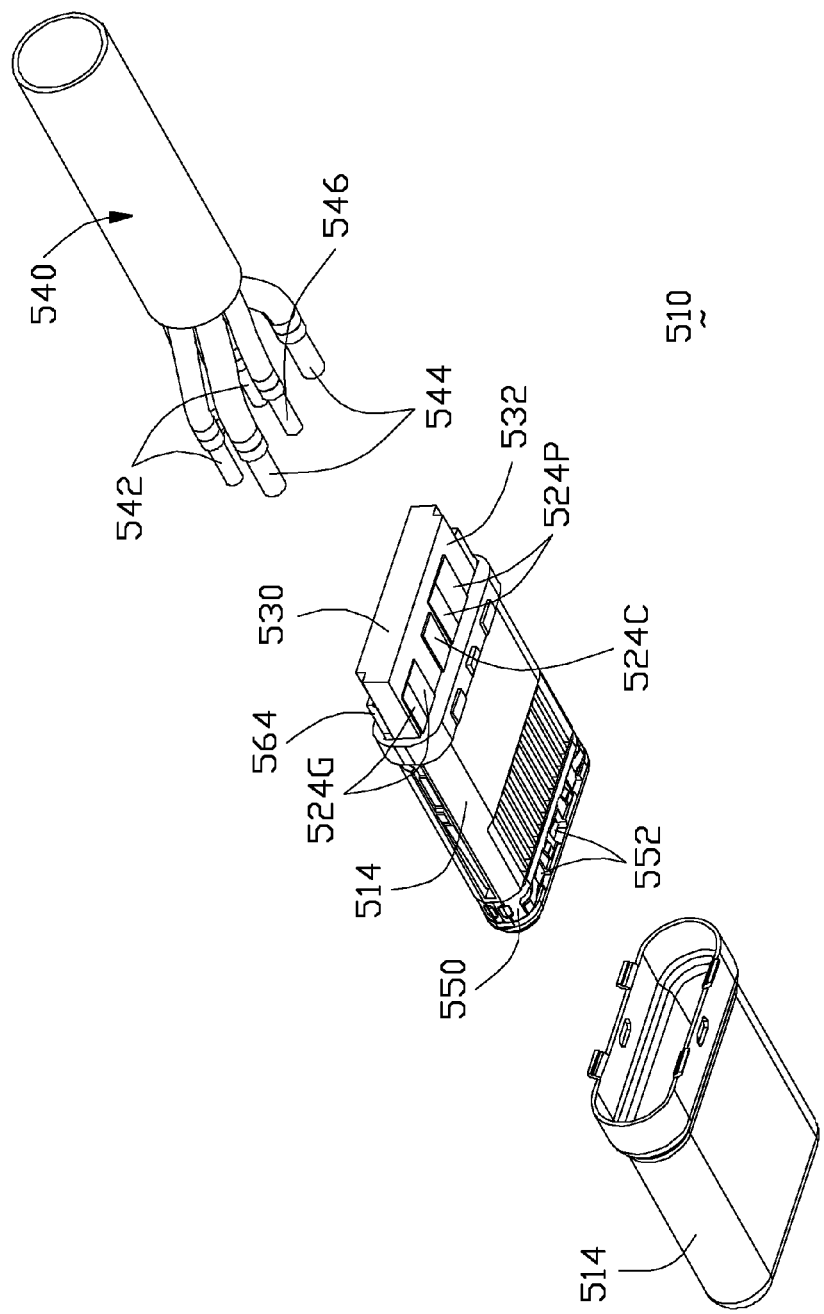
FIG. 9(B) is a rear partially exploded perspective view of the plug connector of FIG. 8(B).
Figure 10A:
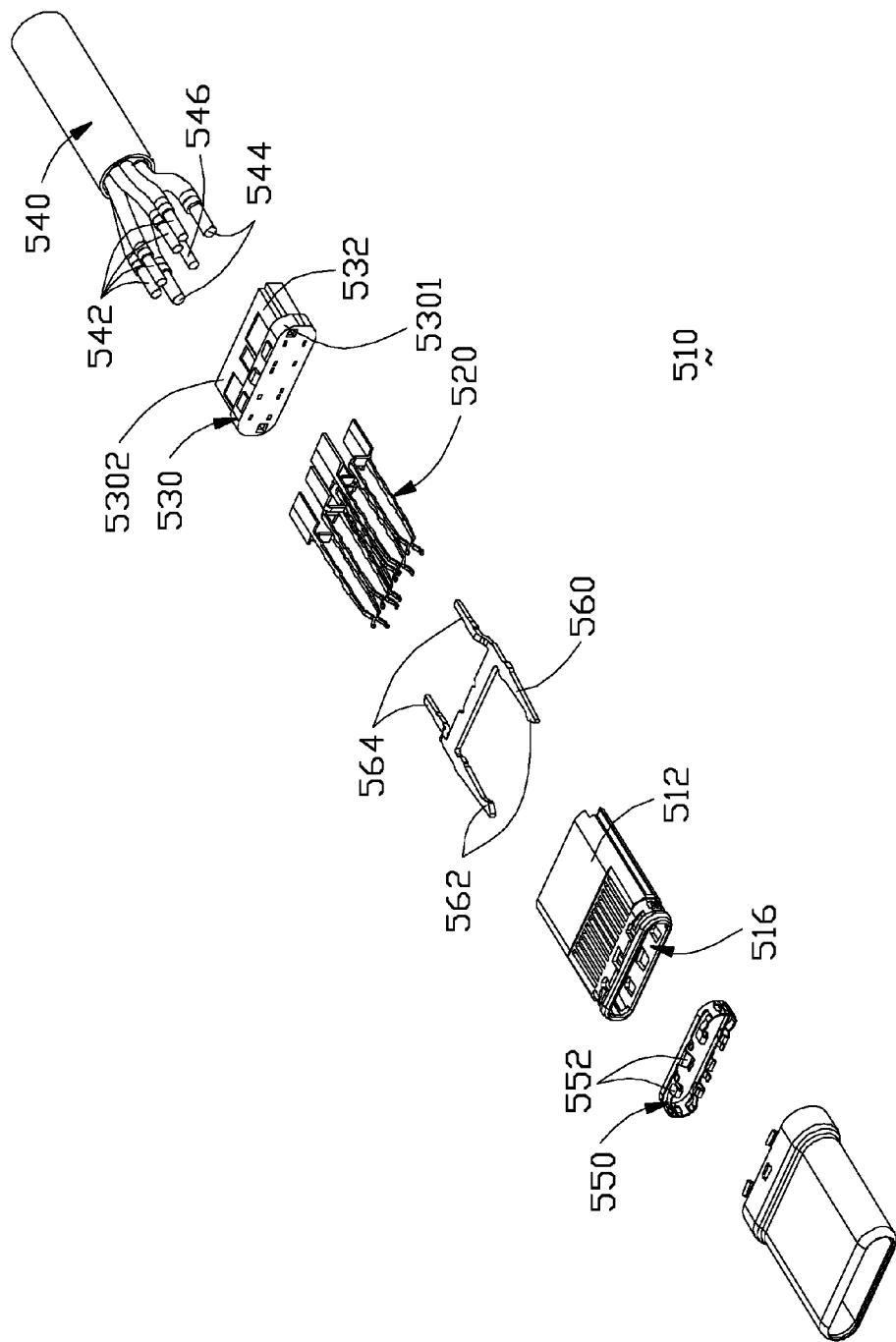
FIG. 10(A) is a front partially exploded perspective view of the plug connector of FIG. 9(A).
Figure 10B:
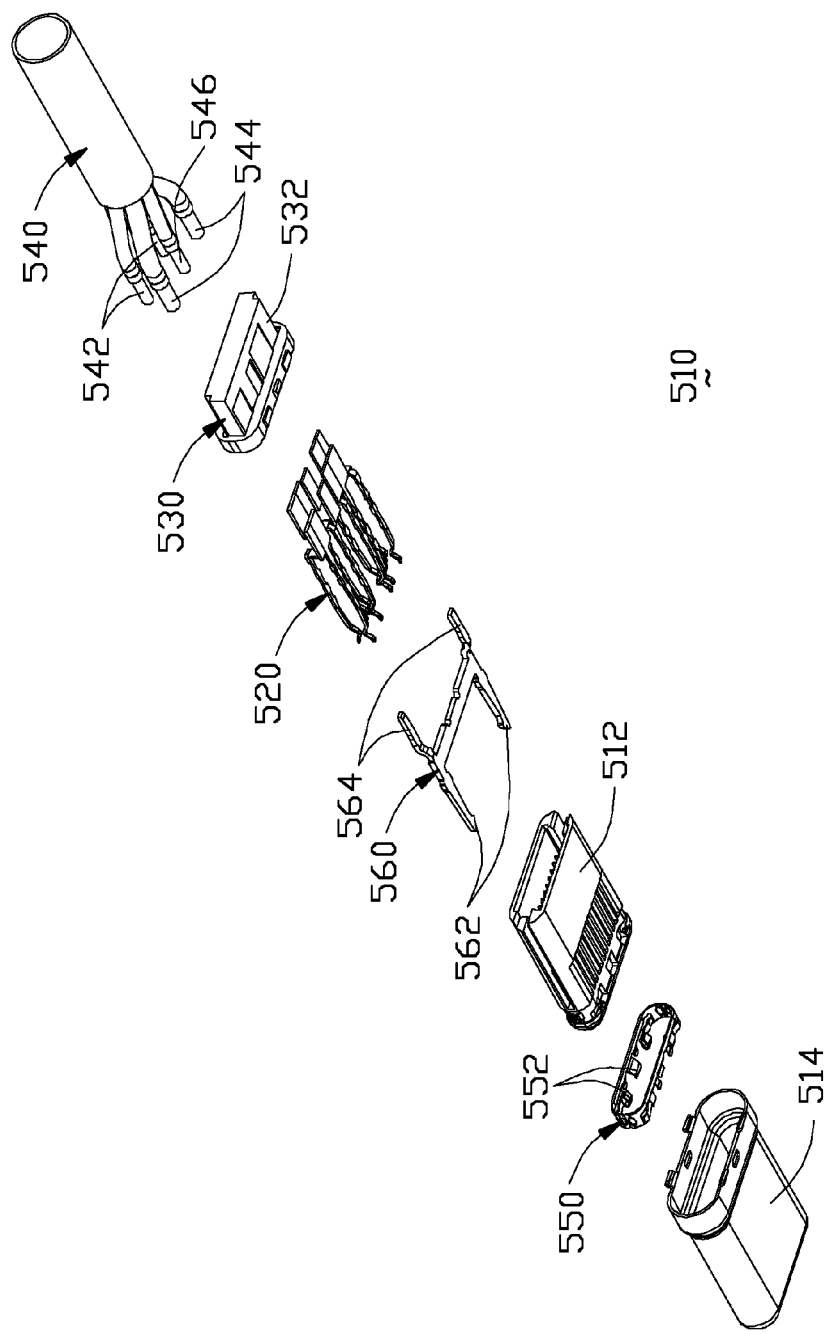
FIG. 10(B) is a rear partially exploded perspective view of the plug connector of FIG. 9(B).
Figure 11:
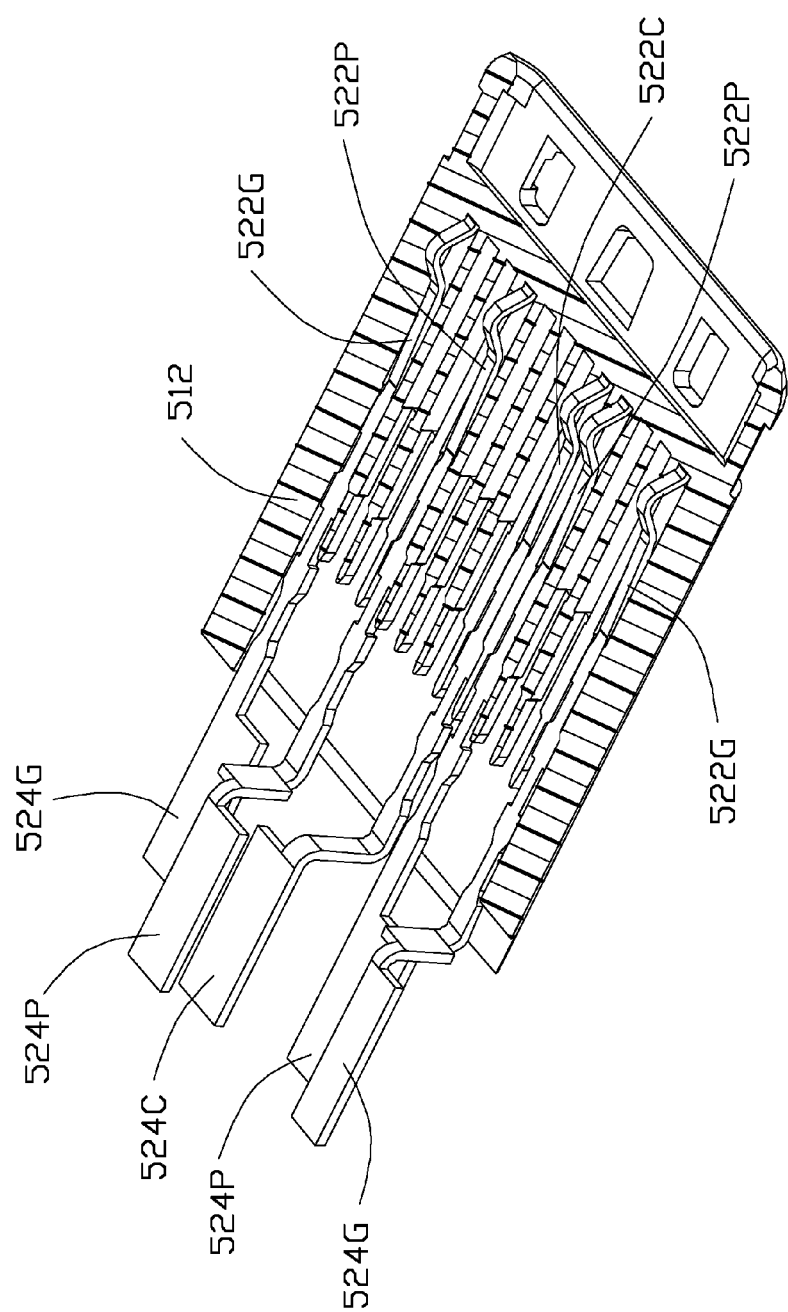
FIG. 11 is a horizontal view of a lower portion of the plug connector of FIG. 7(A).
Figure 12A:
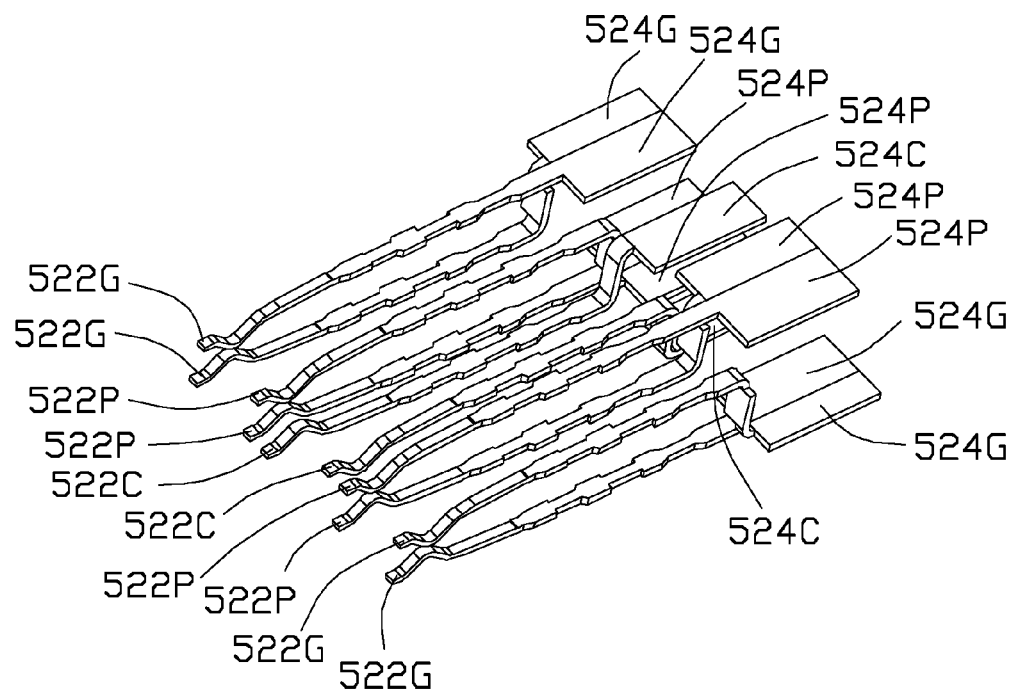
FIG. 12(A) is an enlarged front perspective view to show how all ten contacts are arranged structurally.
Figure 12B:
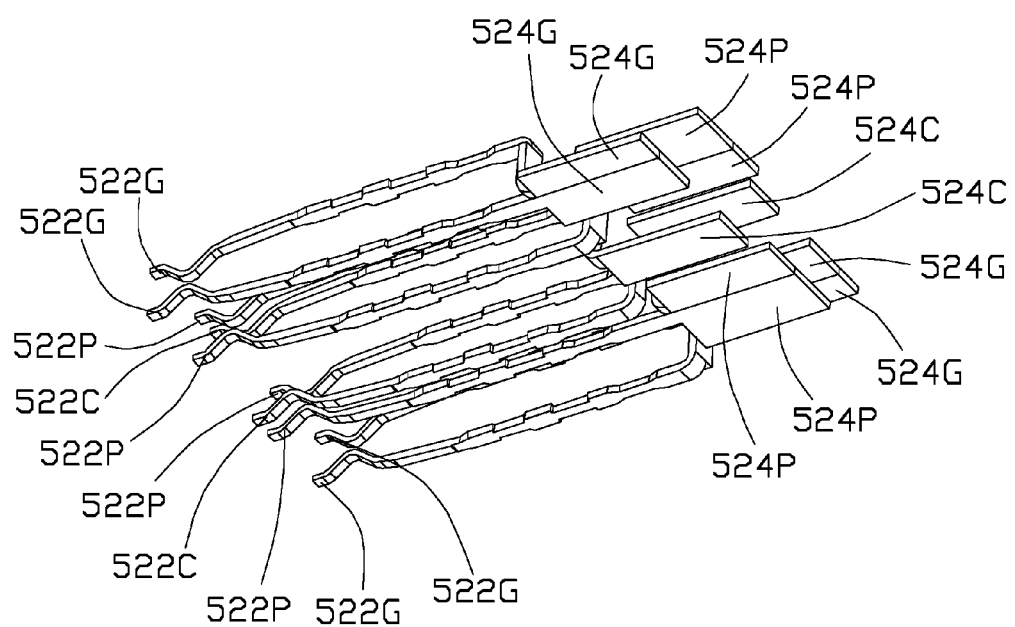
FIG. 12(B) is an enlarged rear perspective view to show how all ten contacts are arranged structurally.
Figure 13:
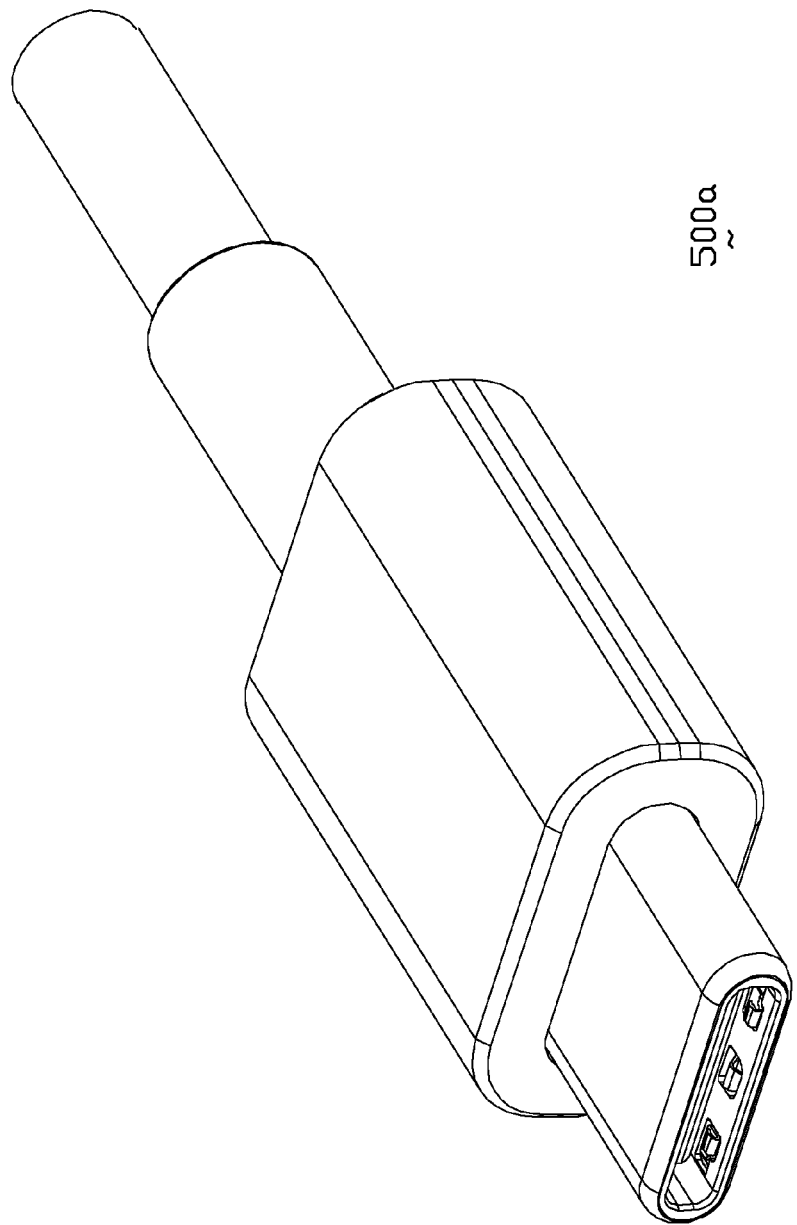
FIG. 13 is a front assembled perspective view of the plug connector of a third embodiment according to the invention.
Figure 14:
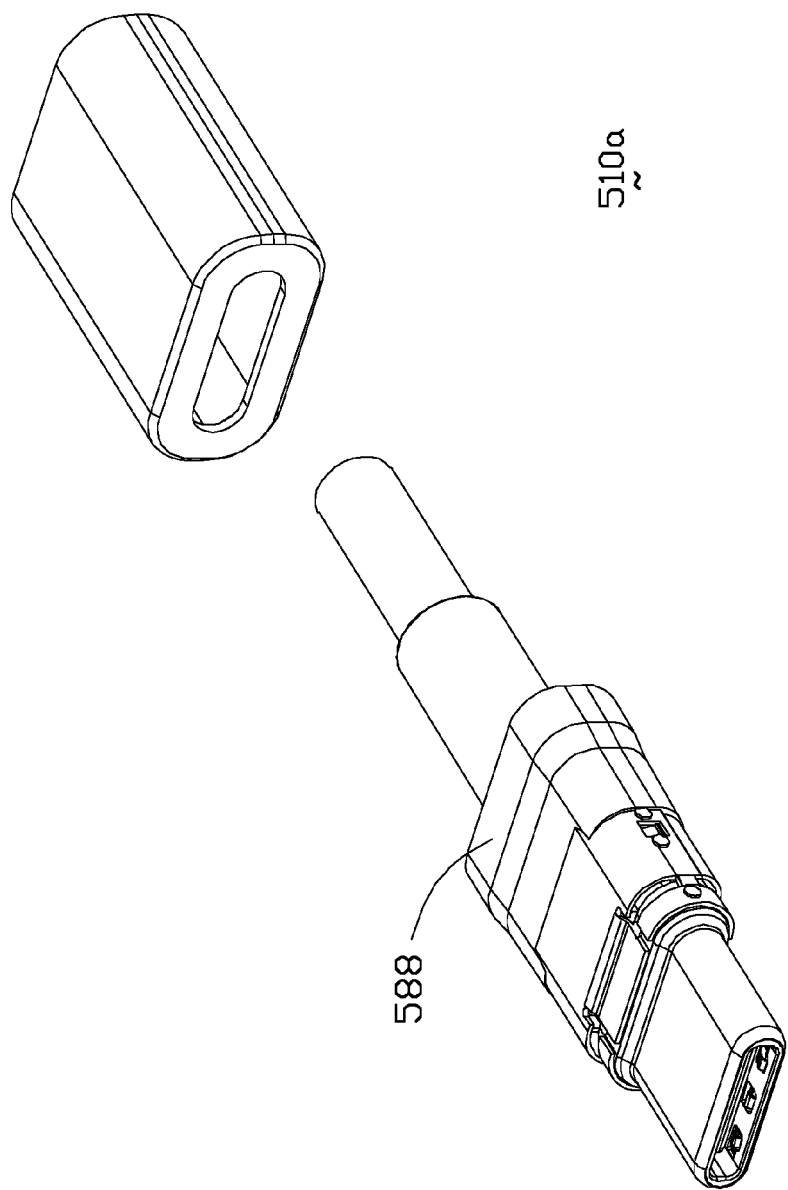
FIG. 14 is a front partially exploded perspective view of the plug connector of FIG. 13.
Figure 15:
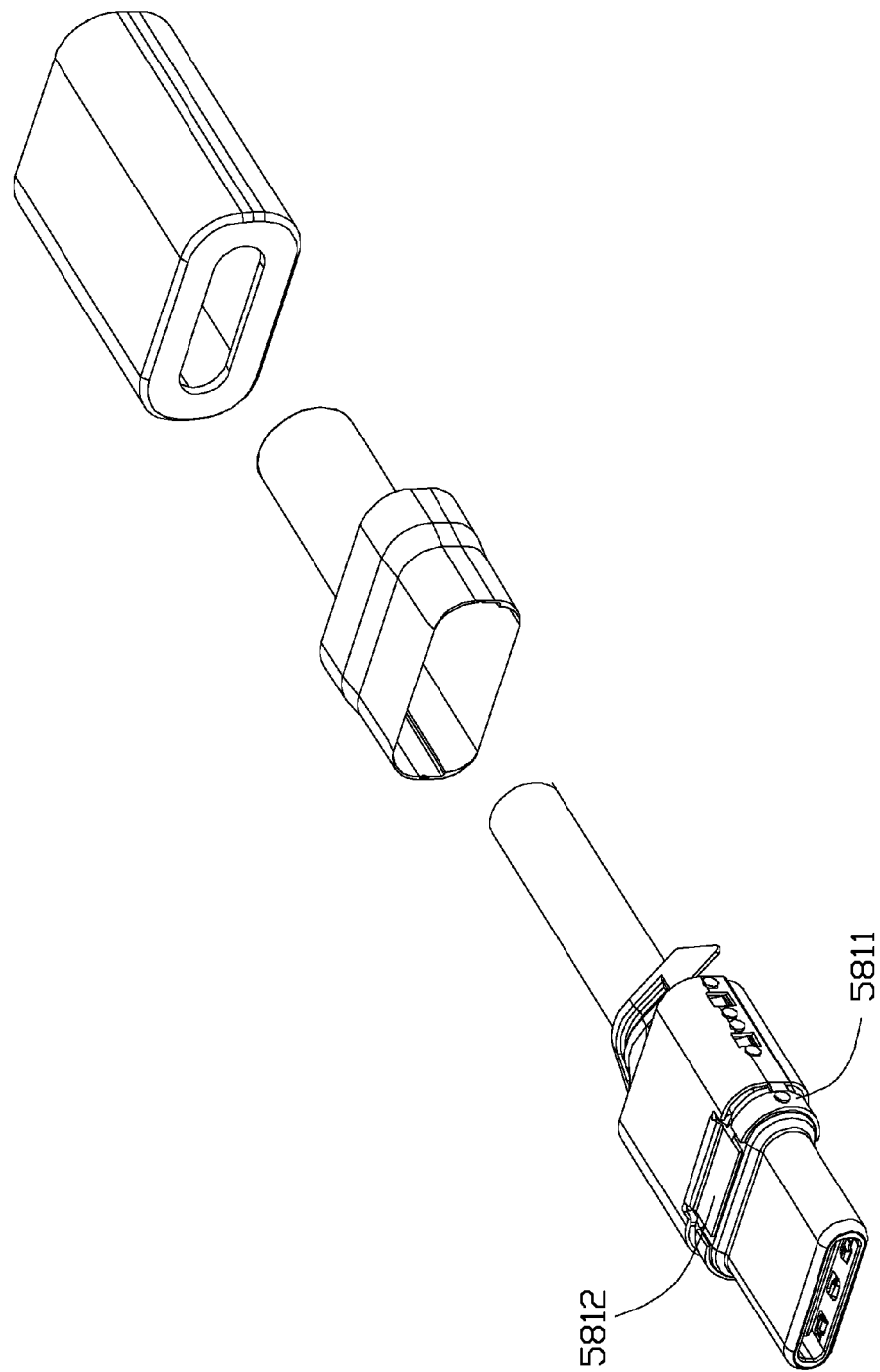
FIG. 15 is a further front exploded perspective view of the plug connector of FIG. 14.
Figure 16B:
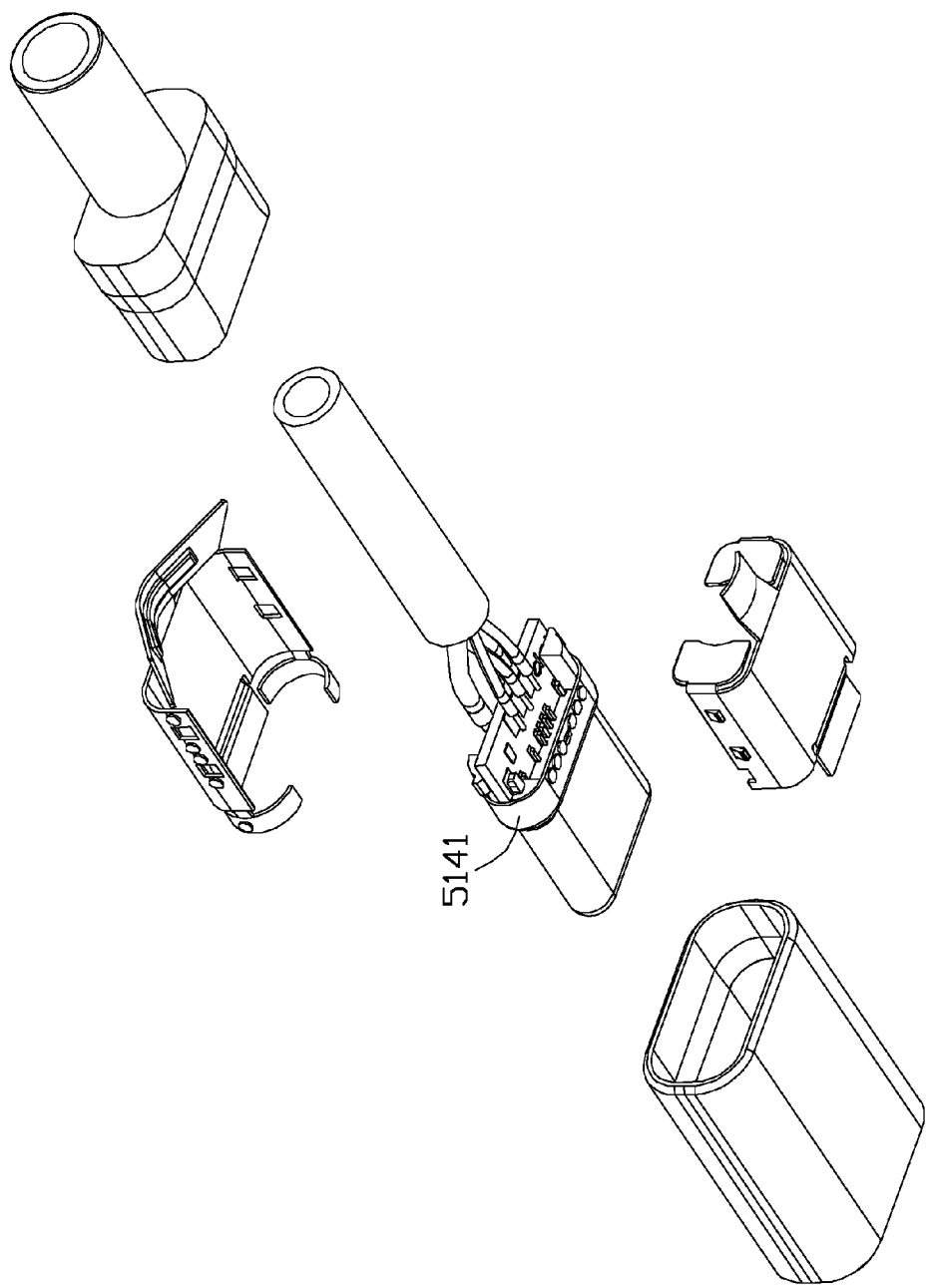
FIG. 16(B) is a further rear exploded perspective view of the plug connector of FIG. 15.
Figure 17B:
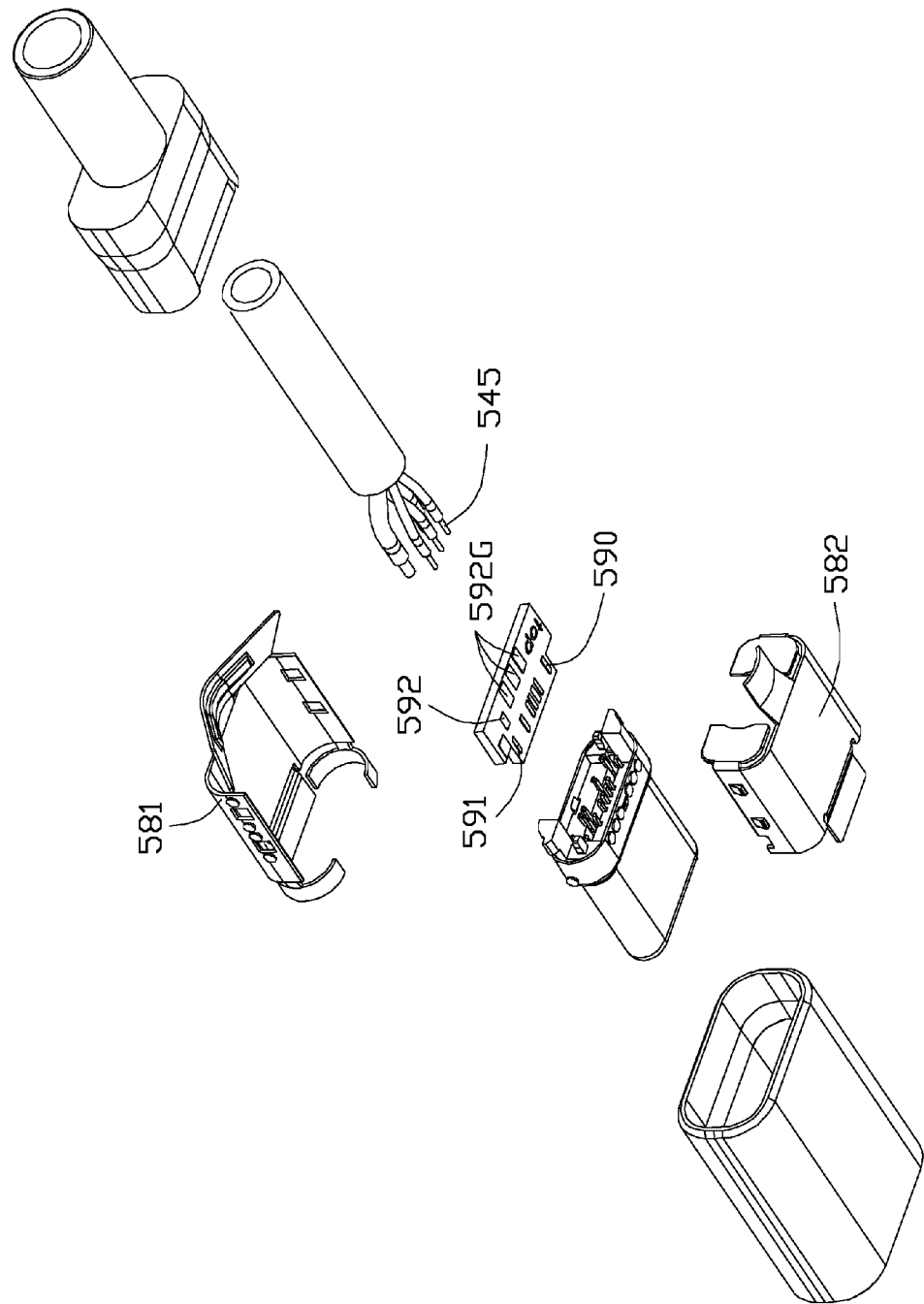
FIG. 17(B) is a further rear exploded perspective view of the plug connector of FIG. 16(B).
Figure 18A:
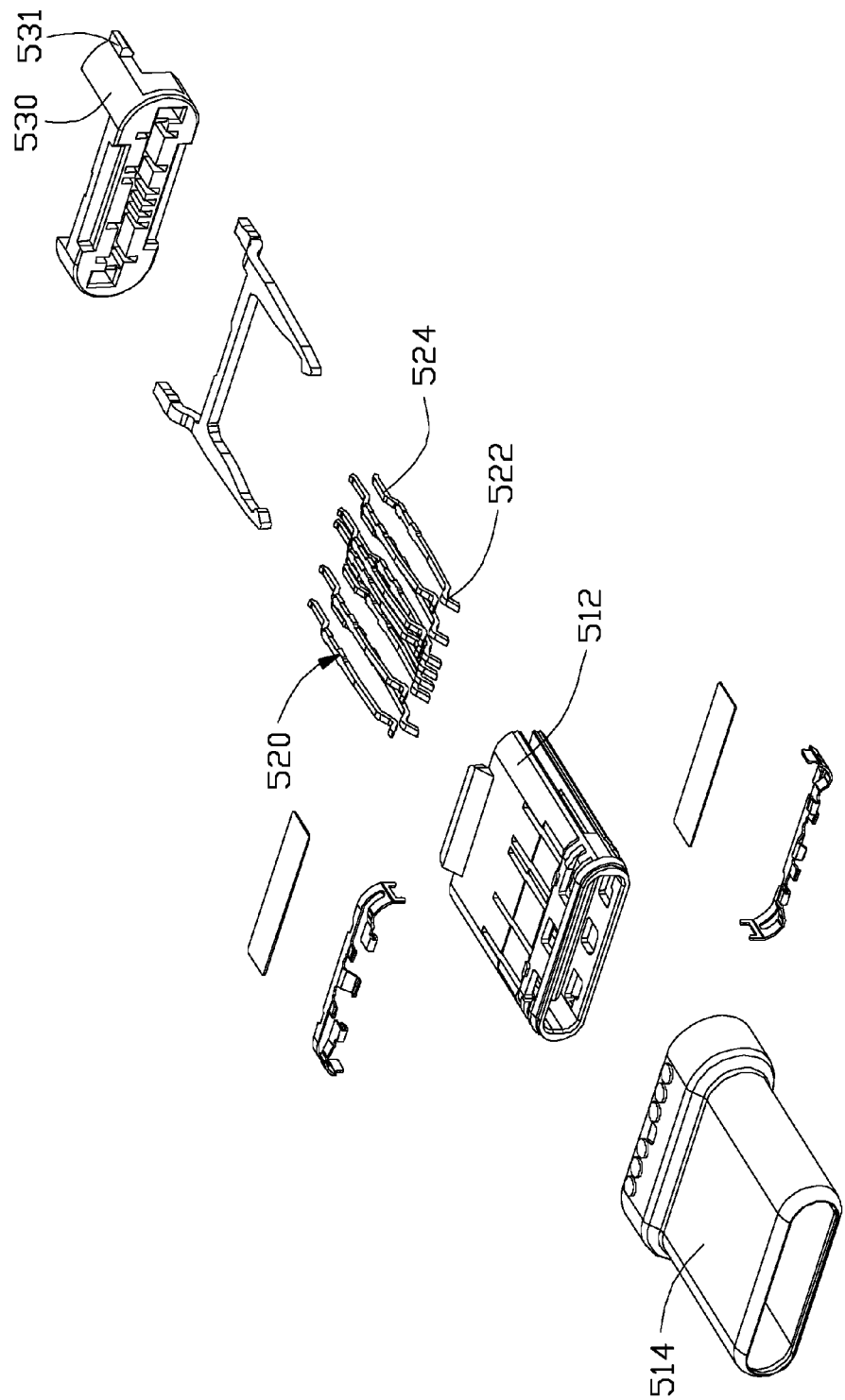
FIG. 18(A) is a further front exploded perspective view of the plug connector of FIG. 17(A).
Figure 18B:
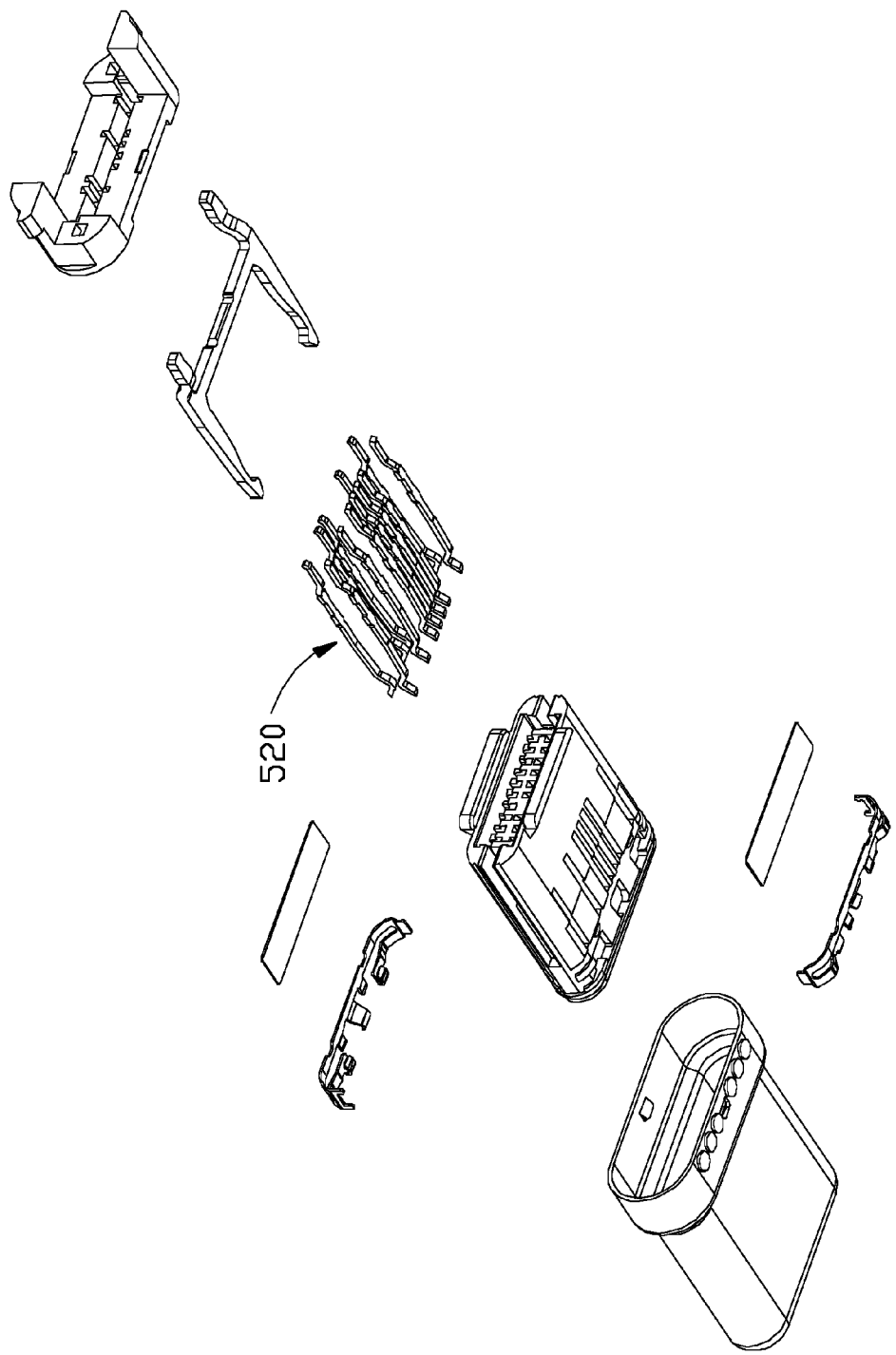
FIG. 18(B) is a further rear exploded perspective view of the plug connector of FIG. 17(B).
Figure 19B:
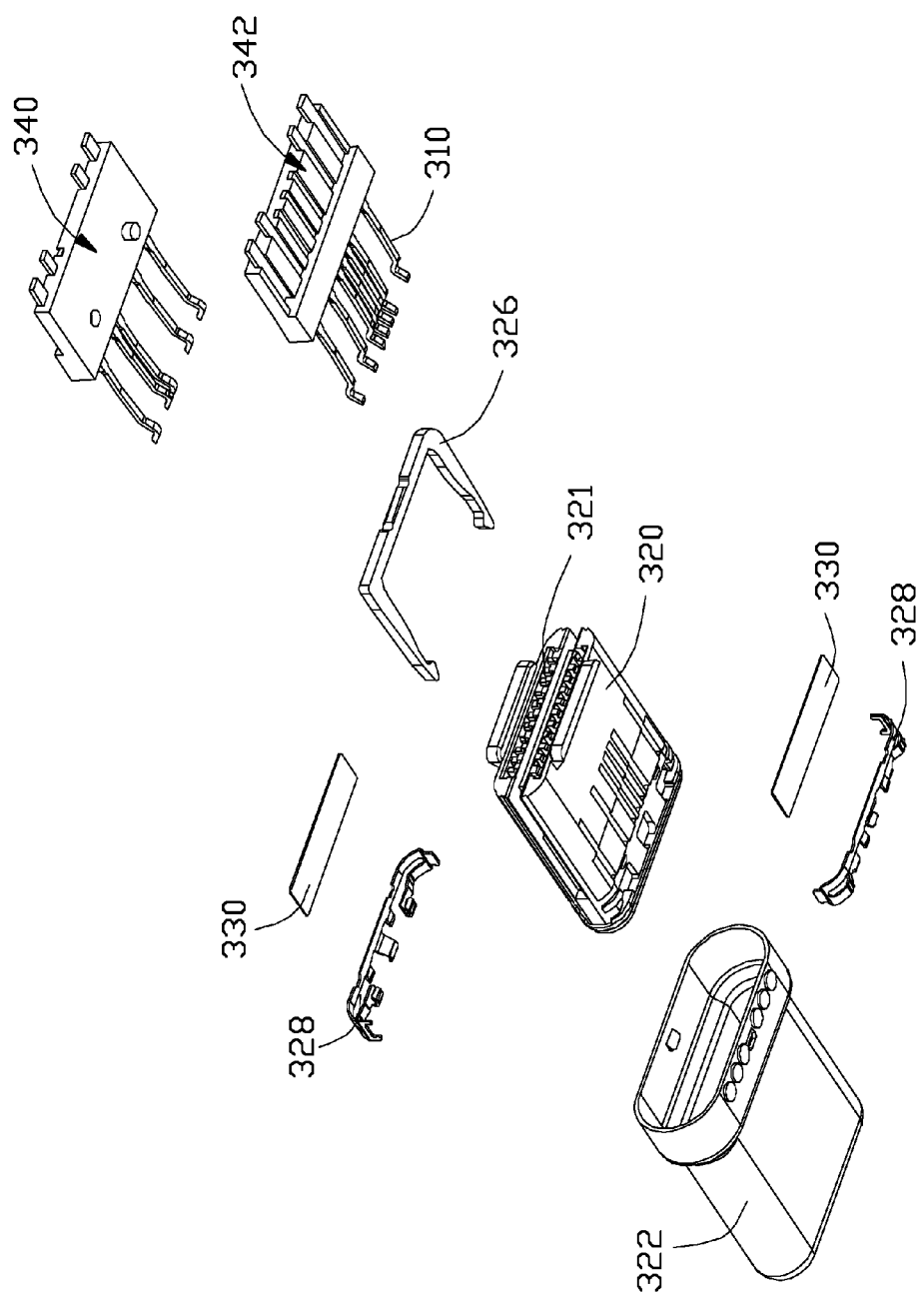
FIG. 19(B) is a front assembled perspective view of a terminal module assembly of the receptacle connector of FIG. 19(A).
Figure 20B:
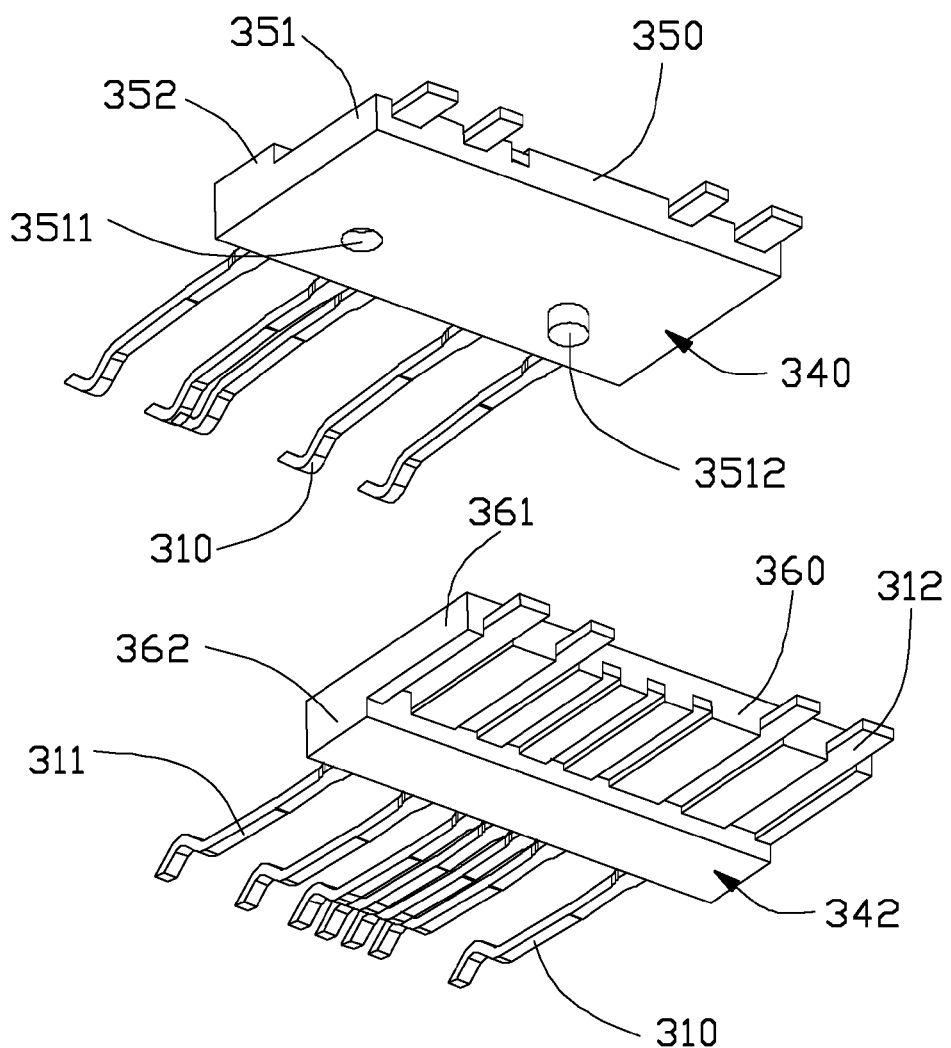
FIG. 20(B) is a rear exploded perspective view of the terminal module of the receptacle connector of FIG. 19(B).
Figure 21A:
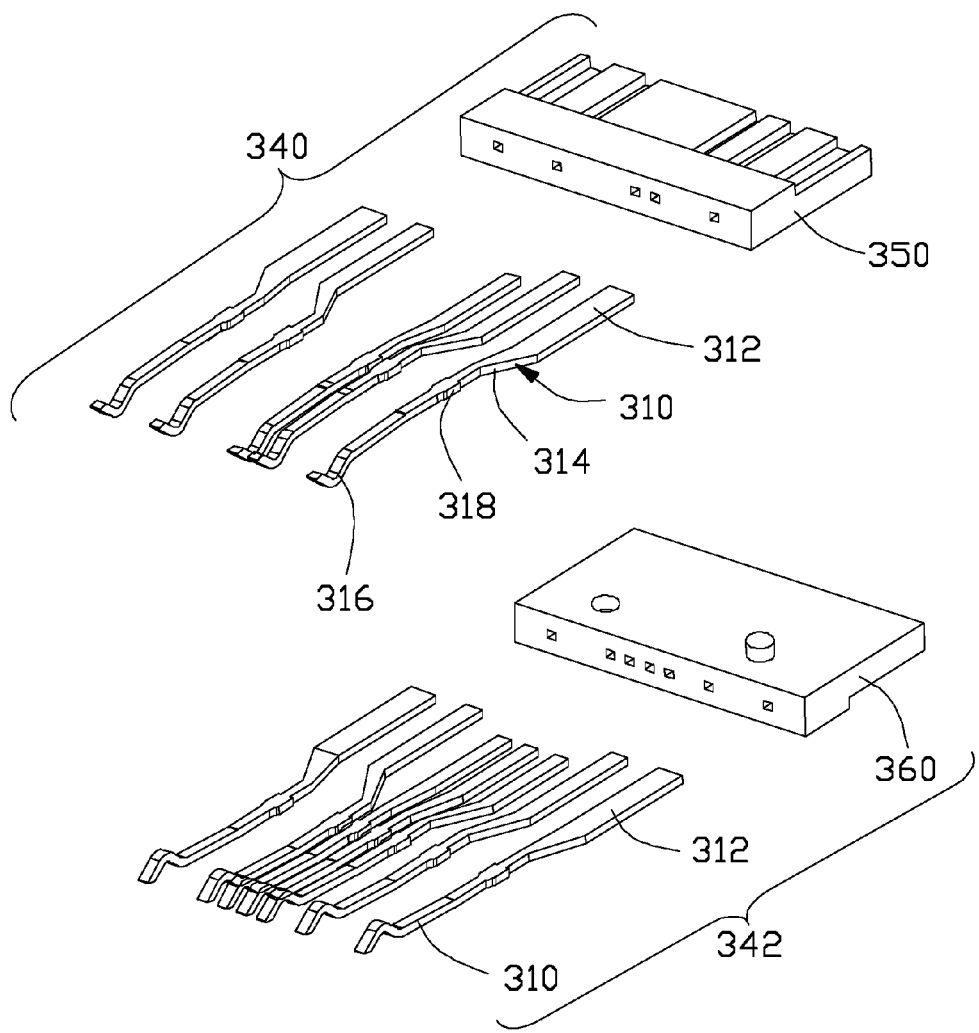
FIG. 21(A) is a further front exploded perspective view of the terminal module of the receptacle connector of FIG. 20(A).
Figure 21B:
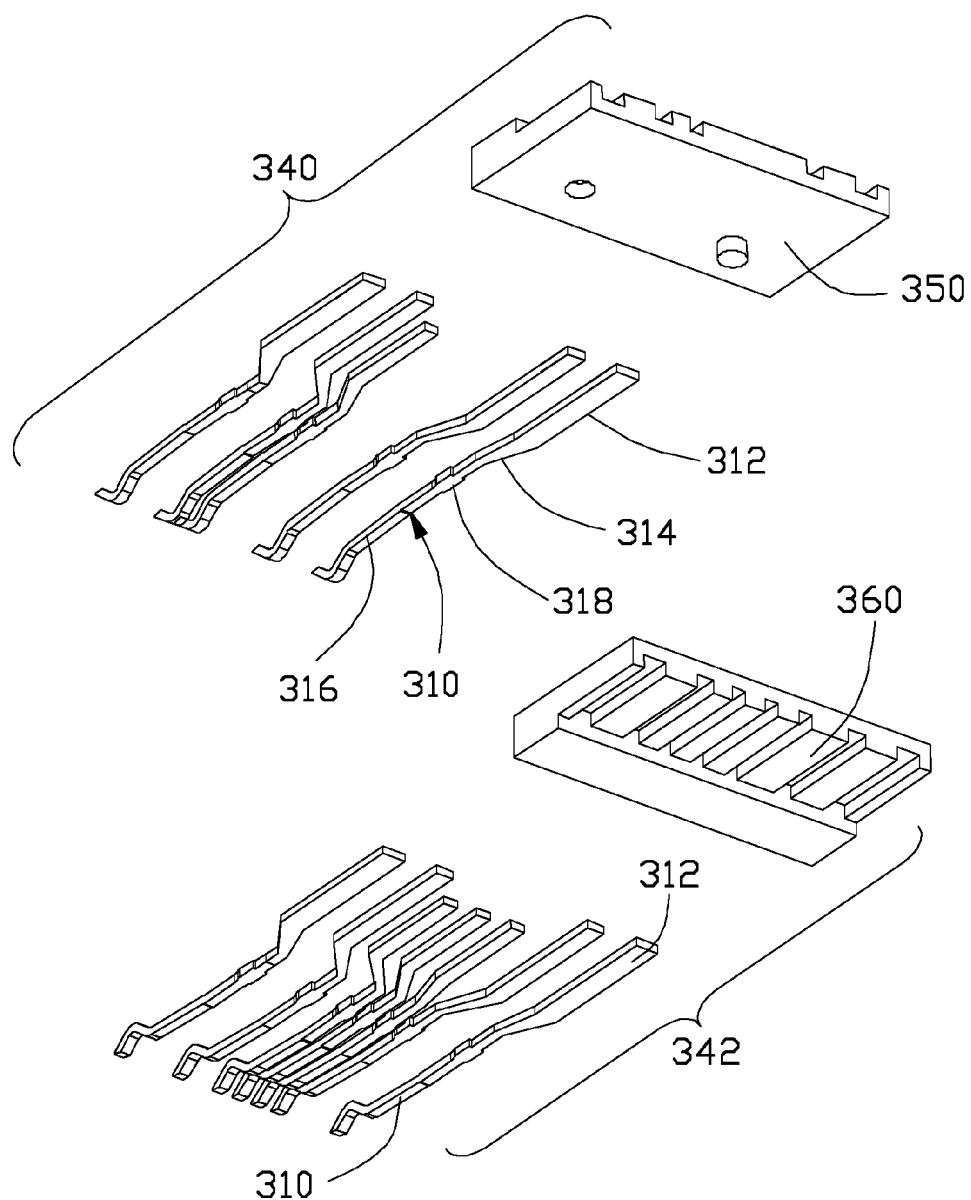
FIG. 21(B) is a further front exploded perspective view of the terminal module of the receptacle connector of FIG. 21(B).
Figure 22A:
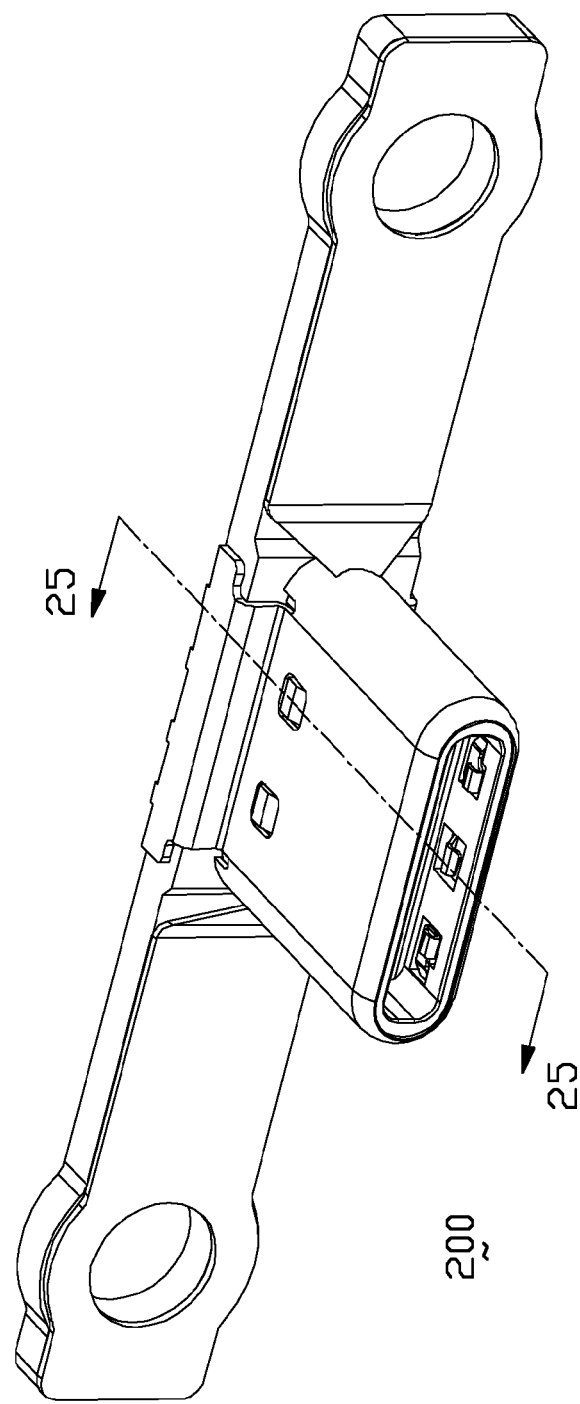
FIG. 22(A) is a front assembled perspective view of a fifth embodiment of the plug connector mounted to the printed circuit board in a docking manner.
Figure 22B:
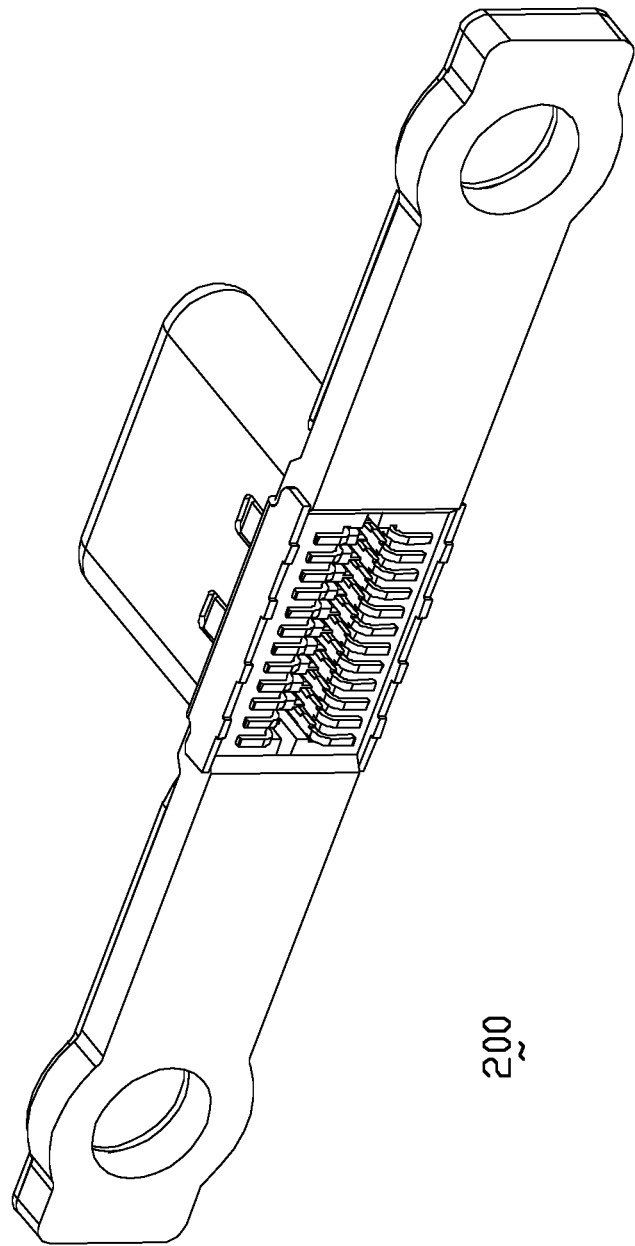
FIG. 22(B) is a rear assembled perspective view of the plug connector of FIG. 22(A).

FIG. 1 show a plug connector 10 mated with a receptacle connector 50 mounted in a notch of a printed circuit board 100. Referring to FIGS. 2-5 and further FIG. 6, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward and into the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two sides to be commonly inserted into a back side of the housing 12 wherein the protrusions 33 of the blade 31 are essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the comb structures on the blade 31, the protrusions 33 of the blade 31, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

FIGS. 7(A)-12(B) show a second embodiment of the plug connector 510 wherein compared with the plug connector disclosed in the previous first embodiment, the plug connector 510 only provides the power by the less number of the contacts only involved with the power delivery. The plug connector 510 includes an insulative housing 512 enclosed within a metallic shell 514 and defining a receiving cavity 516. Opposite first and second rows of contacts 520 only categorized with power contacts, grounding contacts and CC contacts are disposed in the housing 512 with unequal intervals while arranged in a diagonally symmetrical manner with regard to the receiving cavity 516 so as to allow a flippable insertion of the plug connector 510 into the corresponding receptacle connector. Each contact 520 includes a front contacting section 522 and a rear connecting section 524. The contacting section 522 of each row of contacts 520 are categorized with the contacting sections 522G of a pair of grounding contacts 520 commonly sandwiching therebetween the contacting sections 522P of a pair of power contacts 520 which successively sandwich a contacting section 522C of a CC (Configuration Channel) contact 520 therebetween. Anyhow, via specifically intentionally switching between the first and second rows, the connecting sections 524 of the contacts 520 in the first row are categorized with a pair of intimately side by side connecting sections 524G of the grounding contact 520 in the first row and that derived from the second row, cooperate with a pair of intimately side by side contacting connecting sections 524P of the power contact 520 in the first row and that derived from the second row to commonly sandwich a connecting section 524C of the CC contact 520 derived from the second row in a transverse direction. Similarly, the connecting sections 524 of the contacts 520 in the second row follow the same rule. Notably, in each row the connecting sections 524 of both the power contacts and grounding contacts 520 are spanned in one transverse direction while that of the remaining the CC contact 520 is spanned in an opposite transverse direction. It is also seen that in this embodiment the paired grounding contacts 520 have the corresponding contacting sections 522G spaced from each other in a vertical direction while having the corresponding connecting sections 524G intimately side by side contacting each other in the transverse direction perpendicular to said vertical direction. And the power contacts 520 are as well.

An insulative spacer 530 is located behind the housing 512 with opposite surfaces 532 on which the corresponding connecting sections 524P, 524G and 524C are exposed. The insulative spacer 530 comprises a front section 5301 retained with the insulating housing and a rear flat portion 5302 behind the insulative housing 512, the rear flat portion 5302 defines a top surface and a lower surface, the connecting sections of the two rows of contacts embedded in the rear flat portion 5302 and expose to the upper and lower surface of the rear flat portion 5302 to be directly soldered to wires of a cable 540. The cable 540 is located behind the spacer 530 and includes four power wires 542, two grounding wires 544 and one CC wire 546 wherein the four power wires 542 are soldered to two pairs of connecting sections 524P in a one-to-one relation, each of the two grounding wires 544 is soldered to one of the pair of connecting sections 524G on the corresponding surface 532. The CC wire 546 is soldered to either one of the connecting sections 524C on the spacer 530. In brief, on each surface 532, there are five connection sections 524 including a pair of intimately side by side arranged connecting sections 524G and a pair of intimately side by side arranged connecting sections 524P and a connecting section 524C therebetween in the transverse direction. And on one surface 532, two power wires 542 are soldered upon the corresponding pair of connecting sections 524P, one grounding wire 544 is soldered upon one of the pair of connecting sections 524G, and the CC wire 546 is soldered upon the corresponding connecting section 524C. Similarly, on the other surface 532, there are two power wires 542 and one grounding wire 544 are soldered unto the corresponding connecting sections 524P and 524G while no CC wire 546 is available thereon. Understandably, via the connecting sections 524 offset, in a vertical direction, from the corresponding contacting sections 522 in some contacts 520, the corresponding wires 542, 544, 546 may be simplified and easily organized and soldered to the corresponding connecting sections 524G, 524P and 524C, respectively.

Similar to the first embodiment, a pair of spring plates 550 are assembled to the housing 512 with spring tangs 552 extending into the receiving cavity 516 for coupling to the corresponding receptacle connector. A H-shaped metallic latch 560 is assembled to the housing 512 with a pair of locking heads 562 located at a front portion and extending into the receiving cavity 516 for latching to the corresponding receptacle connector, and a pair of connecting tails 564 located at a rear portion and extending through the spacer 530 and respectively located on two opposite surfaces 532 for connecting to the braiding of the cable 540. Notably, different from the front locking heads 562 are located at the same plane, the rear connecting tails 564 are offset from each other in the vertical direction for respectively mounted to the opposite surfaces 532 of the spacer. Clearly, in this embodiment, because only the power/ground/CC contacts are disposed in the housing 512, the paddle card is omitted but replaced with the spacer for supporting the connecting sections 524 of the contacts 520 for directly soldering to the corresponding wires in an organized manner.

Referring to FIGS. 13-18(B) showing a third embodiment of the plug connector 510a, which is similar to the second embodiment with tiny differences. Different from the previous second embodiment, in this embodiment the contacts 520 essentially only has twelve pieces including the power contacts, the configuration channel, the grounding contacts and optionally the low speed differential pairs without the super speed differential pairs. A paddle card 590 is horizontally positioned behind the spacer and includes a plurality of front circuit pads 591 on the front edge region to be soldered with the tails 524 of the corresponding contacts 520, and a plurality of rear circuit pads 592 on the rear edge region to be soldered with the inner conductors 5451 of the corresponding wires, respectively. The feature of the embodiment is to arrange the rear circuit pads (as labeled 592P) for the power contacts on one surface of the paddle card 590 while those (as labeled 592G) for the grounding contacts on the other surface thereof. Notably, in this embodiment, the three grounding wires are diametrically smaller than the two power contacts. On other hand, the front circuit pads 591 are still aligned with the corresponding power and grounding contacts 520 in the front-to-back direction without shifting. Understandably, in this embodiment the cable only contains the power wires and the grounding wires to mechanically and electrically connect to the corresponding rear power circuit pads 592P and the corresponding rear grounding circuit pads 592G. Anyhow, additional lower speed differential pair wires may be contained to be electrically connected to the low speed differential pair contact via the paddle card 590 optionally. A metallic shell 514 encloses the housing 512, and a pair of metallic covers 581, 582 are secured to each other and commonly sandwich and retain the assembled housing 512, the shielding shell 514 and cable to form a subassembly. An inner overmolding part 588 encloses the subassembly and an outer overmolding part 589 encloses the inner overmolding part 588 while exposing the front mating port and the rear cable extension. In this embodiment the spacer 530 further forms a lateral extension 531 to be received in a corresponding recess 5821 of the cover 581, 582 for precisely positioning the covers 581, 582 with regard to the subassembly. The metallic shell 514 defies a rear retaining portion 5141, one of the cover 581, 582 defines a pair of front retaining portion 5811 on lateral sides thereof which are fitly embrace corresponding portion of the rear retaining portion 5141 of the metallic shell 514. The covers 581, 582 further defines a pair of retaining plates 5812, 5822 being soldered to corresponding portion of the rear retaining portion 5141. The pair of front retaining portions are also soldered to the rear retaining portion 5141.

FIGS. 19(A)-21(B) shows a fourth embodiment of a plug connector 300. Compared with the typical plug connector disclosed in the first embodiment, the plug connector 300 has a less number of contacts 310 for only transmitting the relatively low speed signals and grounding and power while lacking the super speed signal transmission. In this arrangement, the paddle card may be omitted and the wires are direction connected to the tail sections of the contacts 310 for saving money consideration. In general, the plug connector 300 includes an insulative housing 320 enclosed within a metallic shell 322 and defining a receiving cavity 324 therein. A metallic latch 326 is assembled to the housing 320 with locking heads extending into the receiving cavity 324 in the transverse direction. A pair of spring fingers 328 are assembled to the housing 320 with contacting sections extending into the receiving cavity 324 in the vertical direction. A pair of tapes 330 covers the corresponding spring fingers 328 for isolating the spring fingers 328 from the shell 322. Different from the plug connector in the previous embodiment, in this embodiment the upper terminal module 340 includes an upper insulator 350 with one five contacts 310, instead of twelve contacts 310, being integrally formed therewith and the lower terminal module 342 includes a lower insulator 360 with only seven contacts 310, instead of twelve contacts 310, being integrally formed therewith. The contacts 310 comprises contacting section 311 extending into the receiving cavity and tail sections 3102 embedded in rear flat portions 351, 361 of corresponding insulators. The rear flat portions 351, 361 of the upper and lower insulator are disposed behind the insulative housing 320. The tail sections 312 of the upper and lower contacts are exposed on a top surface of the rear flat portions 351, 361 of the upper insulator and a lower surface of rear flat portions of the lower insulator to be directly soldered to the corresponding wires of the cable. The upper and lower insulators 340, 342 comprises a retaining hole 3411/3511 and a retaining post 3512/34121 fitly engaged with each other to assembled the upper and lower terminal module together, on front flat portions 352, 362 thereof. The front portions of the upper and lower insulators are retained in insulative housing. Notably, using the paddle card can have the fine pitch of the tail sections of the contacts for connection. Differently in this embodiment, because of omitting the paddle card, the tail sections 312 of the contacts 310 are required to be directly soldered to the corresponding wires and thus is desired to be enlarged in width and fanned outwardly for compliance with the wire dimension/position for soldering consideration; in fact, the widened tail sections 312 take/occupy the original space of those of the omitted contacts on the insulator 350, 360 so as to allow the whole set of the plug connector 300 to keep the similar transverse dimension of the insulators 350, 360 as original for miniaturization consideration advantageously. Notably, in each contact 310 the offset section 314 between the tail section 312 and the contacting section 316 is retained by the corresponding insulator and also occupies the original space of the omitting neighboring contacts. As a result, the contacting sections 316 of the existing contacts 310 are exactly positioned at the right place in compliance with the full featured receptacle connector for mating and the tail sections 312 may easily comply with the corresponding wires for soldering advantageously. Clearly, each contact 310 includes a barb structure 318 in front of the offset section 314 to retain the corresponding contact 310 within the corresponding passageway in the housing 320.

Referring to FIGS. 22-28, according to a fifth embodiment of the invention, the plug connector 200 includes an insulative housing 202 with a metallic shell 204 attached thereon. The housing 202 has a base portion 206 with a main portion 208 extending therefrom on the middle region so as to form a pair of side wings 210 with corresponding through holes 212 extending therethrough. The main portion 208 is similar to the housing 12 and forming a receiving cavity 214 with two rows of contacts 216 by two opposite elongated sides. A pair of EMI spring plates 218 are positioned upon the main portion 208 and extend into the receiving cavity 214, and a pair of insulative tapes 221 are positioned upon the corresponding EMI spring plates 218 for isolating the EMI spring plates 218 from the metallic shell 204. Understandably, similar to the first embodiment the plug connector 200 also includes the side latch to engage the shielding plate in the mating tongue of the corresponding receptacle connector. The metallic shell 204 includes a main section 220 with a pair of side arms 222 by two sides, and each side arm 222 forms a through holes 224 therein. Notably, the main section 220 encloses the mating portion 208, and the pair of side arms 222 cover the pair of side wings 210 with the corresponding through holes 212 and 224 aligned with each other in the mating direction.

Figure 23A:
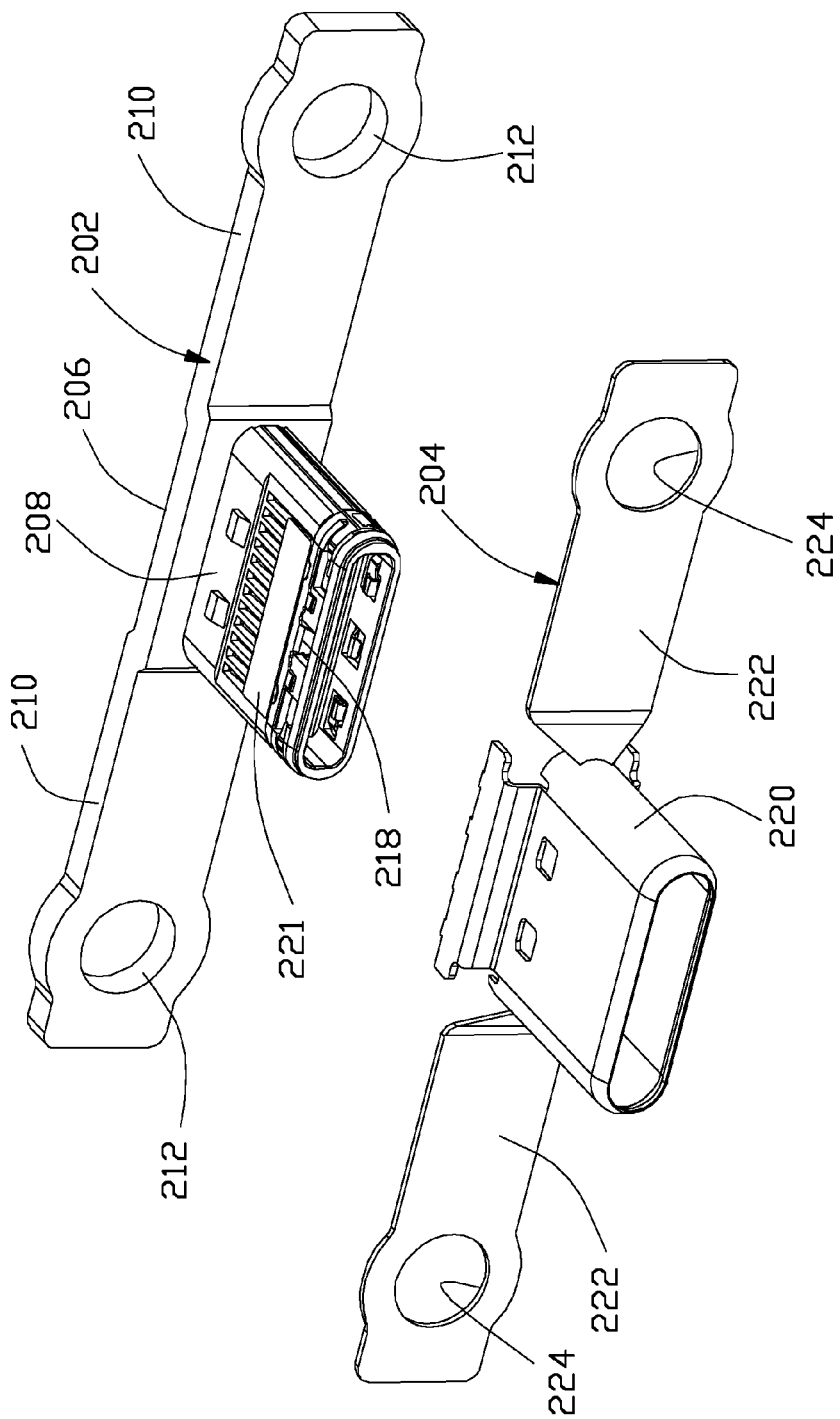
FIG. 23(A) is a front exploded perspective view of the plug connector of FIG. 22(A).
Figure 23B:
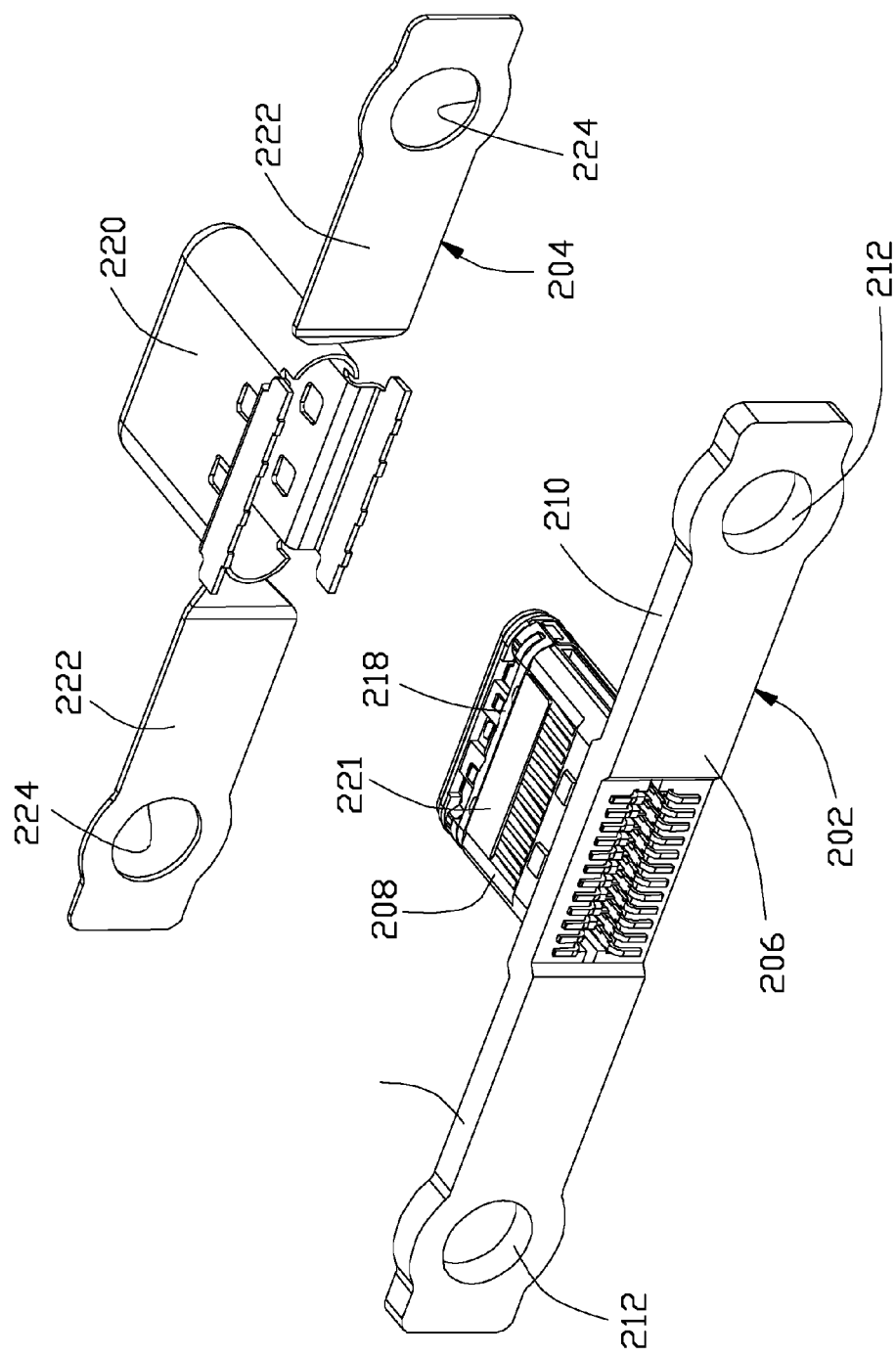
FIG. 23(B) is a rear exploded perspective view of the plug connector of FIG. 22(B).
Figure 24A:
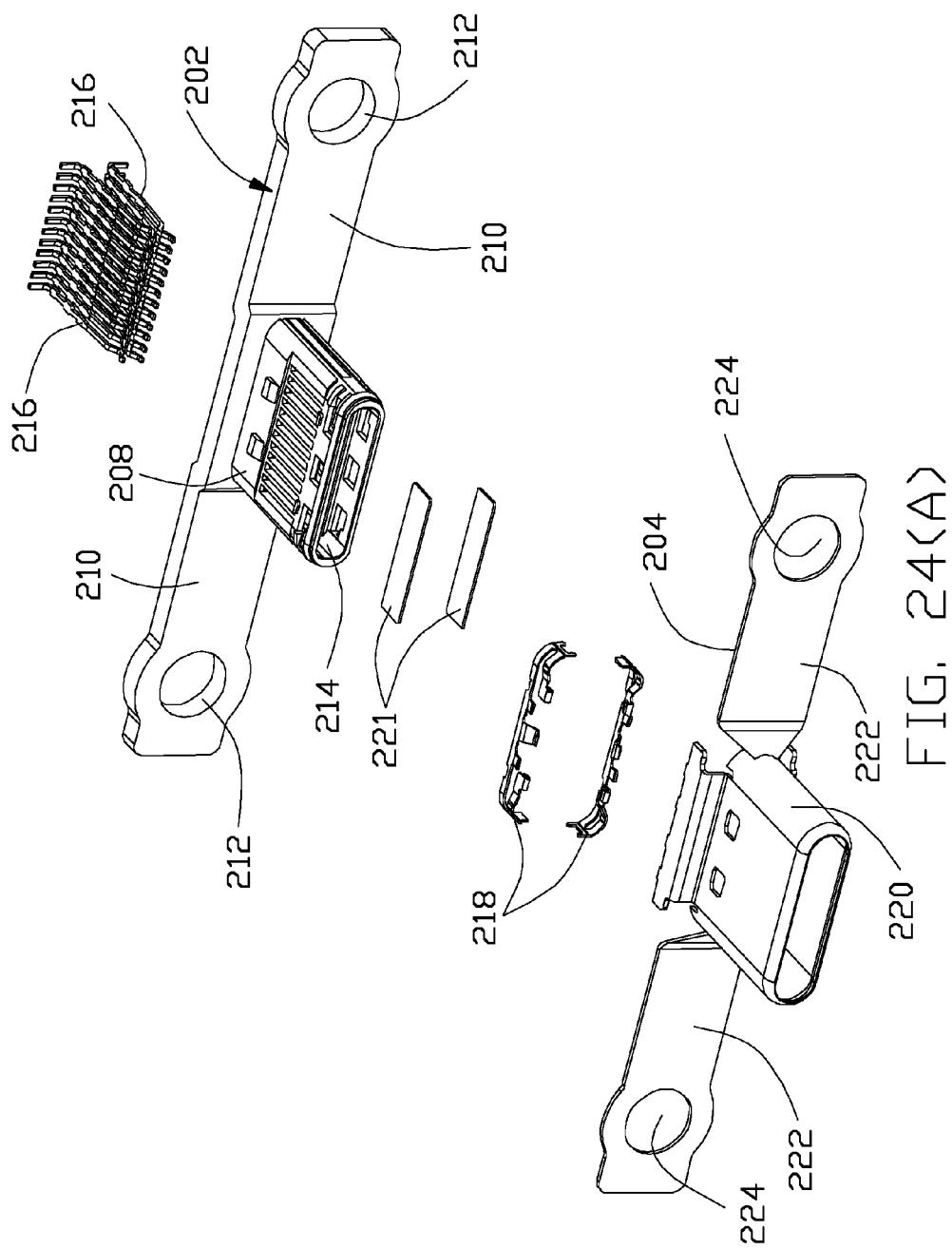
FIG. 24(A) is a further front exploded perspective view of the plug connector of FIG. 23(A).
Figure 24B:
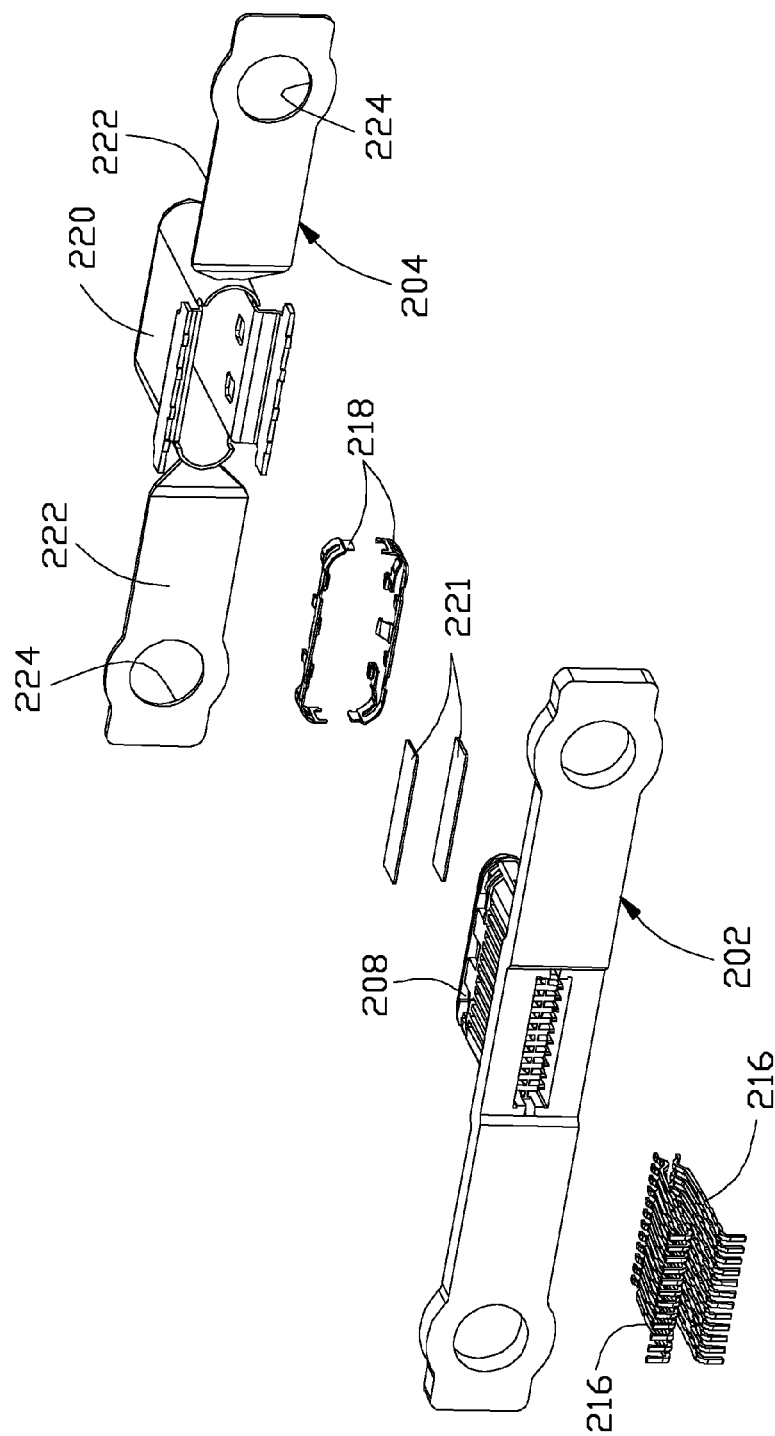
FIG. 24(B) is a further rear exploded perspective view of the plug connector of FIG. 23(B).
Figure 25:
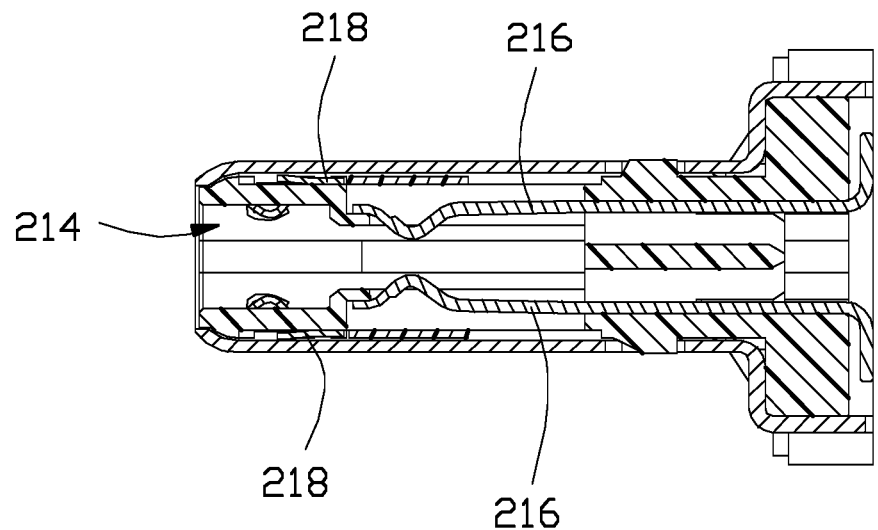
FIG. 25 is a cross-sectional view of the plug connector taken along lines 25-25 of FIG. 22(A).
Figure 26:
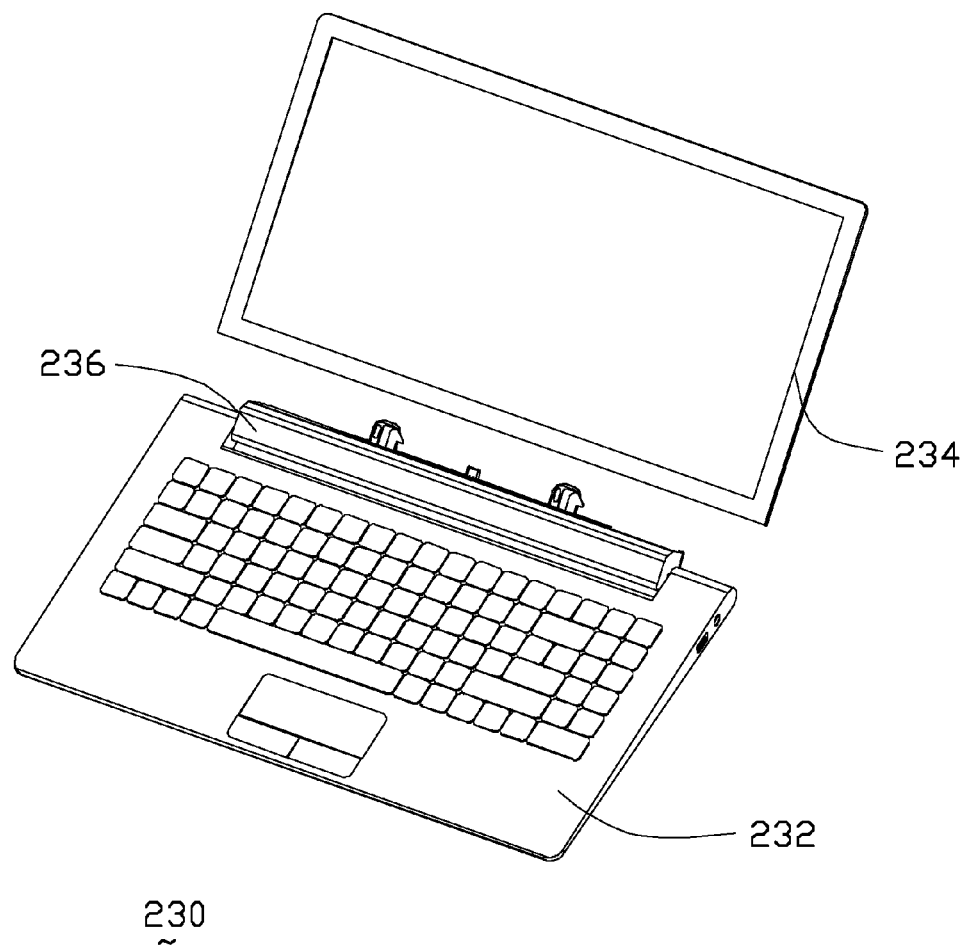
Figure 27:
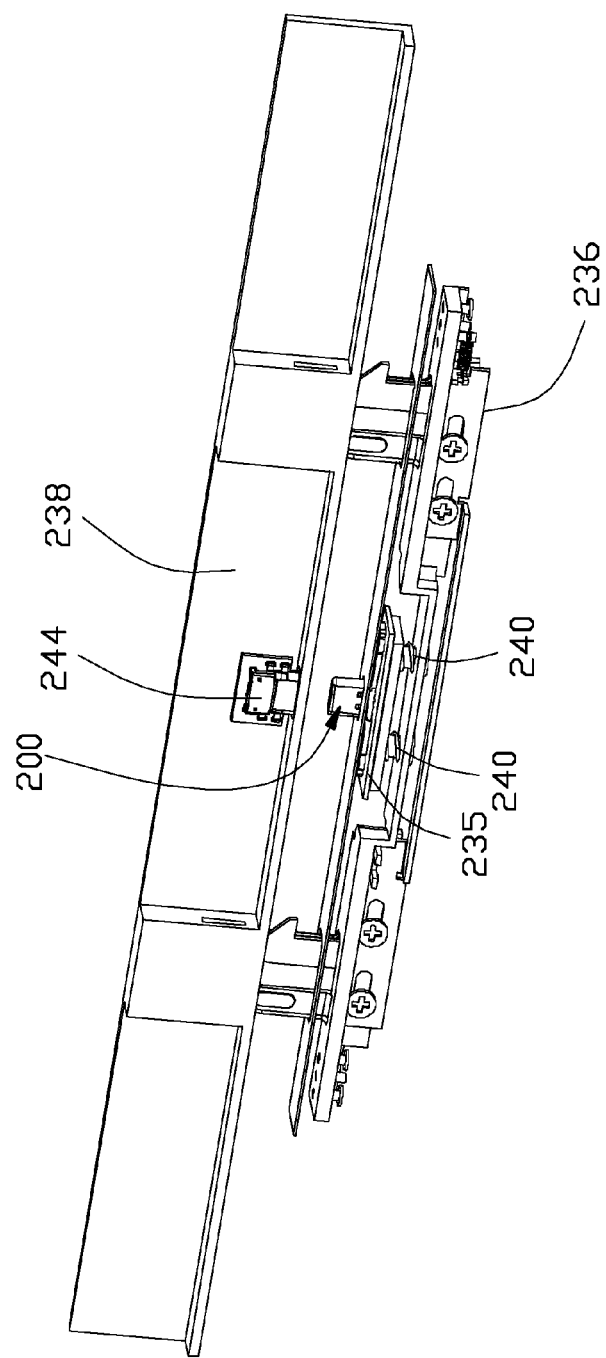
FIG. 27 is a perspective view of the assembly unit used in the laptop computer of FIG. 26 and including the plug connector of FIG. 23(A) and the corresponding receptacle.
Figure 28:
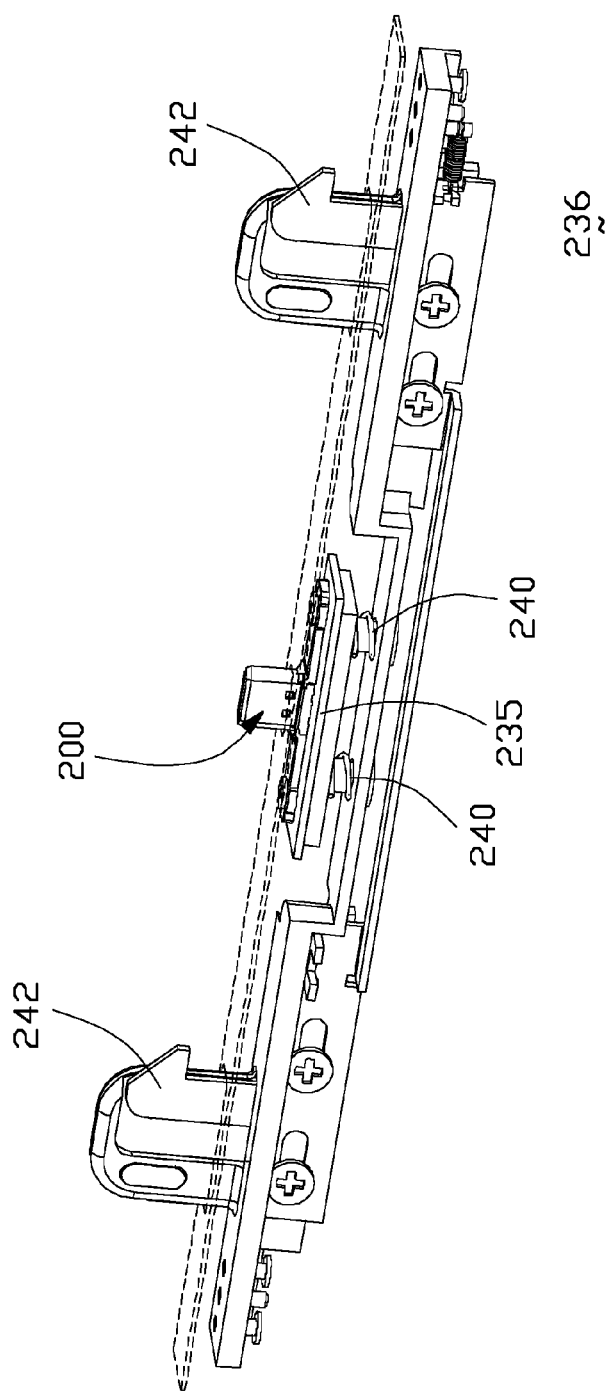
FIG. 28 is the perspective view of the sub-assembly unit used in the base with the plug connector of FIG. 23(A).

Referring to FIGS. 23-25, the laptop computer 230 includes a base 232 and a detachable display 234. The base 232 includes a rotatable subassembly 236 pivotally mounted at a longitudinal side while the display 234 includes a securing section 238 on the corresponding longitudinal side thereof. The plug connector 200 is mounted to a printed circuit board 235 of the subassembly 236 in a floating manner along the mating direction via a pair of springs 240. The subassembly 236 also includes a pair of latches 242 retractably moveable in the transverse direction along the longitudinal side for locking to the securing section 238 of the display 234. The corresponding receptacle connector 244 is located on the securing section 238 of the display 234 for mating the plug connector 200.

Figure 29:
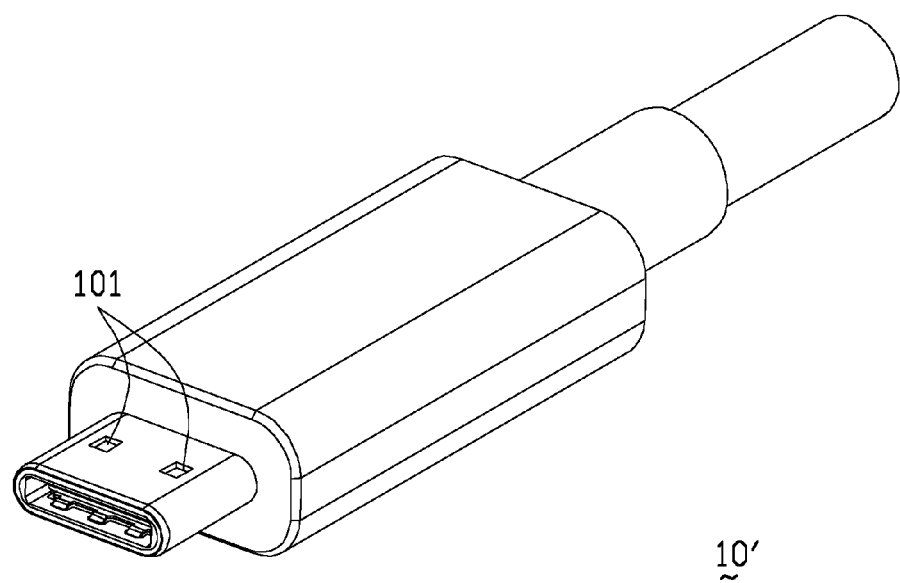
FIG. 29 is a perspective view of another embodiment of the plug connector according to the invention.
Figure 30:
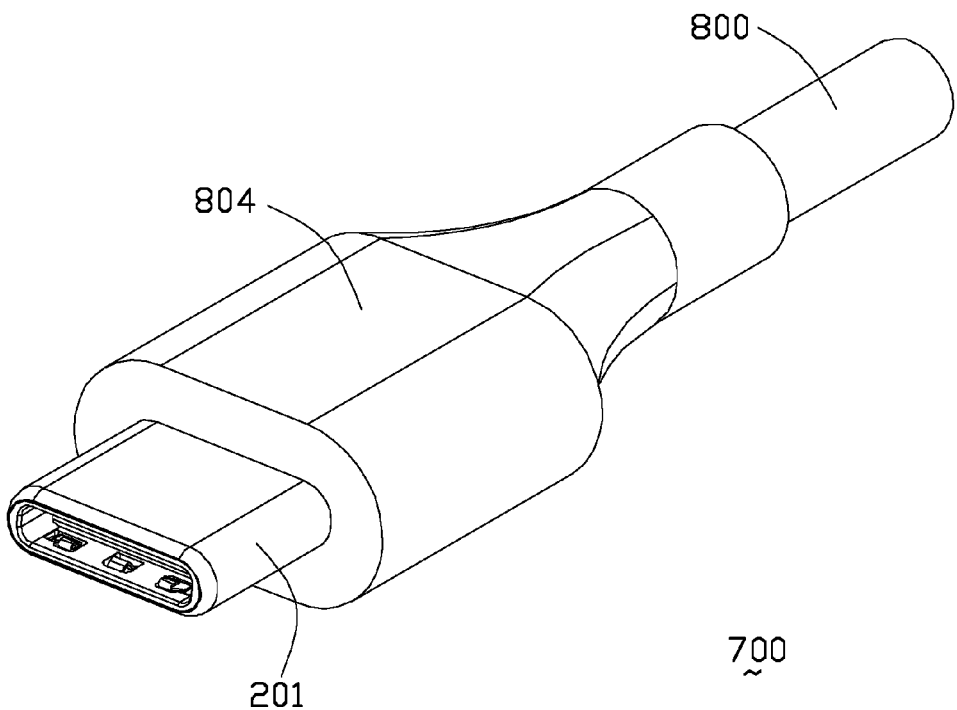
FIG. 30 is a perspective view of another embodiment of the plug connector according to the invention.
Figure 31:
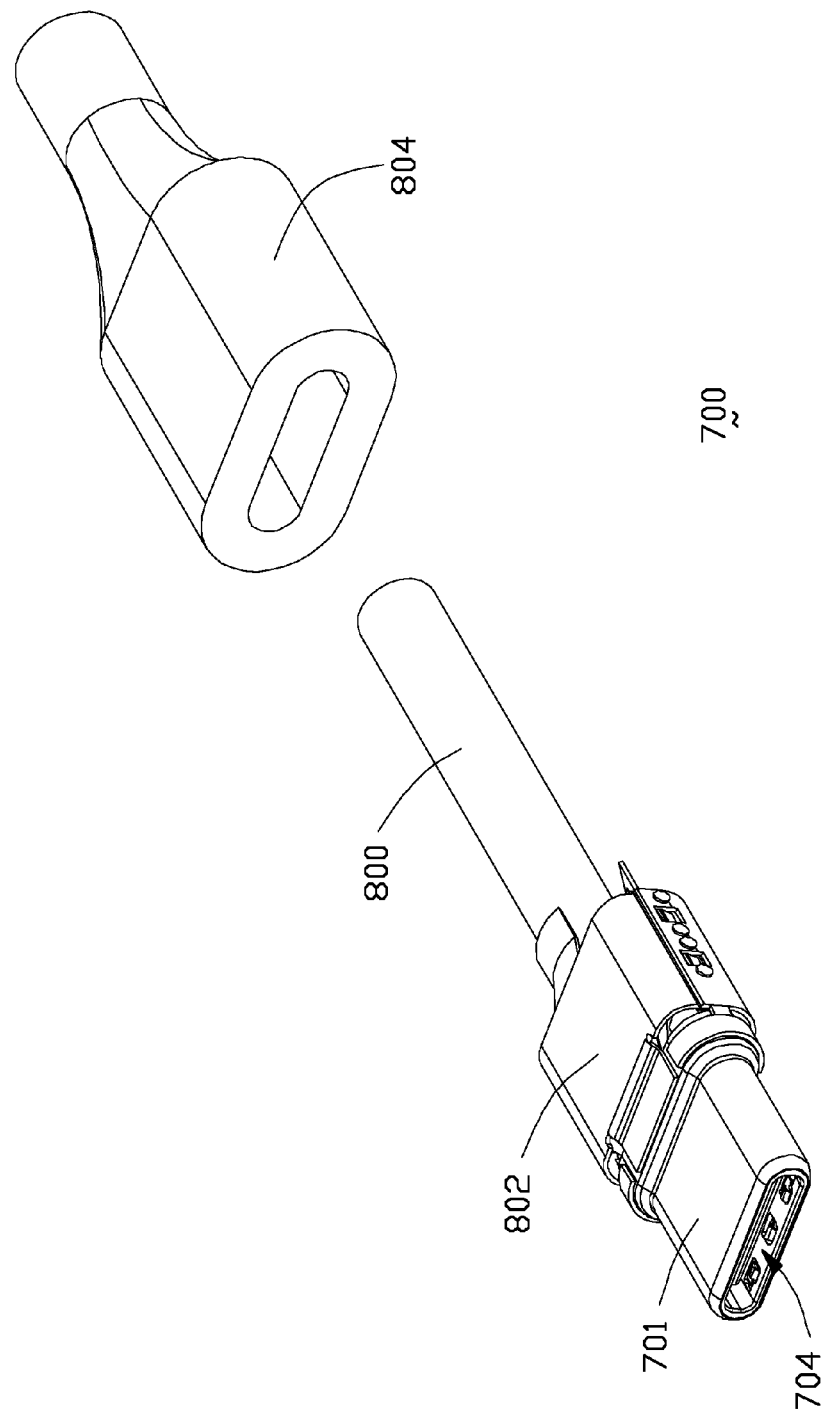
FIG. 31 is an exploded perspective view of the plug connector of FIG. 30.
Figure 32A:
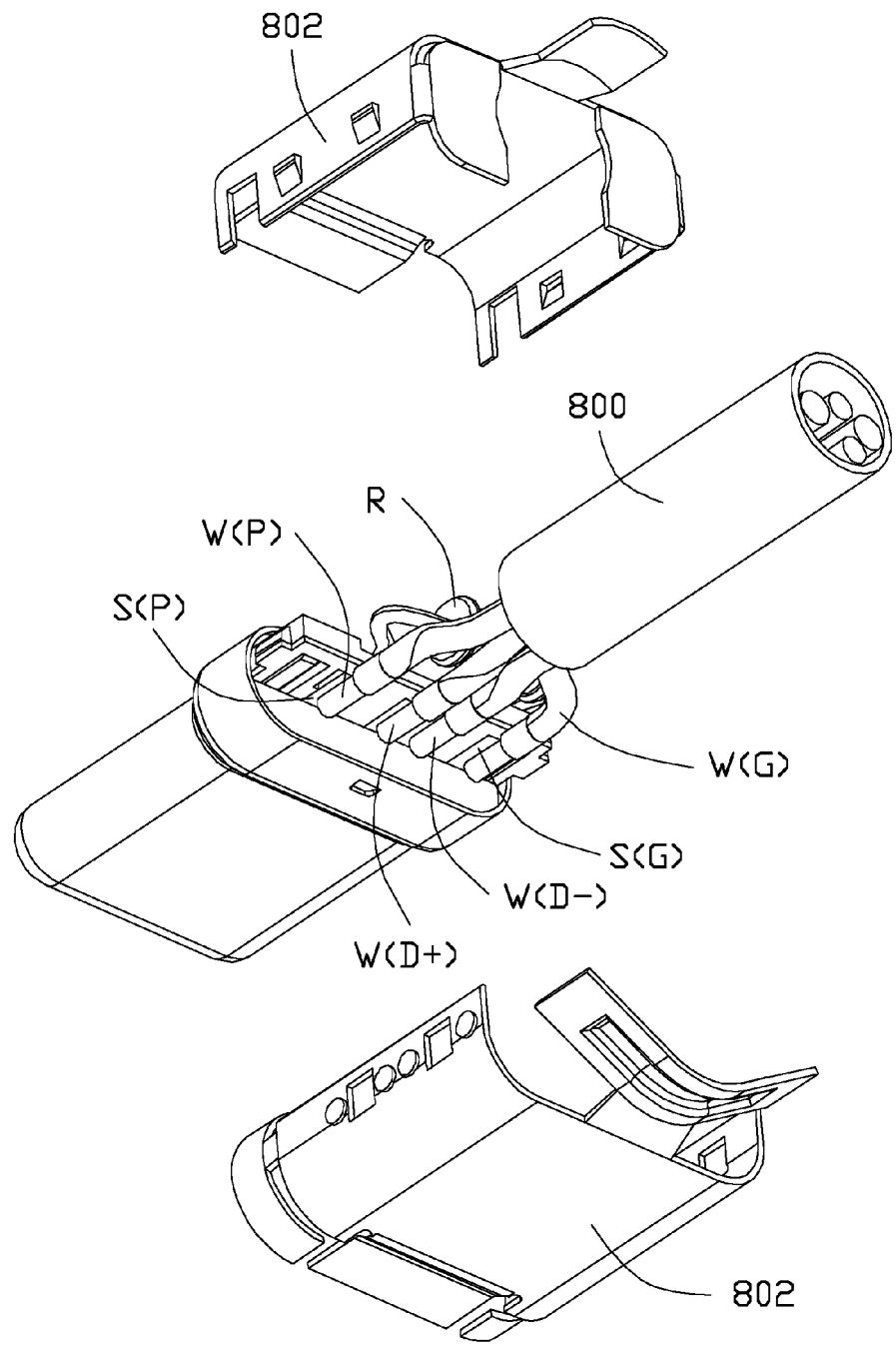
FIG. 32(A) is a further upward exploded perspective view of the plug connector of FIG. 31.
Figure 32B:
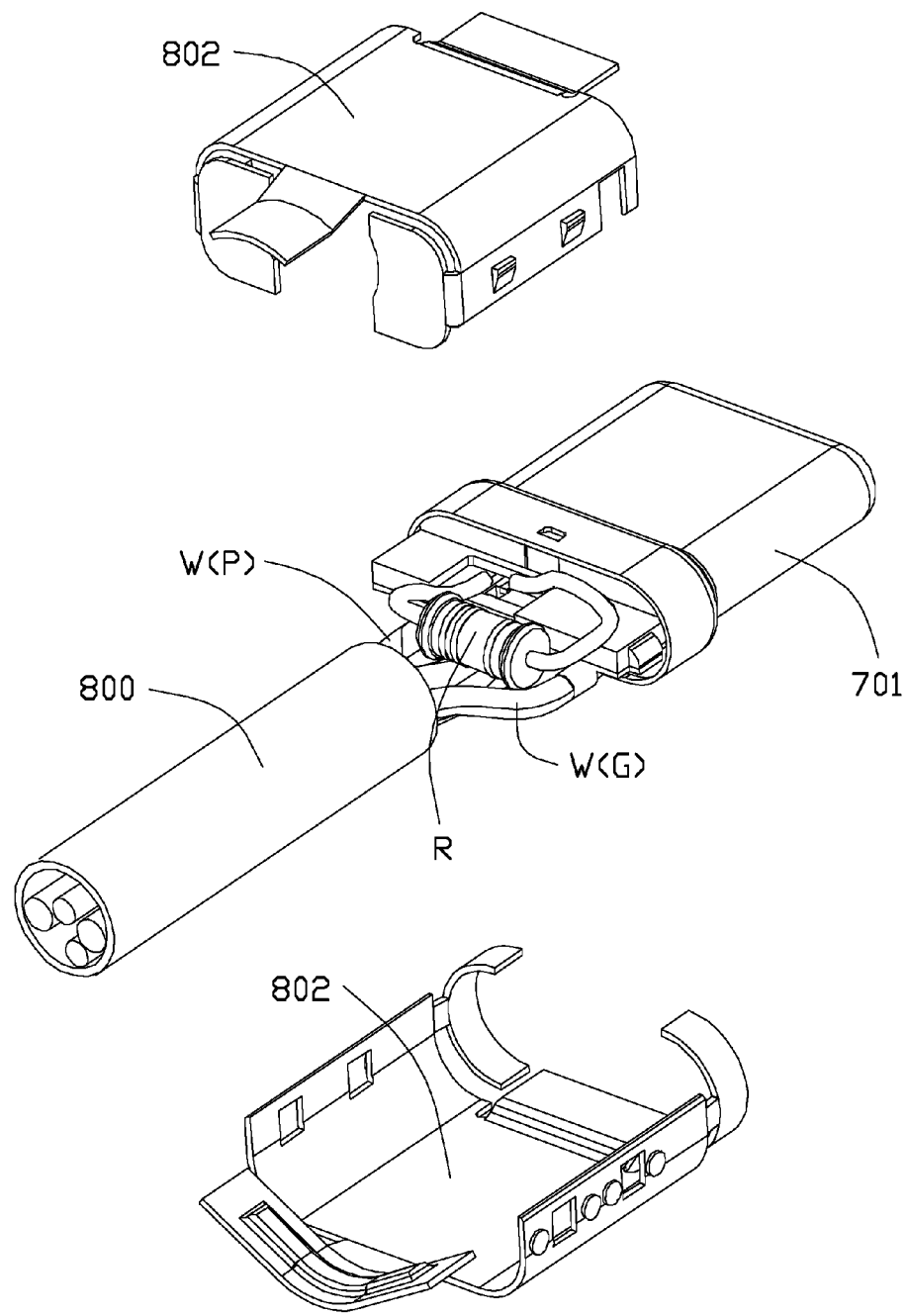
FIG. 32(B) is a further downward exploded perspective view of the plug connector of FIG. 31.
Figure 33A:
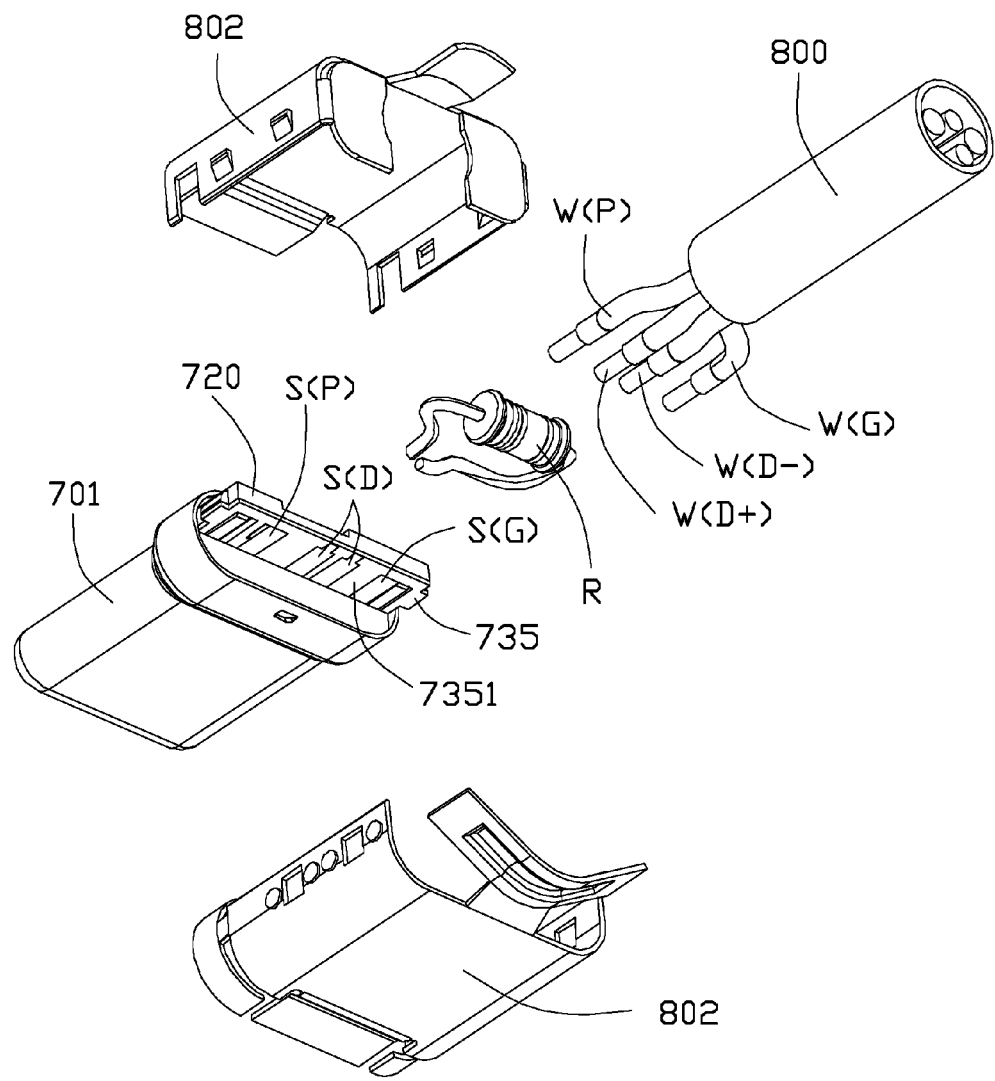
FIG. 33(A) is a further upward exploded perspective view of the plug connector of FIG. 32(A).
Figure 33B:
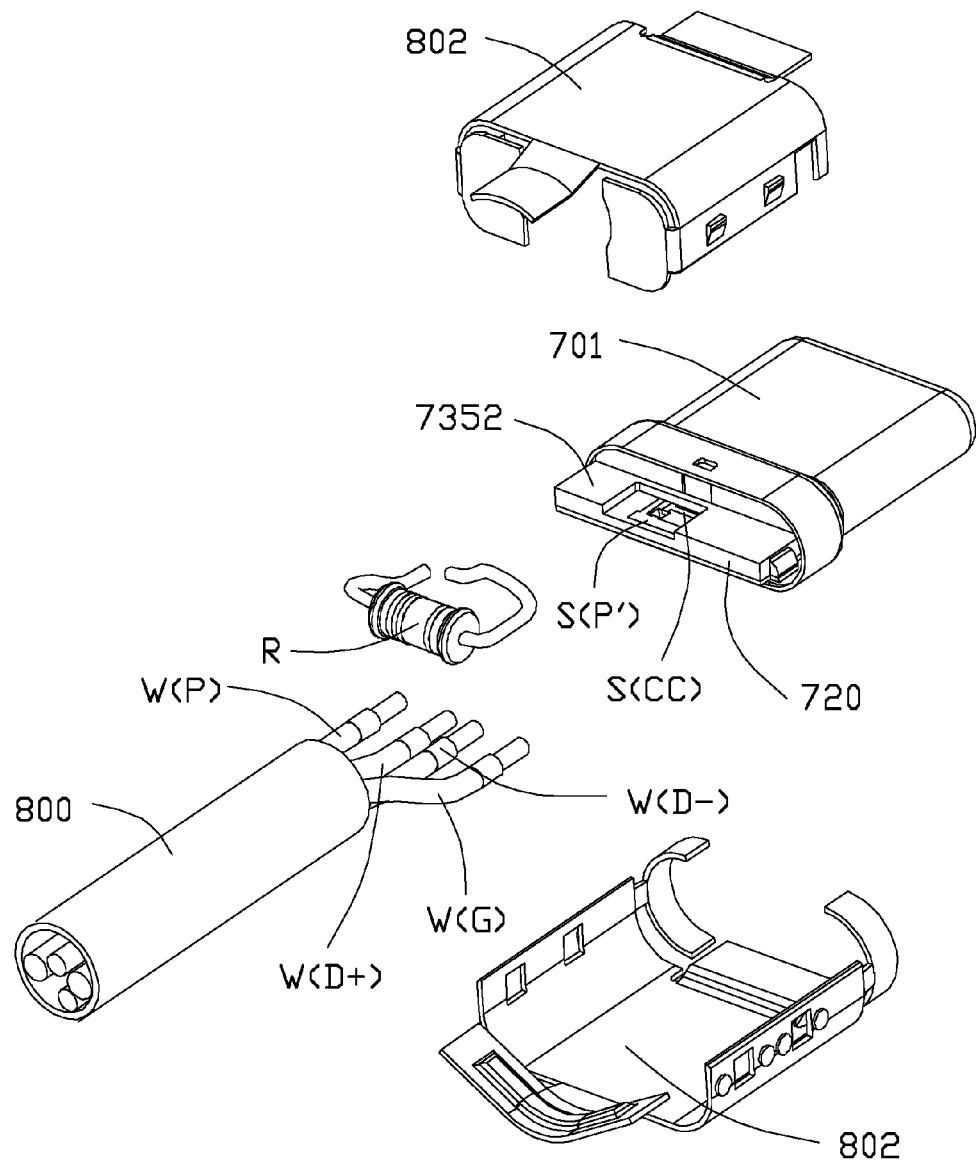
FIG. 33(B) is a further downward exploded perspective view of the plug connector of FIG. 32(B).

FIG. 29 shows another embodiment of the flippable plug connector 10' which is adapted to mate with the receptacle connector disclosed in the second embodiment which the metallic shield forms a plurality of spring tangs thereon. The recesses 101 are adapted to receive the apexes of the spring tangs during mating. Understandably, on the other hand, the spring tangs may be formed upon the exterior surface of the plug connector, and the metallic shield of the receptacle connector may form the corresponding openings therein to receive the apexes of the corresponding spring tangs. Under such a situation, the outer metallic bracket, which is soldered upon the metallic shield, may cover the openings for EMI shielding.

FIGS. 30-38(D) shows another embodiment of the plug/cable connector with the corresponding terminals arranged in a diagonally symmetrical manner so as to be used with a flippable way, wherein the plug/cable connector 700 includes an insulative housing 702 enclosed within a metallic shell 701 and defining a mating cavity 704 to receive a mating tongue of the complementary receptacle connector, and a plurality of passageways 706 located beside the mating cavity 704 in a vertical direction. A pair of spring plates 710 are attached to the housing 702 with spring tangs 712 extending into the mating cavity 704. An insulative tape 714 is attached upon the housing 702 to isolate the corresponding terminals from the metallic shell 701 (illustrated later). A terminal module assembly 720 with terminals and metallic latch are inserted into the housing and defines a cable supporting platform 735 with opposite first supporting surface 7351 and second supporting surface 7352. The first supporting surface 7351 is exposed with a pair of signal soldering legs S(D), one power soldering leg S(P) and one grounding soldering leg S(G) which are soldering connecting with corresponding wires W(D), W(P), W(G) of the cable 800. The second surface 7352 of the solder platform is located with an addendum power soldering leg S(P') and a detect soldering leg S(CC), which two are soldering connected with each other via a resister R. It is understandingly, all the soldering legs of the terminals are disposed on a same surface and the detect construct constructed by the addendum power soldering leg S(P') and a detect soldering leg S(CC) of the terminals are on another same surface, so as to facility the soldering process of the soldering legs and the wires of the cable 800.

Figure 34A:
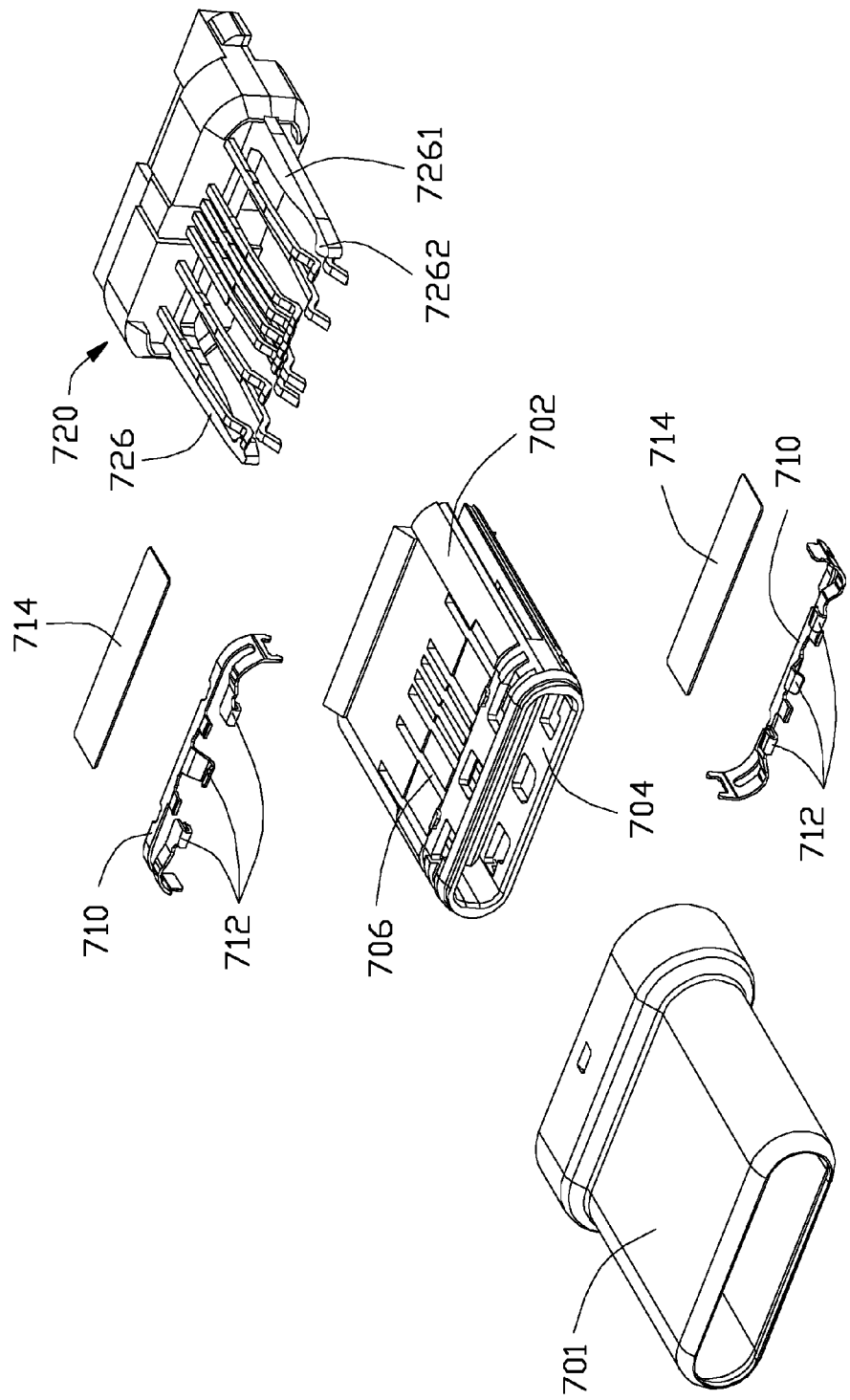
FIG. 34(A) is a further front downward exploded perspective view of the plug connector without the cable and the shielding covers thereof.
Figure 34B:
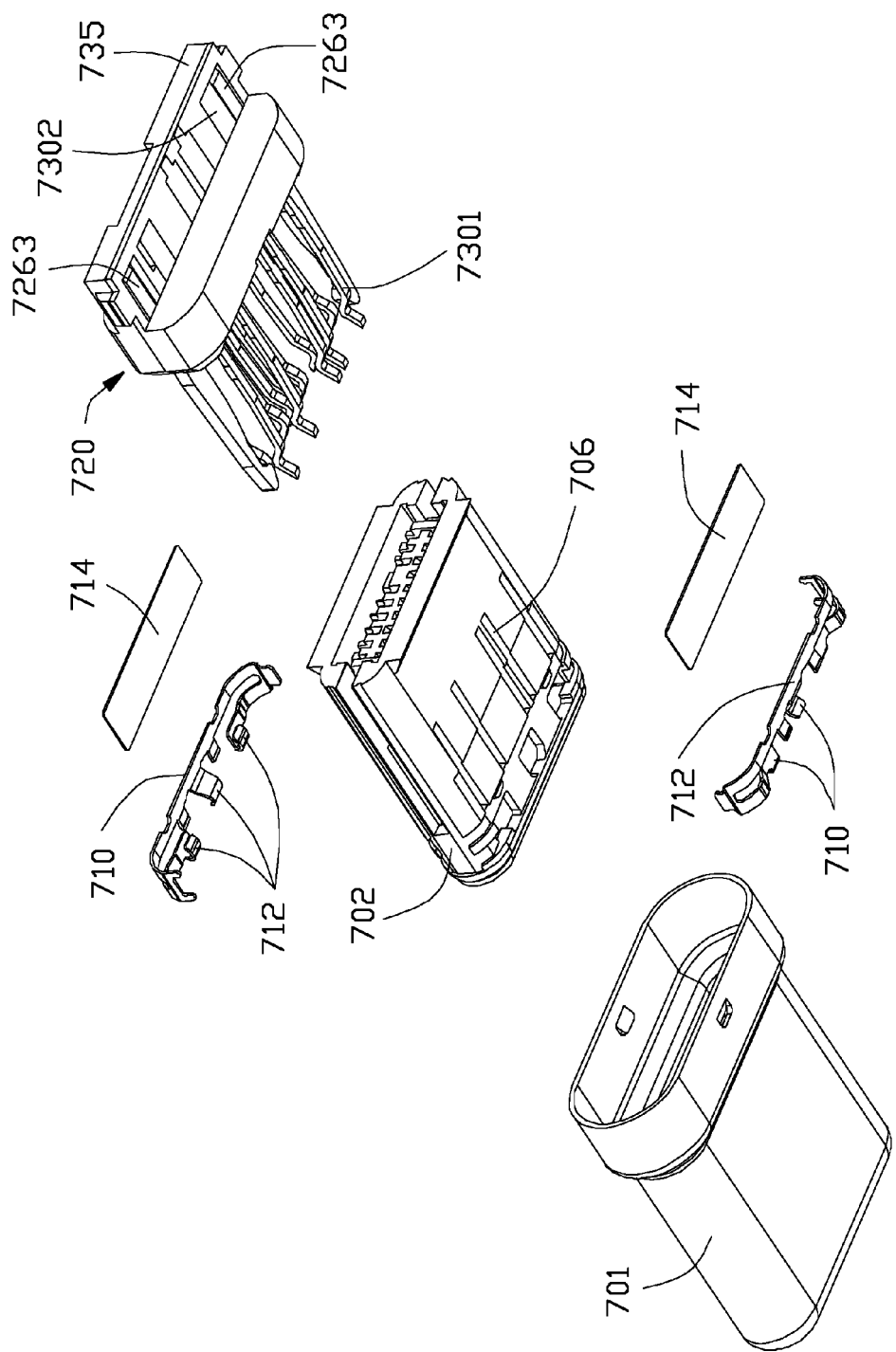
FIG. 34(B) is a further rearward upward exploded perspective view of the plug connector without the cable and the shielding covers thereof.
Figure 36A:
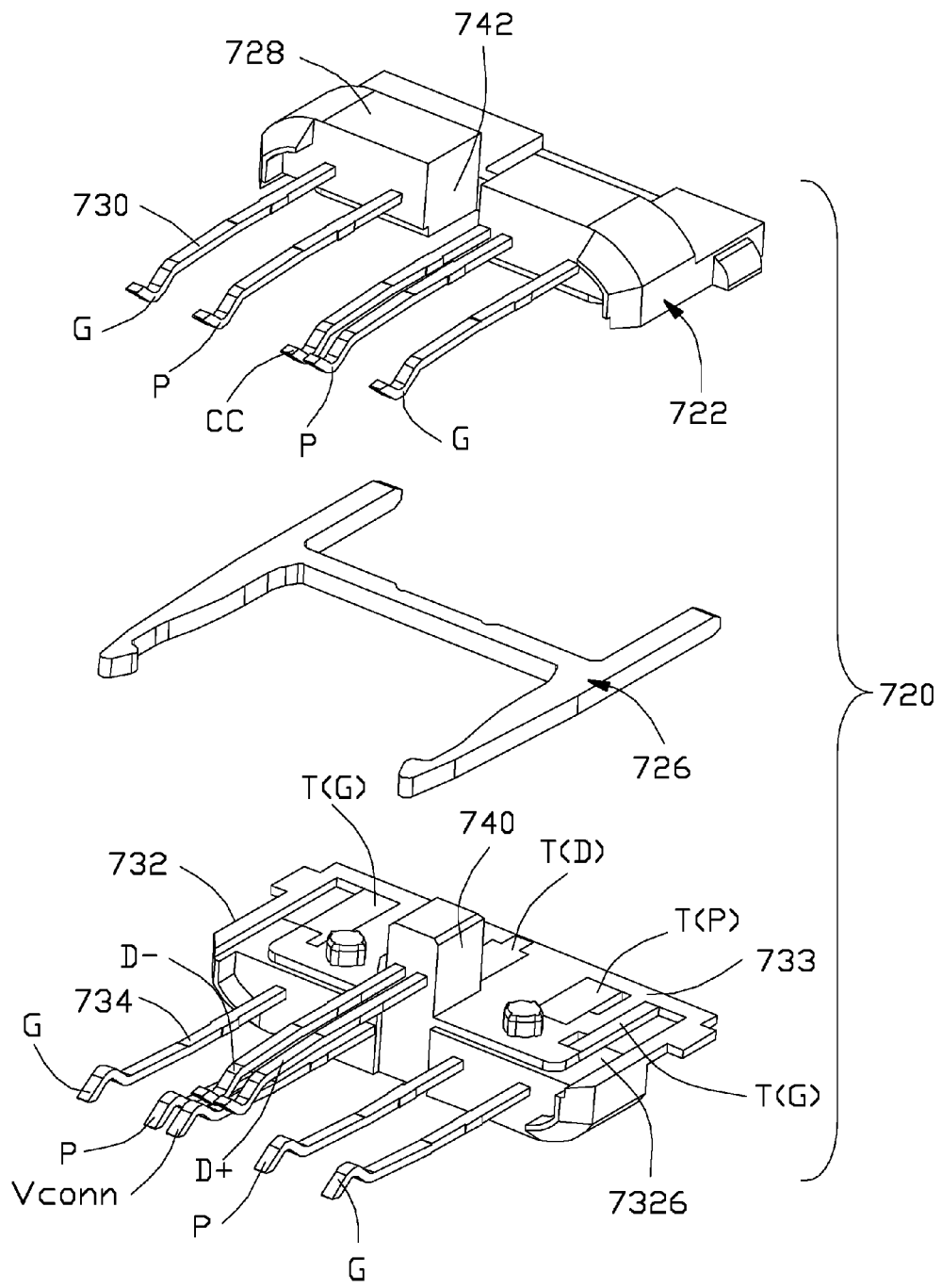
FIG. 36(A) is a further front downward exploded perspective view of the terminal module assembly of FIG. 35(A).
Figure 36B:
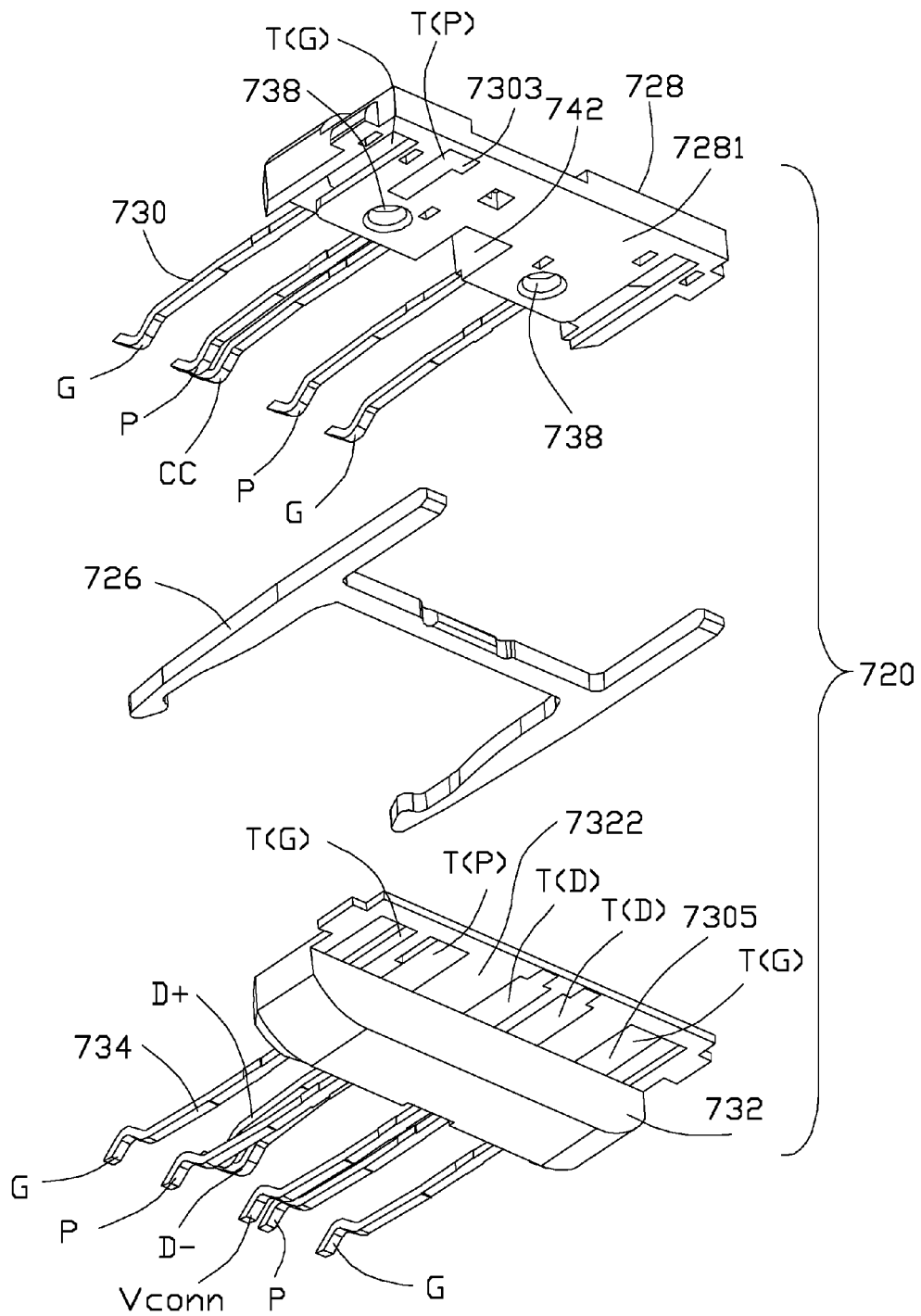
FIG. 36(B) is a further rear upward exploded perspective view of the terminal module assembly of FIG. 35(A).
Figure 36C:
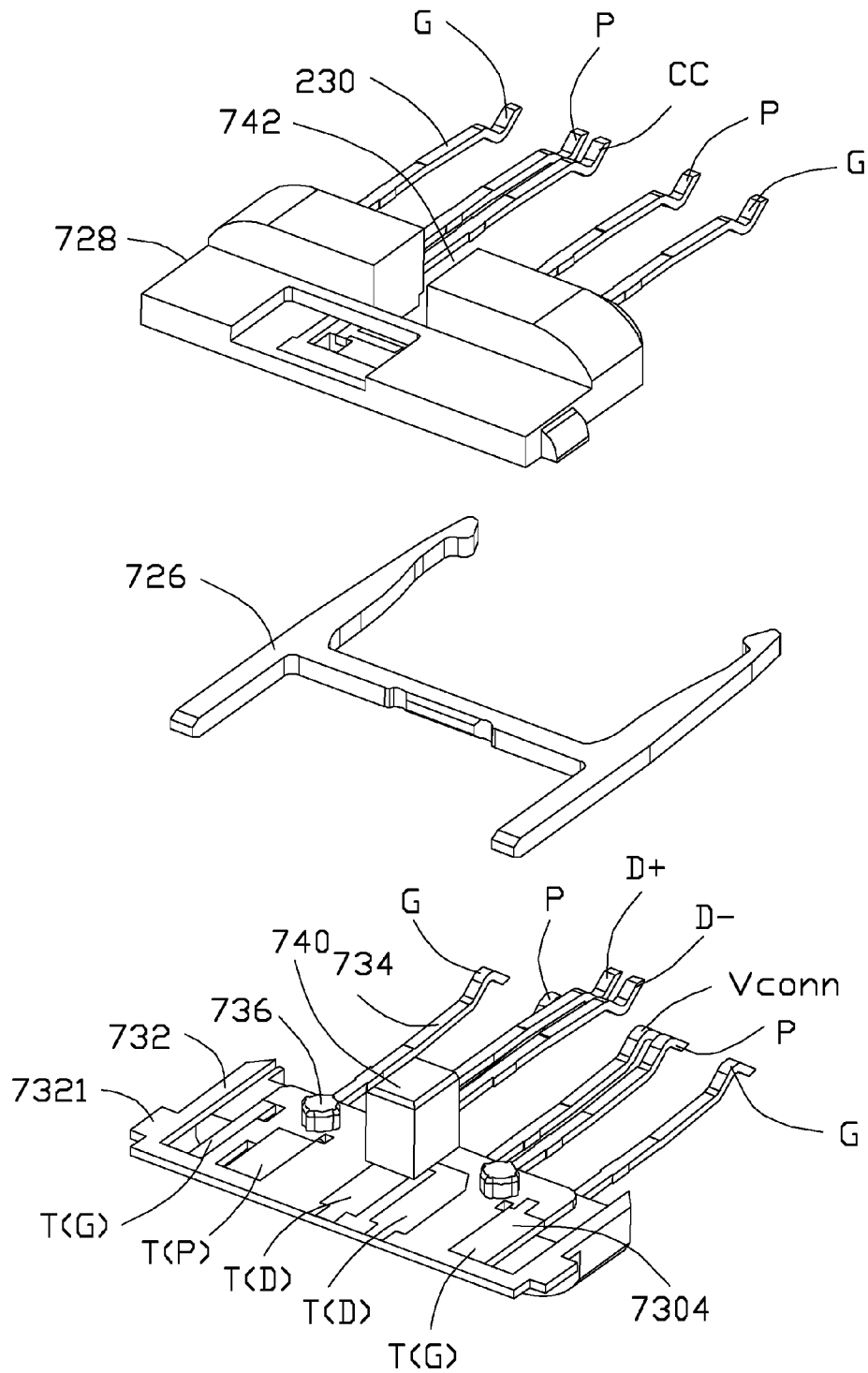
FIG. 36(C) is a further rear downward exploded perspective view of the terminal module assembly of FIG. 35(B).
Figure 37A:
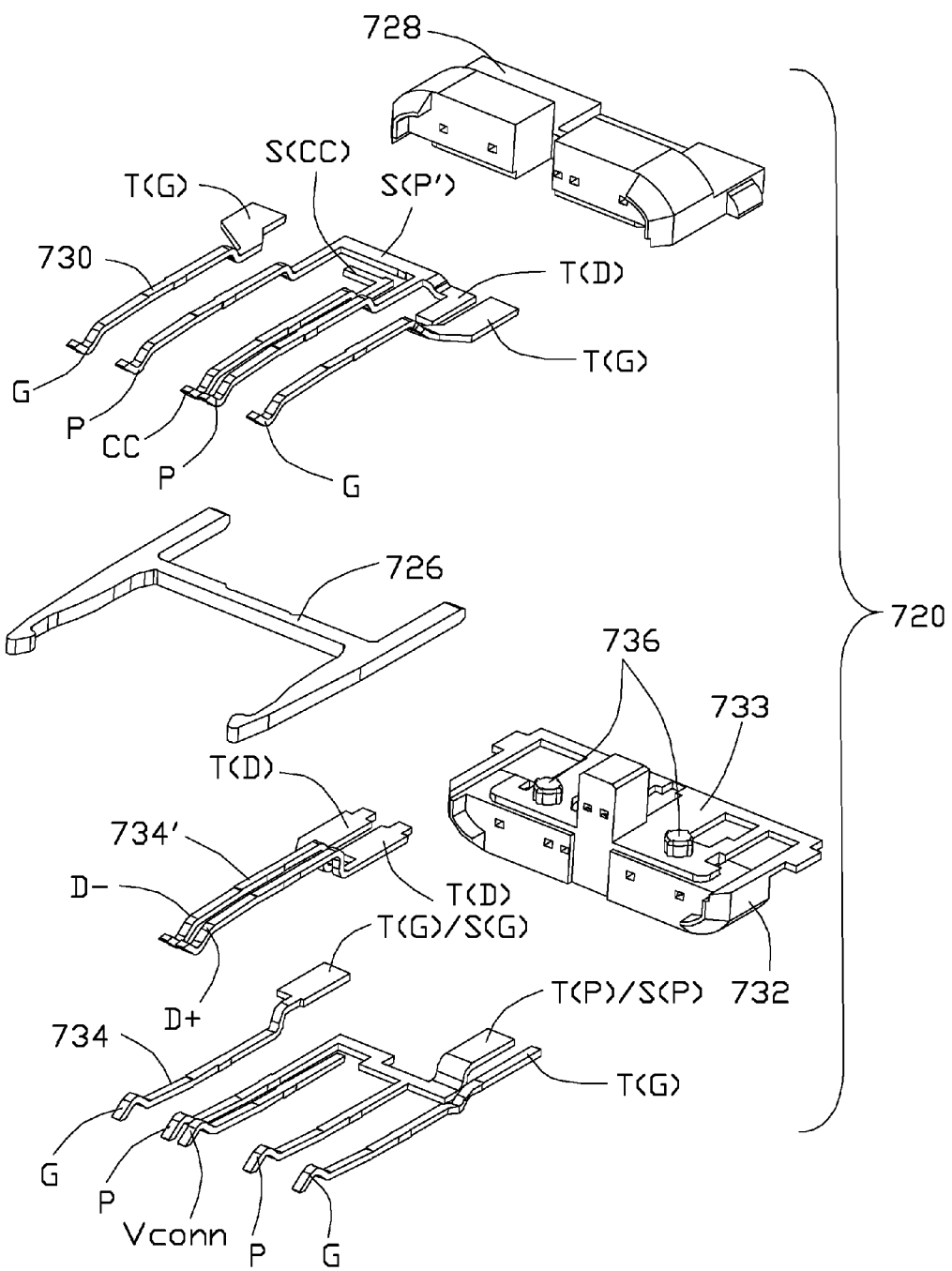
FIG. 37(A) is a further front downward exploded perspective view of the terminal module assembly of FIG. 36(A) wherein the terminals are fully exposed to an exterior.
Figure 37B:
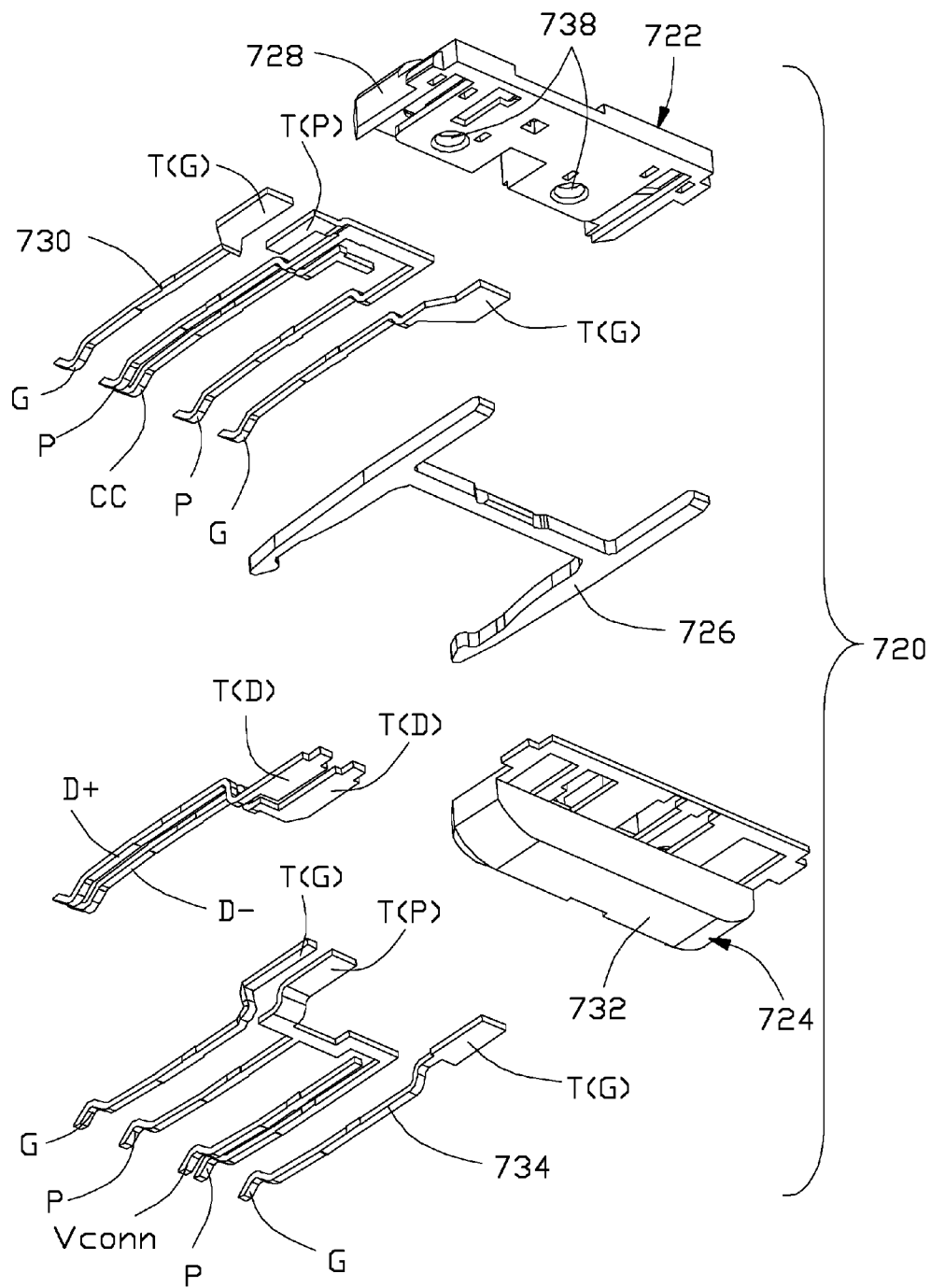
FIG. 37(B) is a further rear upward exploded perspective view of the terminal module assembly of FIG. 36(B) wherein the terminals are fully exposed to an exterior.

A terminal module assembly 720 includes opposite upper and lower terminal modules 722 and 724 commonly sandwiching an H-shaped metallic latch 726 therebetween in a vertical direction. The metallic latch includes a pair of side arms 7261 with locking headers 7262 and a pair of tail sections 7263. The upper terminal module 722 includes an upper insulator 728 integrally formed with a plurality of upper terminals 730 via the insert-molding process, and the lower terminal module 724 includes a lower insulator 732 integrally formed with a plurality of lower terminals 734 via the insert-molding process. The upper and the lower terminals 730, 734 includes front contacting sections 7301 arranged on opposite sides of the receiving cavity 704 and tail sections 7301 embedded in the corresponding insulators. A pair of posts 736 of the lower insulator 732 are received within the corresponding holes 738 in the upper insulator 728. The lower insulator 732 further includes a raised block 740 received within the corresponding notch 742 of the upper insulator 728 wherein contacting sections (labeled as D+, D-) of a specific pair of lower terminals 734 extend upward and join, at a same level, the contacting section of the upper terminals 730 via supporting of the block 740. In a detailed description, in the upper terminals 730 are categorized with a pair of grounding terminals G, a pair of power terminals P and a CC terminal while the lower terminal 734 are similarly categorized with a pair of grounding terminals G, a pair of power terminals P, a Vconn terminal and a pair of signal terminals D+/D-. Notably, the signal terminals D+/D- are the aforementioned specific pair of lower terminals 734 which are supported by the raised block 740. The tail sections 7302 of the corresponding power terminals P, the grounding terminals G and the signal terminals D+/D- are labeled as T(P), T (G) and T (D). Each of the tail sections 7302 is embedded in the insulator. As shown in FIG. 36(B), the tail sections T(P), T(G) of the upper power terminal P and the upper grounding contacts G expose to a lower surface 7281 of the upper insulator 728, i.e, the tail sections have opposite two faces and the lower face 7303 expose to the lower surface 7281 of the lower insulator 728. As best shown in FIG. 36(C), the tail portions T(P), T(G), T(D) of the lower power terminals P, the lower grounding terminals G and the signal terminals D expose to an upper surface 7321 of the lower insulator 732, i.e, the tail section has two opposite faces, the upper face 7304 expose to the upper surface 7321 of the lower insulator 732 and some lower faces 7305 expose to the lower surface 7322 of the lower insulator 732 to provide said soldering legs S(P), S(G), S(D) connecting with the wires of the cable. The lower surface of the upper terminal module and the upper surface of the lower terminal module defines recesses 7326 to receive the pair of tail sections of the metallic latch. The upper and lower terminal module 722, 724 are assembled together to be the terminal module assembly 720, wherein the upper and lower power terminals are mechanically connecting with each other via the tail sections thereof, i.e, the two faces 7303, 7304 of the tail section are abutted against each other in the vertical direction), the upper and lower grounding terminals are mechanically connecting with each other via the leg sections thereof and the metallic latch. The terminal module assembly 20 are then inserted in the insulative housing 702 so as to defines said supporting platform 735 behind the insulative housing as best shown in FIG. 34(B), the upper surface of the upper insulator is serviced as the first supporting surface 7351 and the lower surface 7322 of the lower insulator 732 is serviced as the second supporting surface 7352.

Figure 35A:
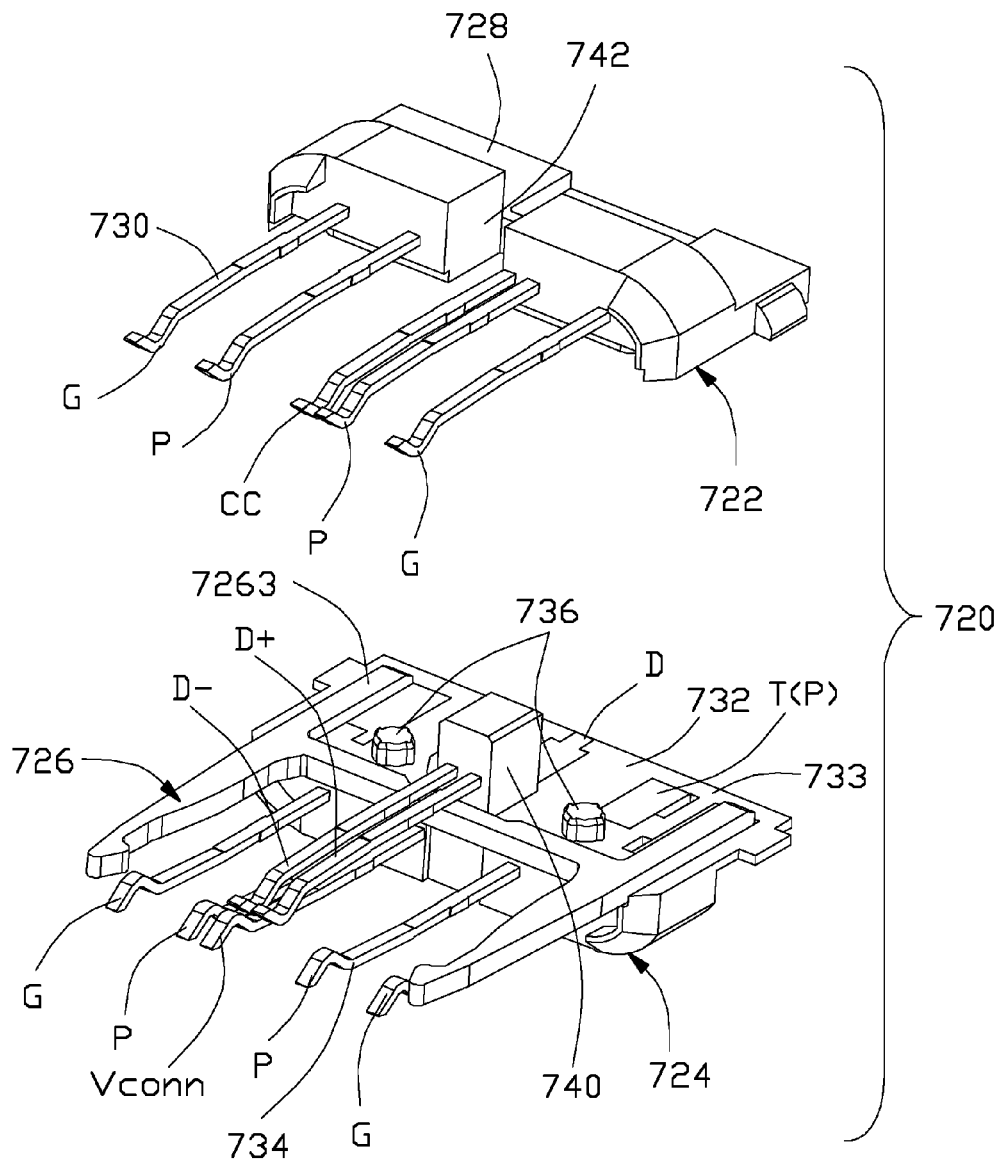
FIG. 35(A) is a front exploded perspective view of the terminal module assembly of the plug connector of FIG. 34(A).
Figure 35B:
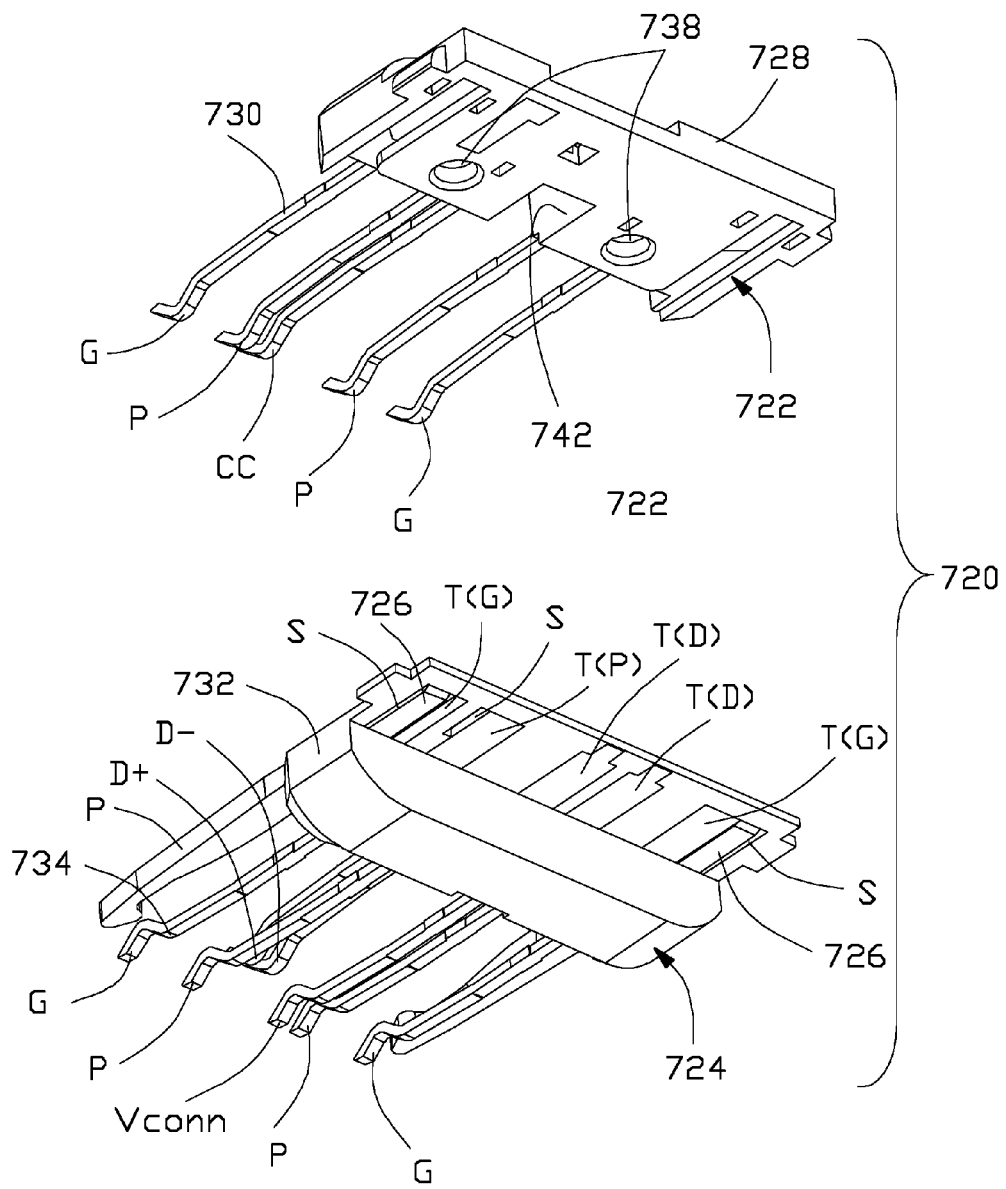
FIG. 35(B) is a rear exploded perspective view of the terminal module assembly of the plug connector of FIG. 34(A).
Figure 38A:
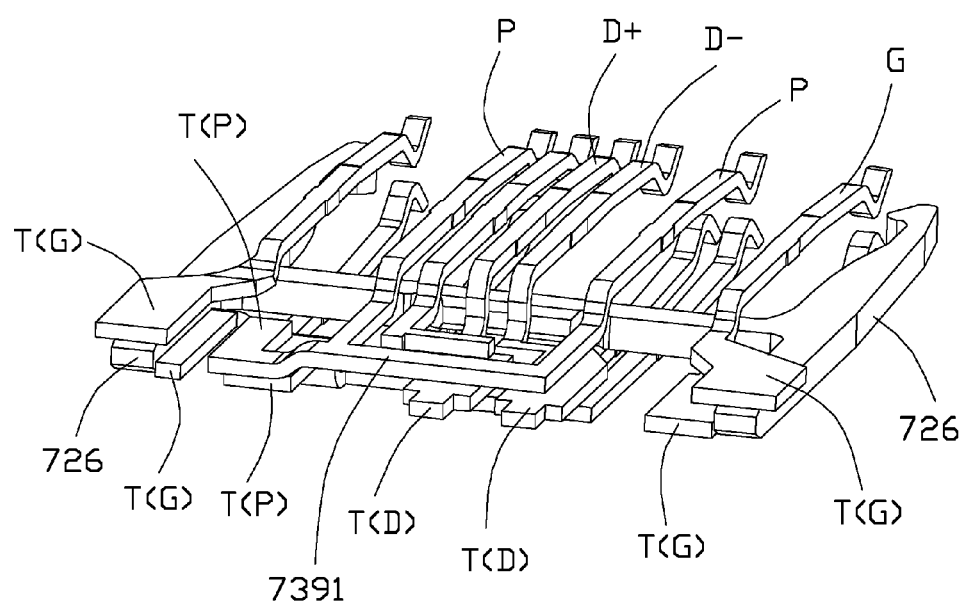
FIG. 38(A) is a front downward exploded perspective view of a combination of only the terminal and the latch.
Figure 38B:
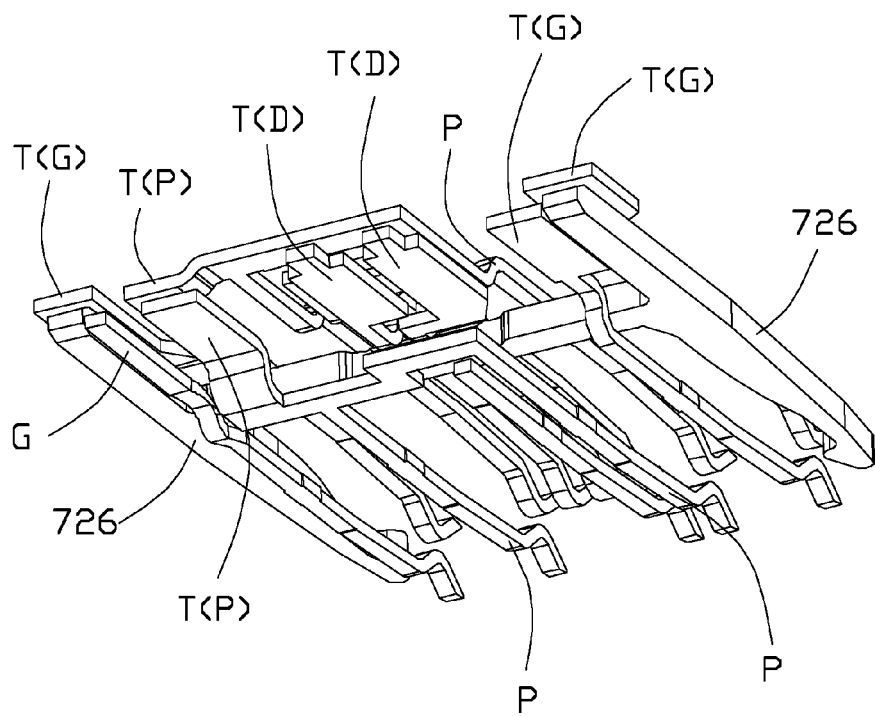
FIG. 38(B) is an upward exploded perspective view of the combination of FIG. 38(A).
Figure 38C:
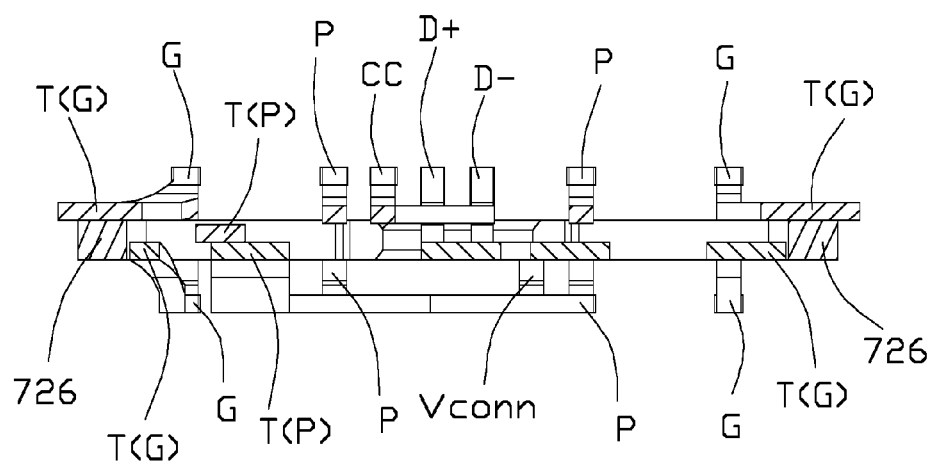
FIG. 38(C) is a cross-sectional view of the combination of FIG. 38(A)
Figure 38D:
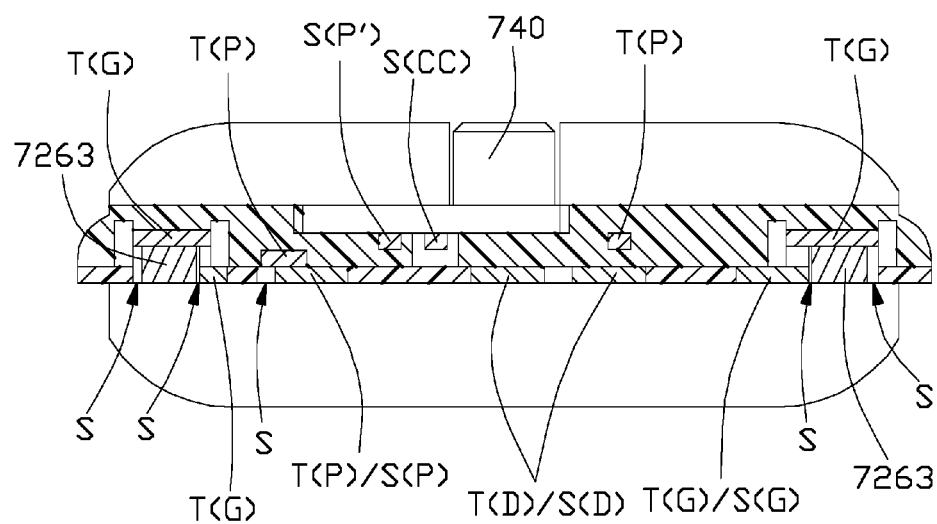
FIG. 38(D) is a cross-sectional view of the combination with the associated insulator of the terminal module assembly.

This embodiment is to have the corresponding grounding terminals G integrated with one another, and have the corresponding power terminals P integrated with one another. It is noted that to ease the soldering between the solderable tail section T(P), T(G) and T(D) of the corresponding lower terminal 734 and the latch 726 or the tail section of the corresponding upper terminal 730, the lower insulator 732 forms a soldering platform 733 to retain the tail sections T(P), T(G) and T(D) of the corresponding lower terminals 734 in a coplanar manner, i.e., having the similar thickness thereof. Notably, as shown in FIGS. 38(A)-38(D), the two power upper terminals 730/P are joined together by sharing the same tail section T(P) via a first bridge 7391, and the two power lower terminals 734/P are also joined together by sharing the same tail section T(P) abutting against the aforementioned tail section T(P) of the upper power terminal 730p so as to have those four power terminals electrically joined as one piece and one tail section exposed to the first supporting surface as the one power soldering leg S(P). On the other hand, the grounding upper terminals 730/G downwardly abut respectively against the two corresponding tail sections 7262 of the latch 726, and the grounding lower terminals 734/G sidewardly abut respectively against the two corresponding tail sections 7262 of the latch 726 so as to have those four grounding terminals electrically joined together and one tail section exposed to the first supporting surface as the one grounding soldering leg S(G). As shown in FIGS. 35(B) and 38(D), some tiny slits S are intentionally formed between the tail sections T(G), T(P) and the soldering platform 733 so as to allow the solder material to be filled therein to join the corresponding tail sections T(P) of the upper terminal 730 and the lower terminal 734, and to join the corresponding tail sections T(G) of the lower terminal 734 and the latch 726, and the tail section T(G) of the upper terminal 730 and the latch 726 when a soldering process is applied through a hot bar.

One feature of the invention is to have the wire W(P) for power, the wire W(G) for grounding, and the wires W(D+)/W(D−) for signal are soldered upon the tail sections T(P), T(G) and T(D)s on the same bottom side for simplifying the manufacturing process compared with the previous embodiment shown in FIGS. 7(A)-12(B) in which the corresponding four wires are soldered upon two opposite sides of the terminal module. Anyhow, two pairs of the grounding terminals are unified together and two pairs of the power contacts are unified together are required according to the standard specification. The instant embodiment and the previous embodiment are used to implement such a request. Optionally, the resistor R is adapted to be soldered between the upper terminal CC and the power upper terminal 730/P on the other side. The four wires are joined within a cable 800. A pair of metallic covers 802 are assembled upon the rear side of the shell 701 to shield the exposed wires and protect the soldering thereabouts. An insulative cover 804 are overmolded upon the metallic covers 802 and integrally joined with the cable 800 to finalize the whole product.

However, the disclosure is illustrative only, changes may be made in detail, especially in matter of shape, size, and arrangement of parts within the principles of the invention.

What is claimed is:

1. A plug connector for connecting with a cable, comprising:
   an insulative housing forming a receiving cavity;
   an upper terminal module including an upper insulator insert molded with a plurality of upper terminals, the upper terminal comprising a pair of upper power terminals and a pair of upper grounding terminals;
   a lower terminal module including a lower insulator insert molded with a plurality of lower terminals, the lower terminals comprises a pair of lower power terminals and a pair of lower grounding terminals;
   a metallic latch comprising a pair of front side arms extending into the receiving cavity and a tail section;
   the upper and lower terminals comprising front contacting sections arranged on opposite sides of the receiving cavity and tail sections embedded in the corresponding insulators;
   wherein the tail sections of the upper power and grounding terminals expose to a lower surface of the upper insulator; the tail portions of the lower power and grounding terminals expose to an upper surface of the lower insulator;
   wherein the tail sections of upper and lower power terminals are confronted with each other one by one, the tail sections of the upper and lower grounding terminals are confronted with each other after the upper and lower terminal module are inserted in the insulative housing to define a supporting platform behind the insulative housing;
   wherein the supporting platform defines opposite first supporting surface and second supporting surface,
   wherein the second supporting surface of the solder platform is located with an addendum power soldering leg and a detect soldering leg, which two are connecting with each other via a resister, the upper terminal module is insert molded with a detect terminal, the detecting soldering leg extends from the detect terminal.

2. The plug connector as claimed in claim 1, wherein the supporting platform defines tine slits near to the tail sections of the power terminals and grounding terminals so as to allow solder material to be filled therein when a soldering process is applied through a hot bar to join the corresponding tail sections together.

3. The plug connector as claimed in claim 1, wherein the metallic latch is sandwiched between the upper terminal module and the lower terminal module, one tail section of the upper and lower power terminals exposing to the first supporting surface of supporting platform is provided as a power soldering leg for connecting with a power wire of a cable, one tail section of the upper and lower grounding terminals exposing to the first supporting surface of the supporting platform is provided as a grounding soldering leg for connecting with a grounding wire of the cable.

4. The plug connector as claimed in claim 1, wherein the lower surface of the upper terminal module and the upper surface of the lower terminal module defines recesses to receive the pair of tail sections of the metallic latch.

5. The plug connector as claimed in claim 1, wherein the pair of upper power terminals are unified by a first bridge portion, the pair of lower power terminals are unified by a second bridge portion.

6. The plug connector as claimed in claim 1, wherein the lower terminal module comprises a pair of adjacent signal contacts, the tail sections of the signal contacts expose to the first supporting surface of the supporting platform to be provided as signal soldering legs for connecting with a pair signal wires of the cable, the signal soldering legs are located between the grounding soldering leg and the power soldering leg.

7. A plug connector comprising:
   an insulative housing forming a receiving cavity;
   a terminal module assembly retained in the insulative housing and defining a cable-supporting platform behind the insulative housing, the terminal module assembly comprising an upper terminal module and a lower terminal module;
   the upper terminal module including an upper insulator with a plurality of upper terminals, the upper terminal comprising an upper power terminal and an upper grounding terminals;
   the lower terminal module including a lower insulator insert molded with a plurality of lower terminals, the lower terminals comprising a lower power terminal and a lower grounding terminal; wherein after the upper and lower insulator are assembled together, the upper and lower power terminals are integrated with one another and provided with only one power soldering leg on a first supporting surface of the cable-supporting platform, and the upper and lower grounding terminals are integrated with one another and provided with only one power grounding soldering leg on the first supporting surface;
   wherein the second supporting surface of the solder platform is located with an addendum power soldering leg and a detect soldering leg, which two are connecting with each other via a resister, the upper terminal module is insert molded with a detect terminal, the detecting soldering leg extends from the detect terminal;
   wherein tail sections of the lower terminals are exposed to an upper surface of the lower insulator and disposed a coplanar manner, tail sections of the upper power terminal and upper grounding terminals are directly or in directly connecting with corresponding lower power and grounding terminals.

8. The plug connector as claimed in claim 7, wherein the lower terminal module further comprises a pair of signal terminals, contacting sections of the signal terminals extend upwards and join contacting section of the upper terminals at a same level via supporting of an insulative block.

9. The plug connector as claimed in claim 7, wherein the upper terminal module further is insert molded with a detect terminal, the terminal module comprises a contacting section extending into the receiving cavity and a tail section exposed to a second supporting surface opposite the first supporting surface; a portion of the upper power terminal exposes to the second supporting surface and the portion of the upper power terminal and the tail section of the detect terminal are connected with each other by a resister.

10. A plug connector adapted for connecting with a cable;

- a housing defining a front receiving cavity and a rear supporting platform with opposite first and second supporting surfaces;
- a plurality of upper terminals and lower terminals, comprising contacting sections located at opposite sides of the receiving cavity and soldering legs exposed to the supporting platform;
- wherein the first supporting surface is at least located with a power soldering leg and a grounding soldering leg; the second supporting surface is at least located with a detect soldering leg;
- wherein the second supporting surface of the solder platform is located with an addendum power soldering leg and a detect soldering leg, which two are connecting with each other via a resister, the upper terminal module is insert molded with a detect terminal, the detecting soldering leg extends from the detect terminal;
- wherein the first supporting surface further is located with a pair of signal soldering leg, the second surface is further located with an addendum power soldering leg, the addendum power soldering leg and the detecting soldering leg is soldered with a resister;
- further including a metallic shell fitly enclosing the housing.

* * * * *